(12) United States Patent
Maekawa et al.

(10) Patent No.: US 7,732,818 B2
(45) Date of Patent: Jun. 8, 2010

(54) DISPLAY DEVICE, MANUFACTURING METHOD THEREOF, AND TELEVISION RECEIVER

(75) Inventors: Shinji Maekawa, Kanagawa (JP); Shunpei Yamazaki, Tokyo (JP); Hironobu Shoji, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/100,083

(22) Filed: Apr. 9, 2008

(65) Prior Publication Data

US 2008/0199992 A1      Aug. 21, 2008

Related U.S. Application Data

(63) Continuation of application No. 11/038,212, filed on Jan. 21, 2005, now Pat. No. 7,365,805.

(30) Foreign Application Priority Data

Jan. 26, 2004  (JP) .............................. 2004-017675
Jan. 26, 2004  (JP) .............................. 2004-017694

(51) Int. Cl.
    *H01L 27/12* (2006.01)
(52) U.S. Cl. .................. 257/72; 257/E27.111; 348/739
(58) Field of Classification Search .......... 257/E29.292, 257/E29.294, 72, E27.111; 438/158, 66; 348/739
    See application file for complete search history.

(56) References Cited

U.S. PATENT DOCUMENTS

| | | | |
|---|---|---|---|
| 4,570,410 A | 2/1986 | Tuneke et al. | |
| 5,304,407 A | 4/1994 | Hayashi et al. | |
| 5,438,241 A | 8/1995 | Zavracky et al. | |
| 5,739,890 A | 4/1998 | Uda et al. | |
| 5,827,775 A | 10/1998 | Miles et al. | |
| 6,013,542 A | 1/2000 | Yamazaki et al. | |
| 6,183,937 B1 | 2/2001 | Tsai et al. | |
| 6,225,750 B1 | 5/2001 | Kimura | |
| 6,523,941 B2 | 2/2003 | Asakawa et al. | |
| 6,580,212 B2 | 6/2003 | Friend | |
| 6,607,947 B1 * | 8/2003 | Zhang et al. | 438/151 |
| RE38,292 E * | 10/2003 | Satou | 438/158 |
| 6,734,029 B2 | 5/2004 | Furusawa | |

(Continued)

FOREIGN PATENT DOCUMENTS

EP      1 225 472      7/2002

(Continued)

*Primary Examiner*—W. David Coleman
*Assistant Examiner*—Daniel Shook
(74) *Attorney, Agent, or Firm*—Nixon Peabody LLP; Jeffrey L. Costellia

(57) ABSTRACT

The present invention discloses a method for manufacturing a display device comprising the steps of forming a first film pattern using a photosensitive material over a substrate, forming a second film pattern in such a way that the first film pattern is exposed by being irradiated with a laser beam, modifying a surface of the second film pattern into a droplet-shedding surface, forming a source electrode and a drain electrode by discharging a conductive material to an outer edge of the droplet-shedding surface by a droplet-discharging method, and forming a semiconductor region, a gate-insulating film, and a gate electrode over the source electrode and the drain electrode.

27 Claims, 63 Drawing Sheets

U.S. PATENT DOCUMENTS

| | | |
|---|---|---|
| 6,891,327 B2 | 5/2005 | Duineveld et al. |
| 6,989,333 B2 | 1/2006 | Watanabe et al. |
| 6,994,414 B2 | 2/2006 | Hashimoto et al. |
| 7,033,951 B2 | 4/2006 | Kido |
| 7,078,281 B2 | 7/2006 | Tanaka et al. |
| 7,101,729 B2 | 9/2006 | Kimura et al. |
| 7,105,854 B2 | 9/2006 | Sirringhaus et al. |
| 7,135,272 B2 | 11/2006 | Baik |
| 7,226,819 B2 | 6/2007 | Maekawa et al. |
| 7,273,773 B2 | 9/2007 | Yamazaki et al. |
| 2001/0039116 A1* | 11/2001 | Takeshima et al. .......... 438/689 |
| 2002/0105688 A1 | 8/2002 | Katagami et al. |
| 2002/0128515 A1 | 9/2002 | Ishida et al. |
| 2003/0030689 A1 | 2/2003 | Hashimoto et al. |
| 2003/0080436 A1 | 5/2003 | Ishikawa |
| 2003/0083203 A1 | 5/2003 | Hashimoto et al. |
| 2003/0129321 A1 | 7/2003 | Aoki |
| 2004/0005739 A1 | 1/2004 | Furusawa |
| 2004/0141023 A1 | 7/2004 | Nakamura |
| 2005/0043186 A1 | 2/2005 | Maekawa et al. |
| 2005/0095356 A1 | 5/2005 | Nakamura et al. |
| 2005/0112906 A1 | 5/2005 | Maekawa et al. |
| 2005/0158665 A1 | 7/2005 | Maekawa et al. |
| 2005/0163938 A1 | 7/2005 | Yamazaki et al. |
| 2005/0164423 A1 | 7/2005 | Maekawa et al. |
| 2005/0164434 A1 | 7/2005 | Arakawa et al. |
| 2005/0179036 A1 | 8/2005 | Yamazaki et al. |
| 2005/0191781 A1 | 9/2005 | Hirai |

FOREIGN PATENT DOCUMENTS

| | | |
|---|---|---|
| JP | 08-330595 | 12/1996 |
| JP | 9-260808 | 10/1997 |
| JP | 11-029873 | 2/1999 |
| JP | 11-251259 | 9/1999 |
| JP | 11-321073 | 11/1999 |
| JP | 11-326951 | 11/1999 |
| JP | 11-340129 | 12/1999 |
| JP | 2000-089213 | 3/2000 |
| JP | 2000-188251 | 7/2000 |
| JP | 2000-275678 | 10/2000 |
| JP | 2002-215065 | 7/2002 |
| JP | 2002-273869 | 9/2002 |
| JP | 2003-109794 | 4/2003 |
| JP | 2003-133691 | 5/2003 |
| JP | 2003-178872 | 6/2003 |
| JP | 2003-209339 | 7/2003 |
| JP | 2003-209340 | 7/2003 |
| JP | 2003-318133 | 11/2003 |
| JP | 2004-167488 | 6/2004 |
| JP | 2004-188410 | 7/2004 |
| WO | WO 2005/047967 A1 | 5/2005 |

* cited by examiner

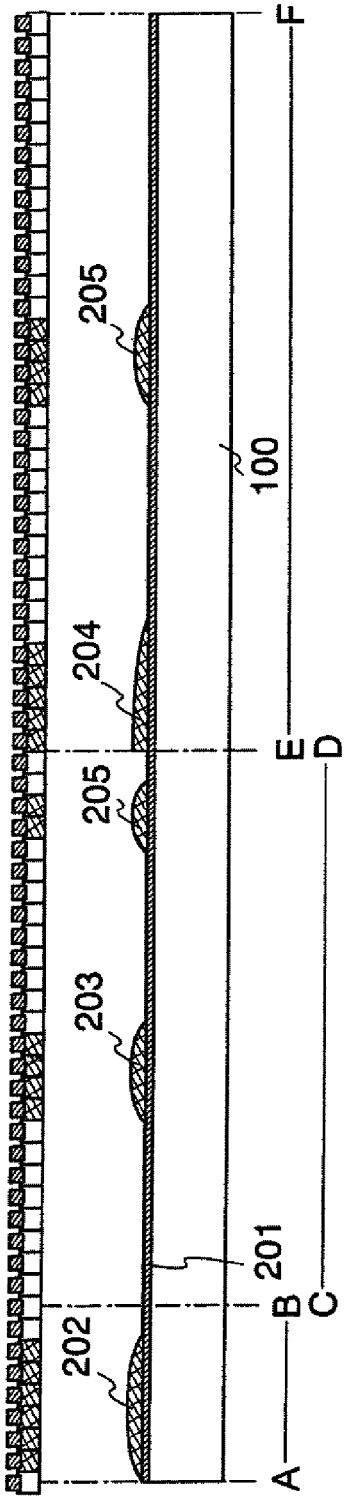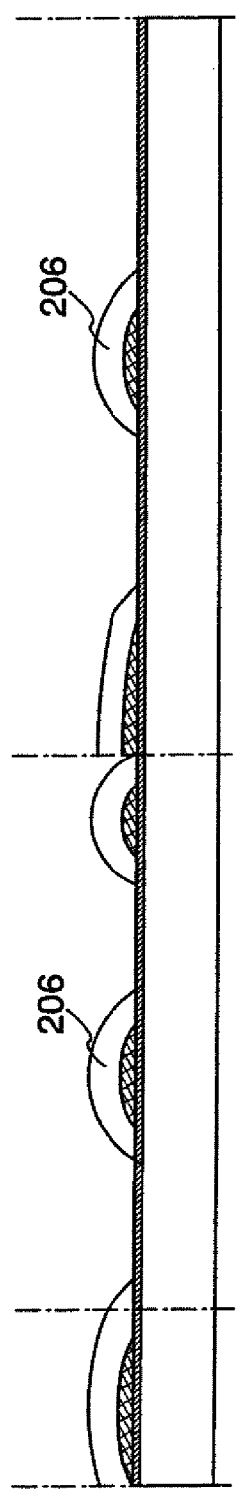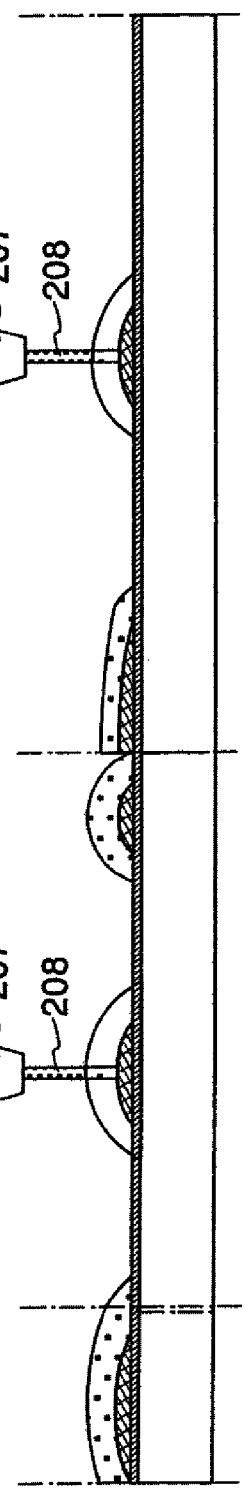

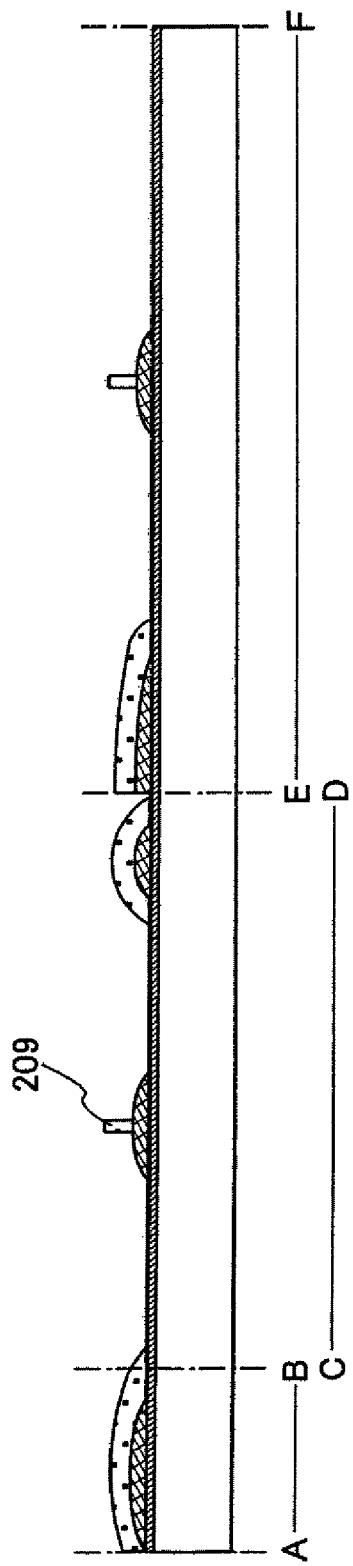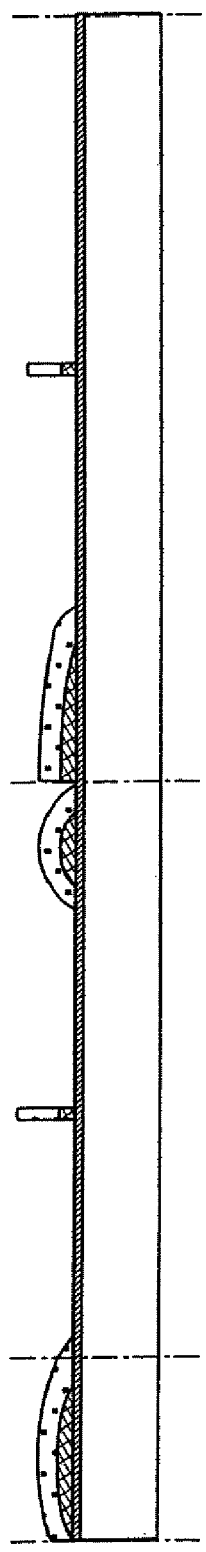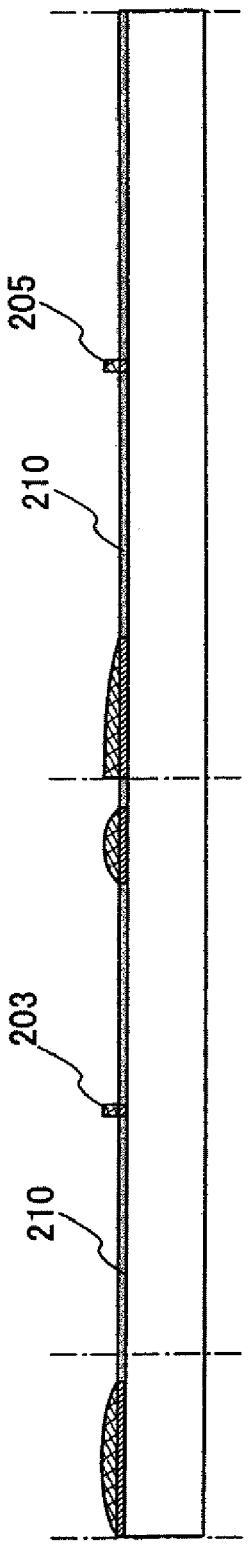

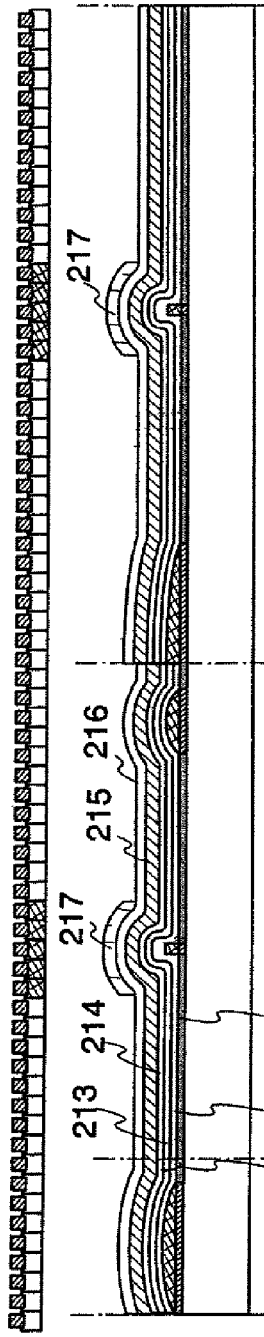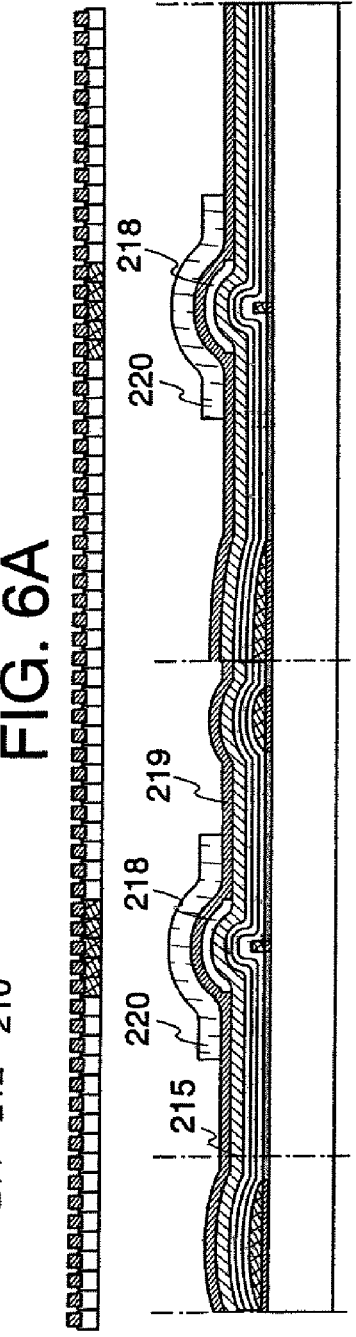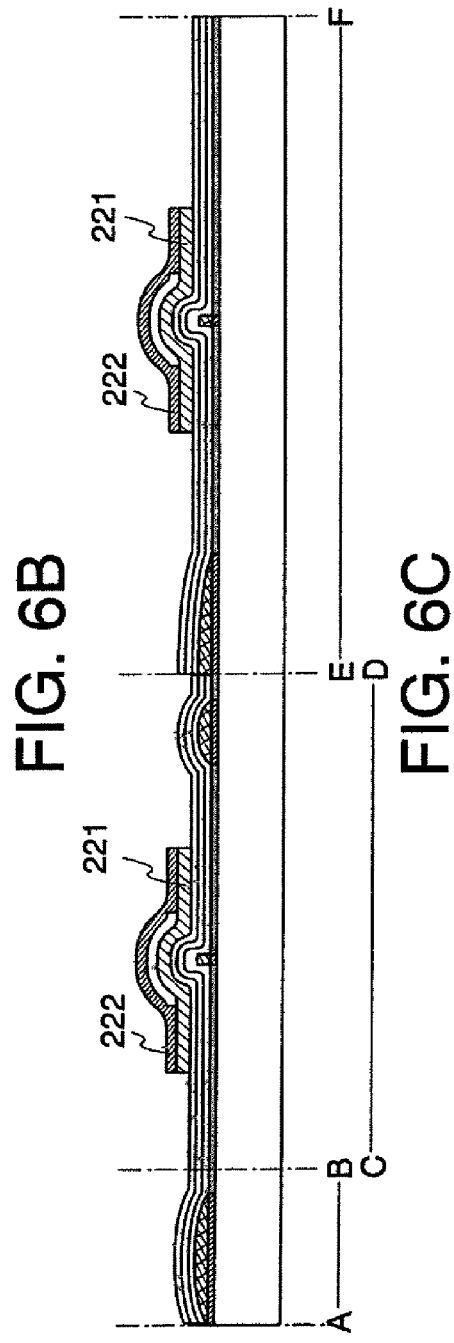

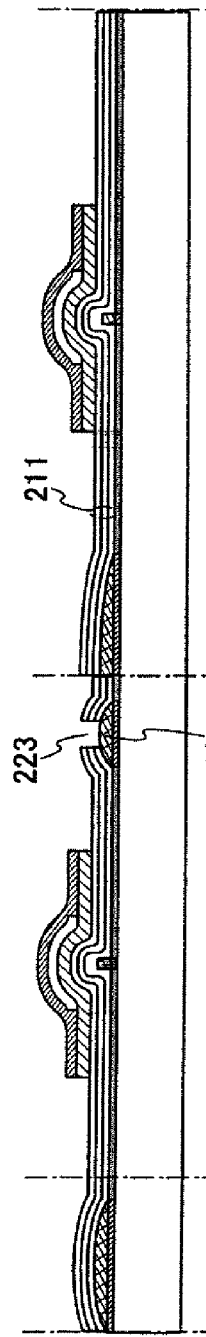
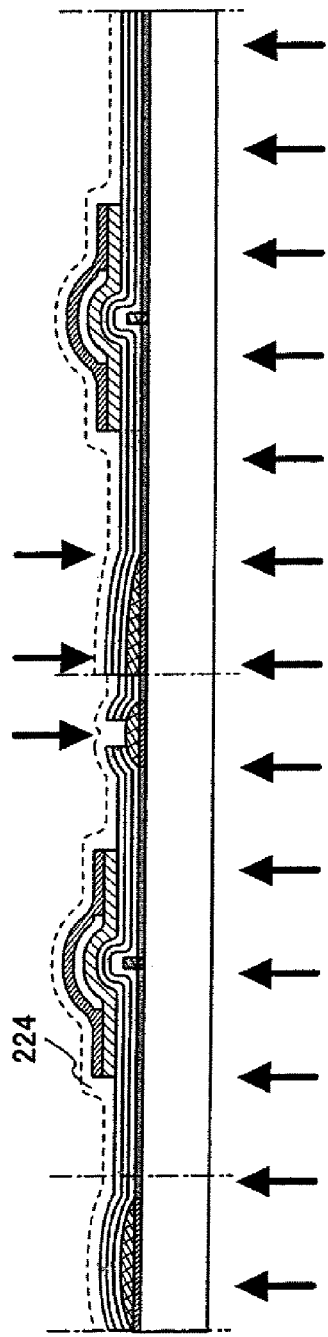
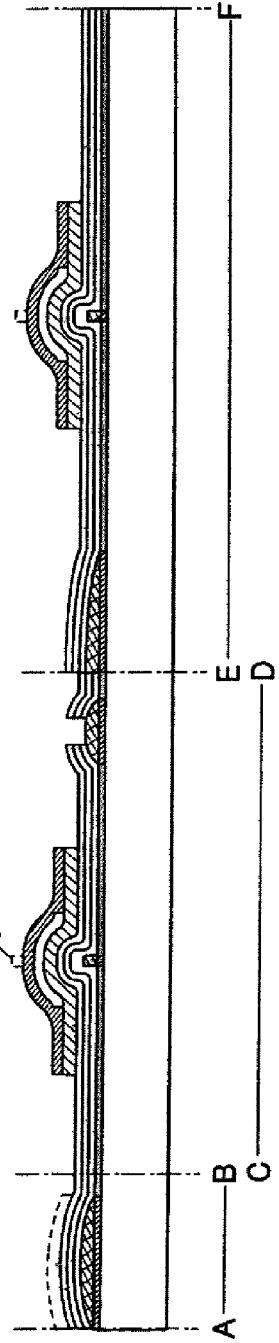
FIG. 7A
FIG. 7B
FIG. 7C

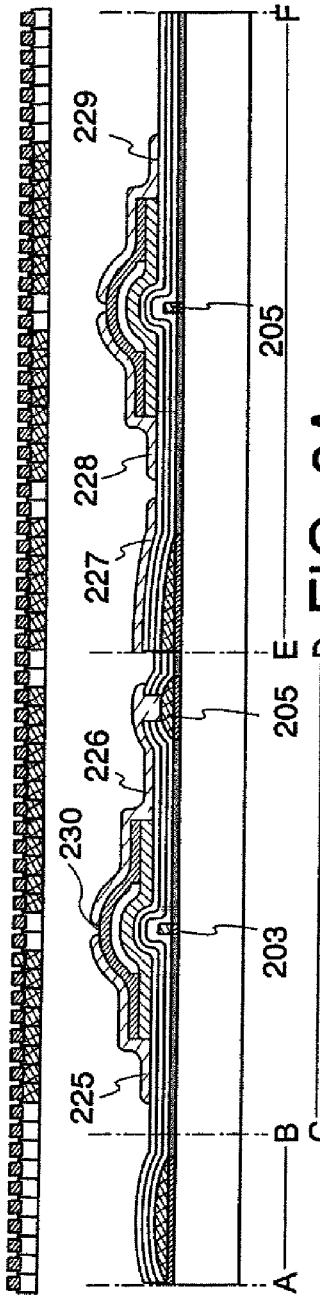
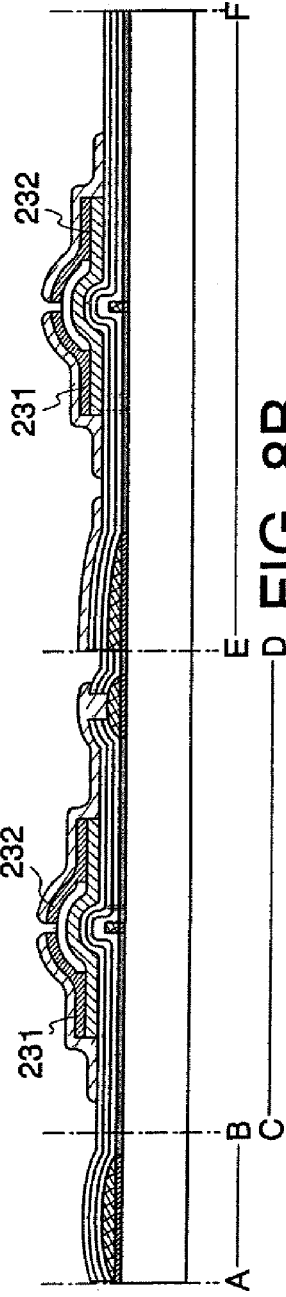
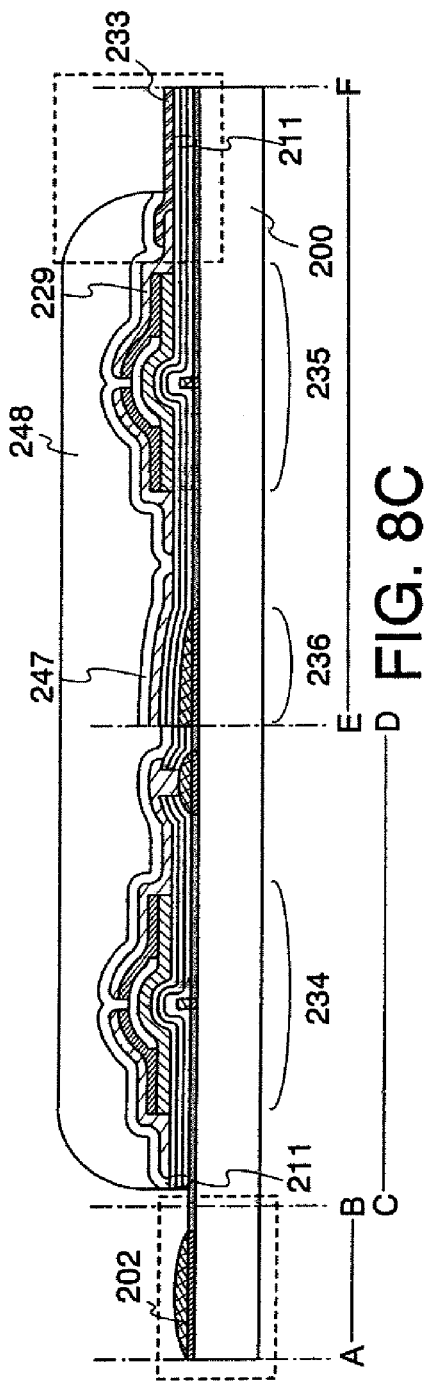
FIG. 8A
FIG. 8B
FIG. 8C

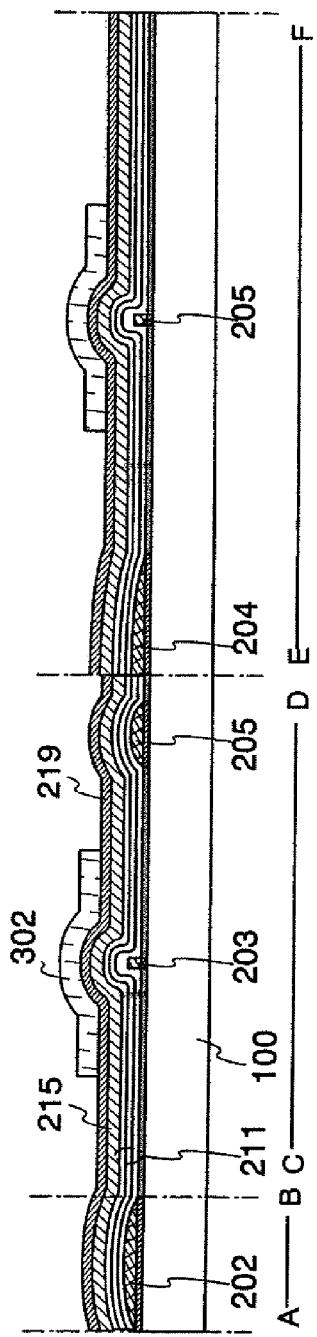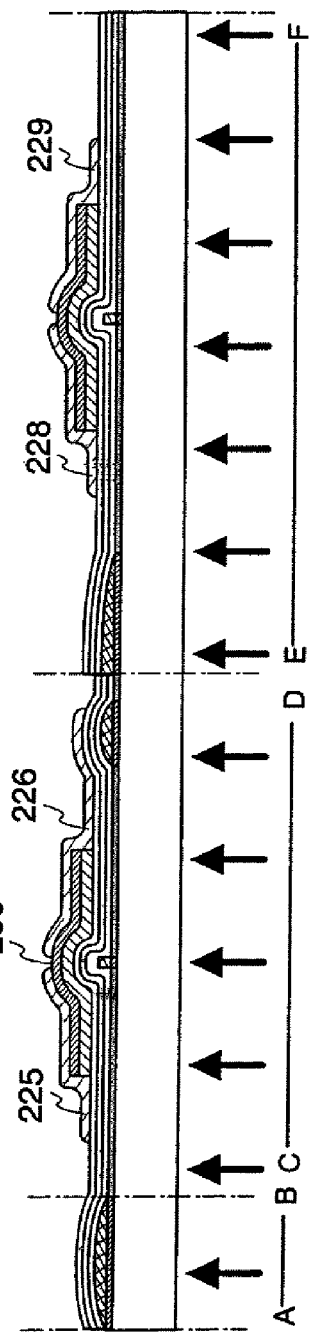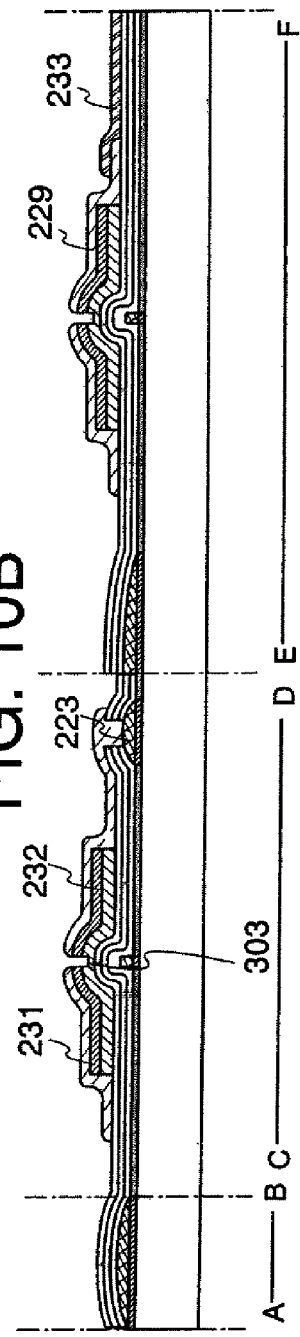

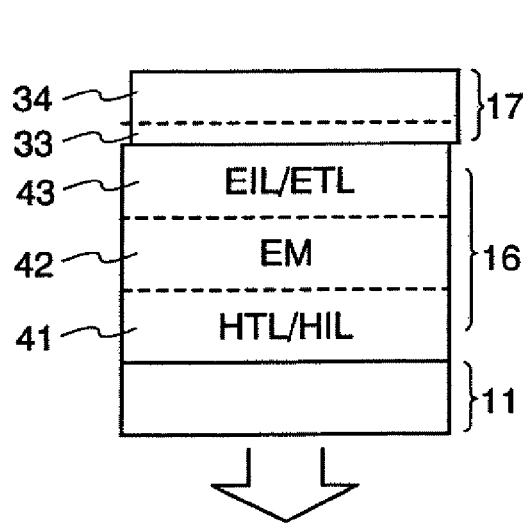
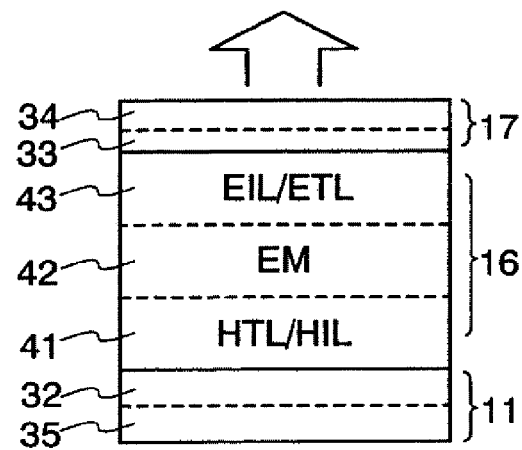
FIG. 19A    FIG. 19B
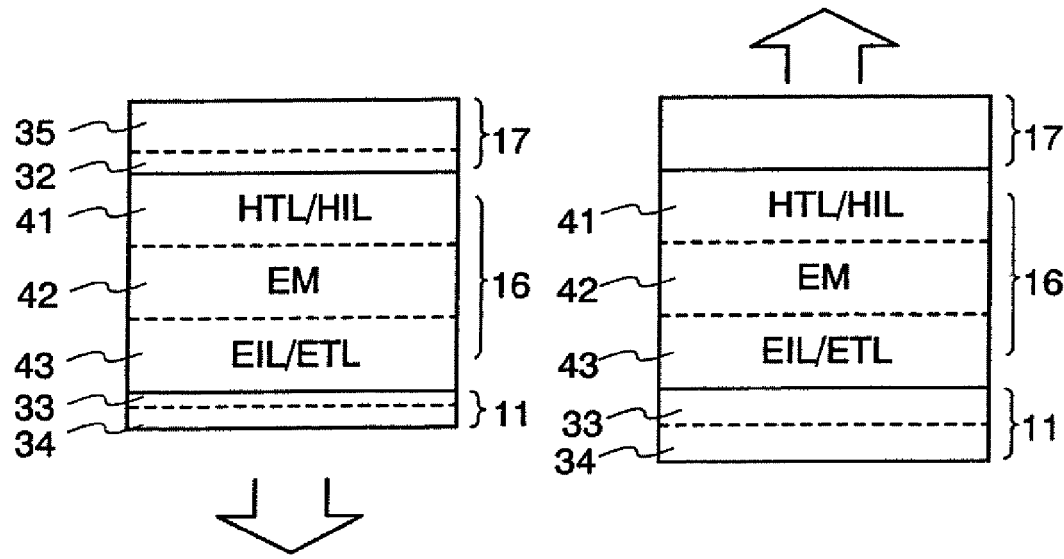
FIG. 20A    FIG. 20B

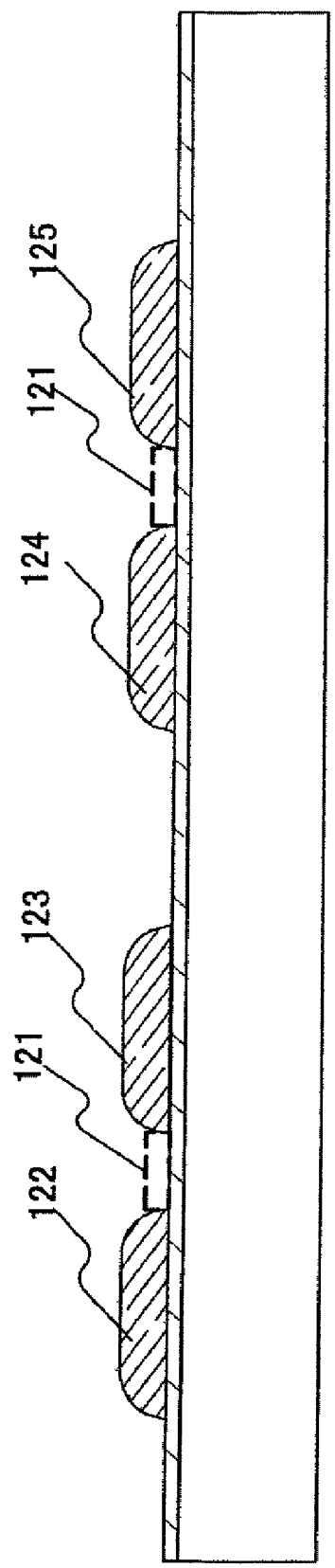
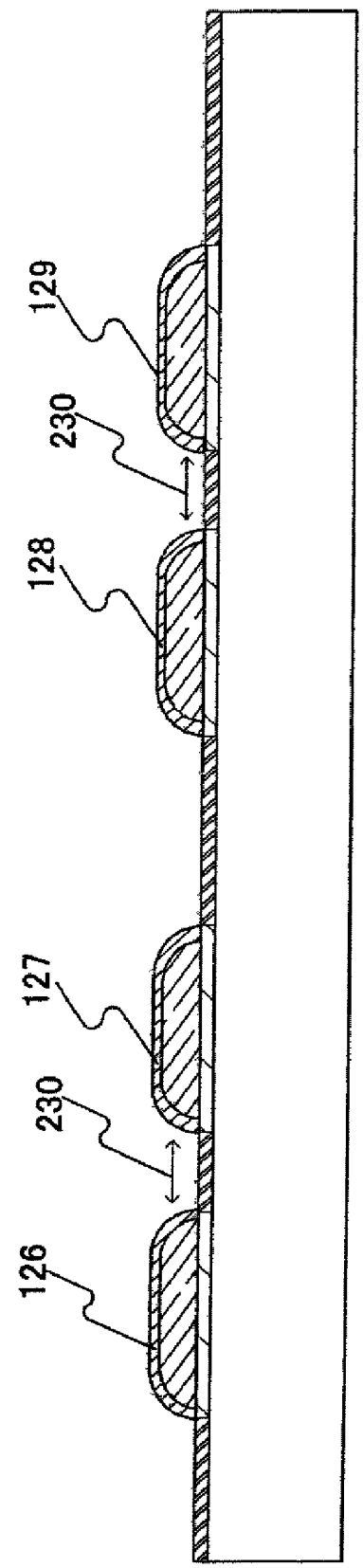
FIG. 35A
FIG. 35B

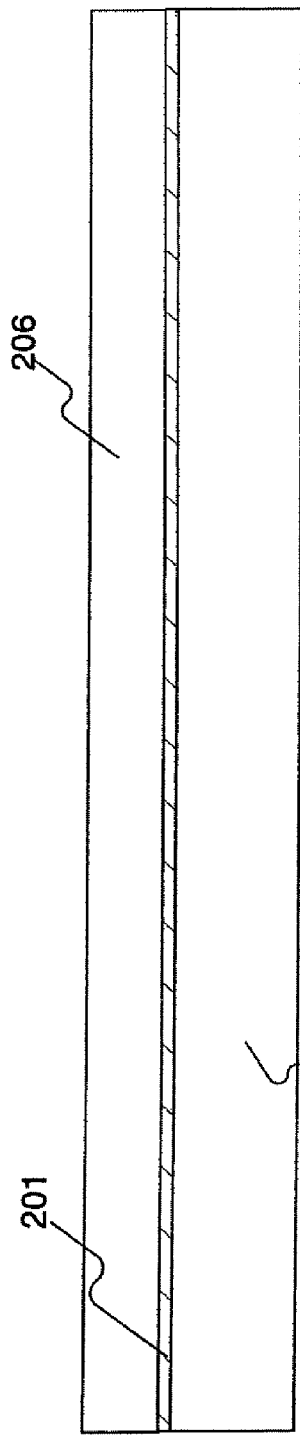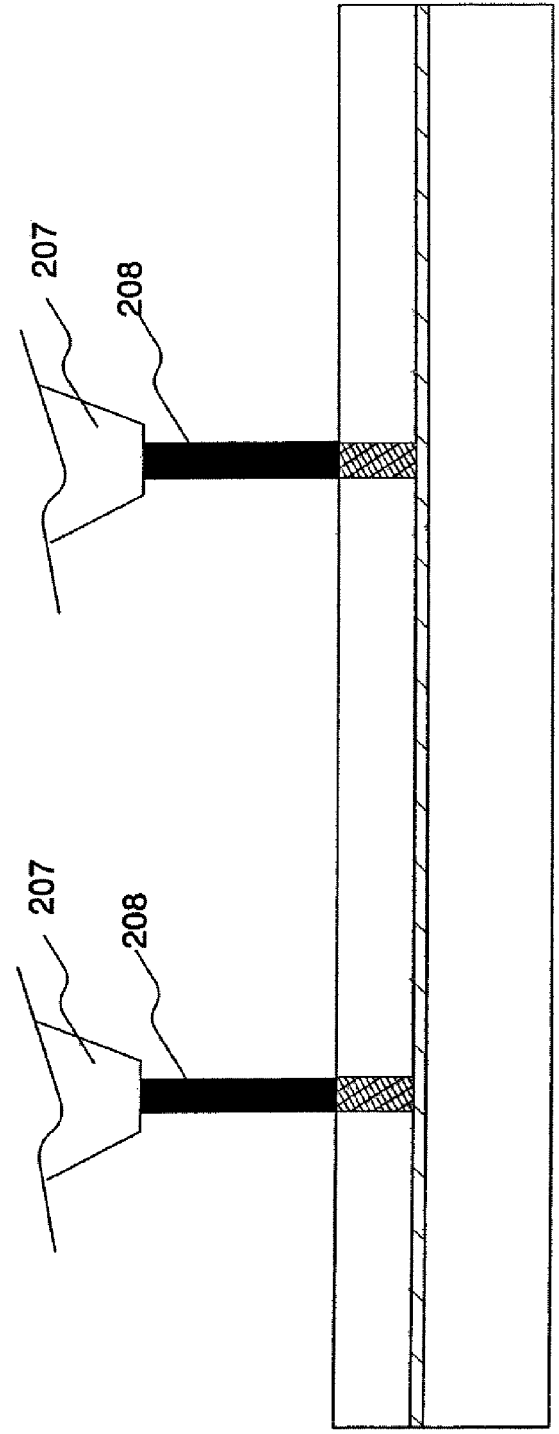
FIG. 37A
FIG. 37B

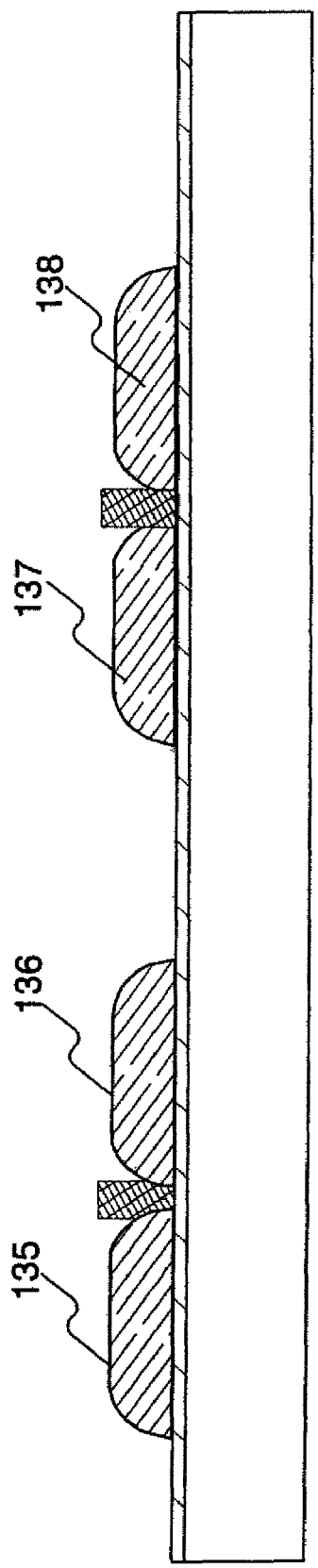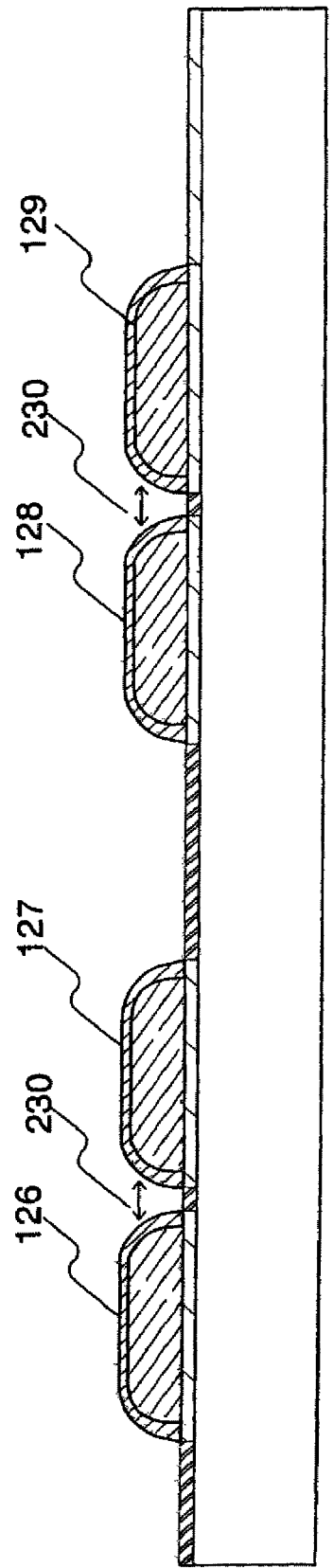

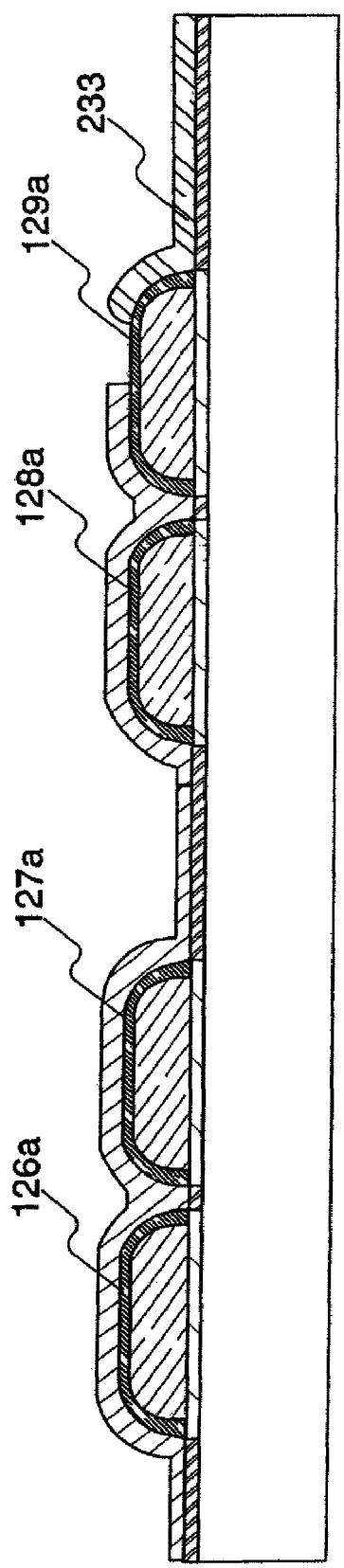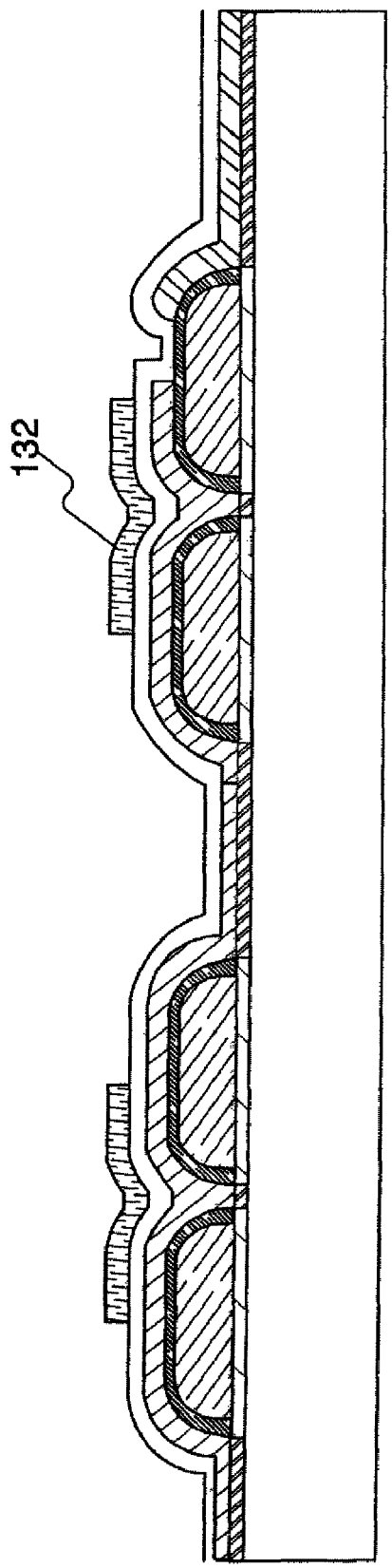

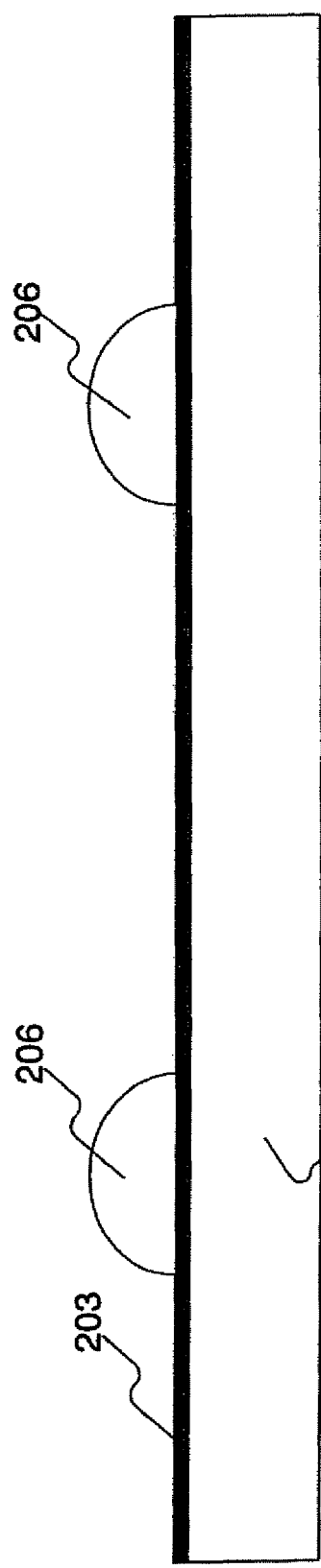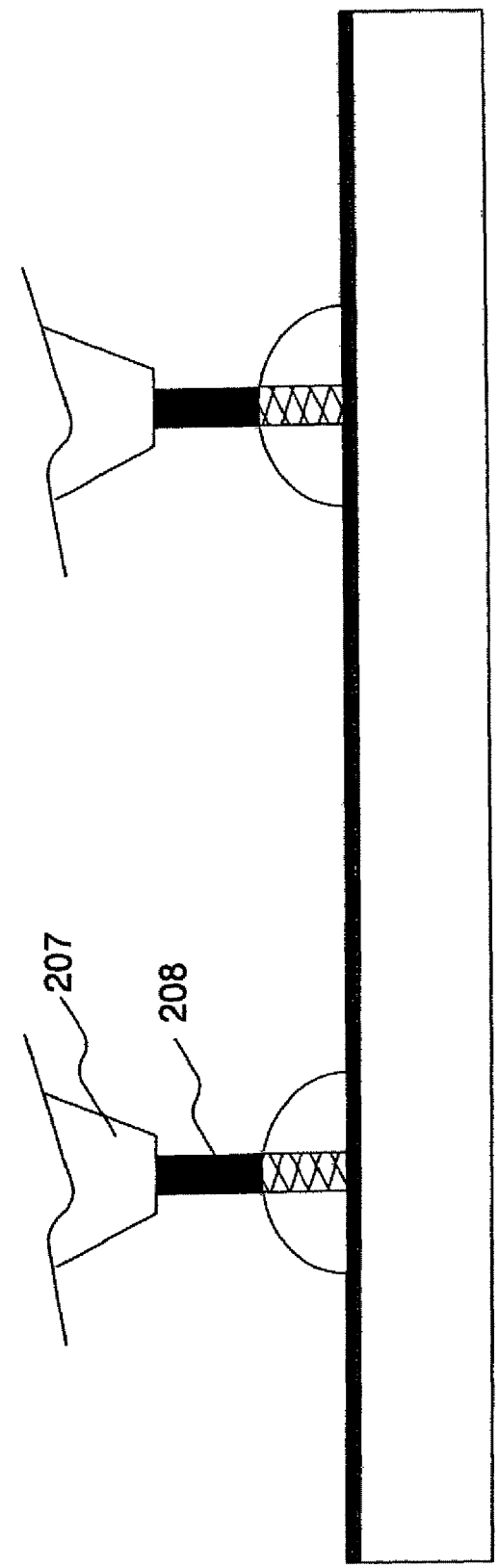
FIG. 41A
FIG. 41B

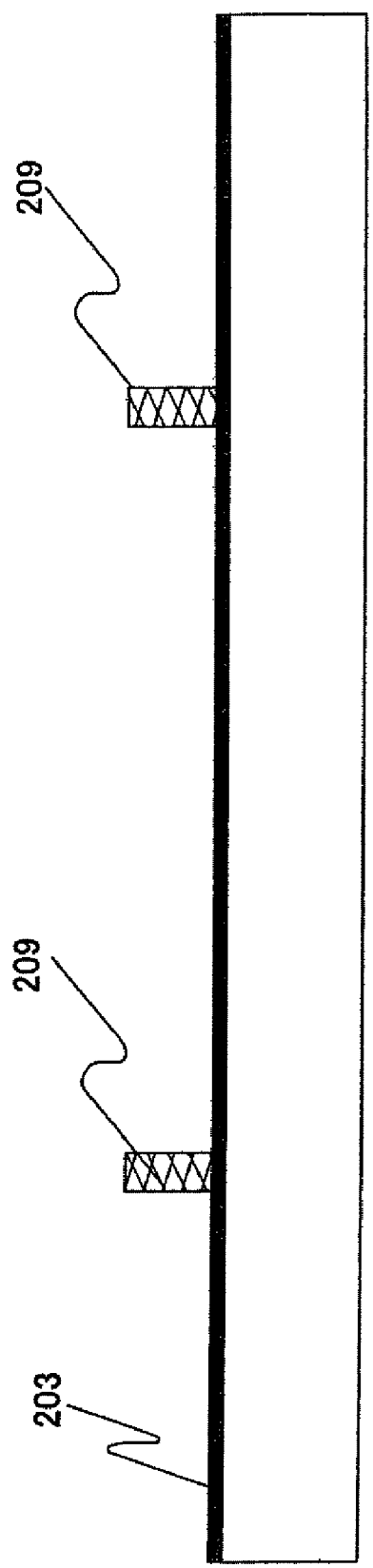
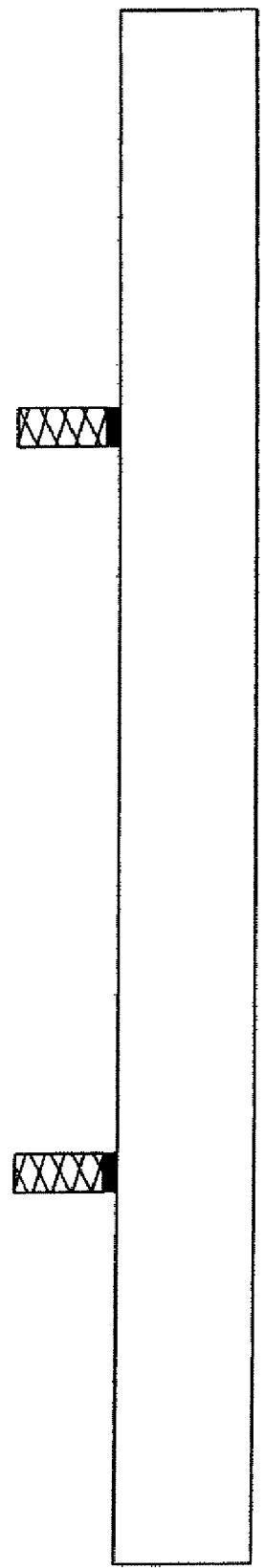
FIG. 42A
FIG. 42B

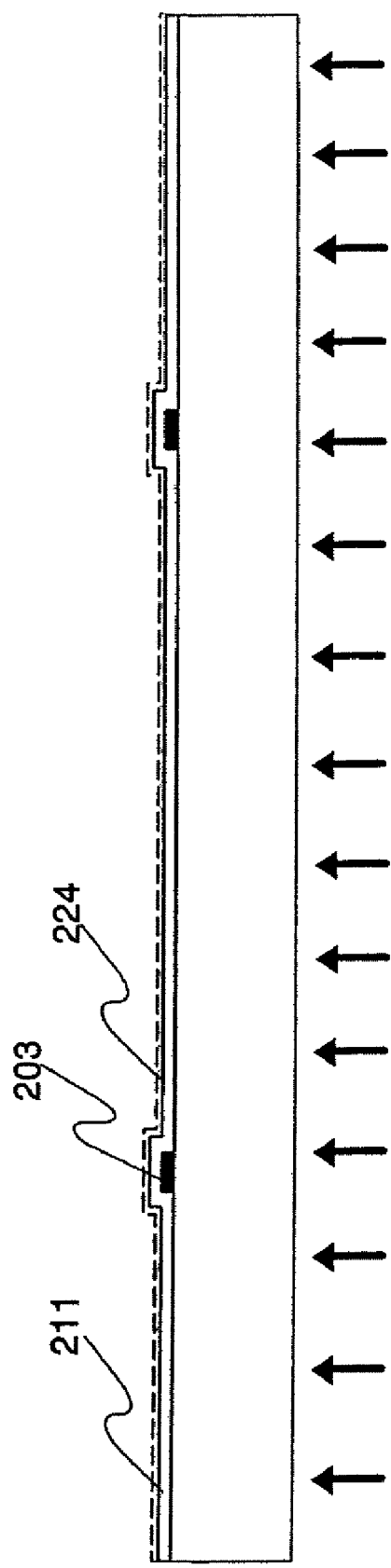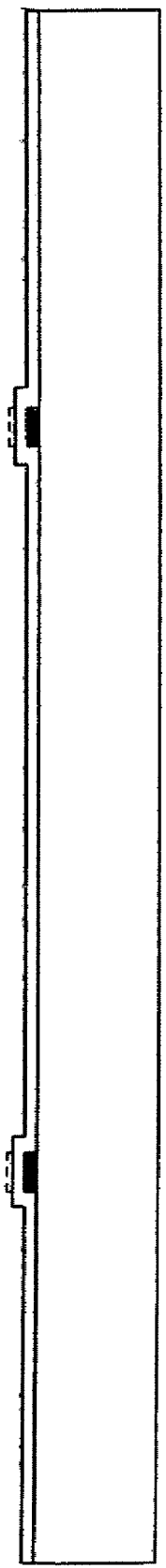
FIG. 43A
FIG. 43B

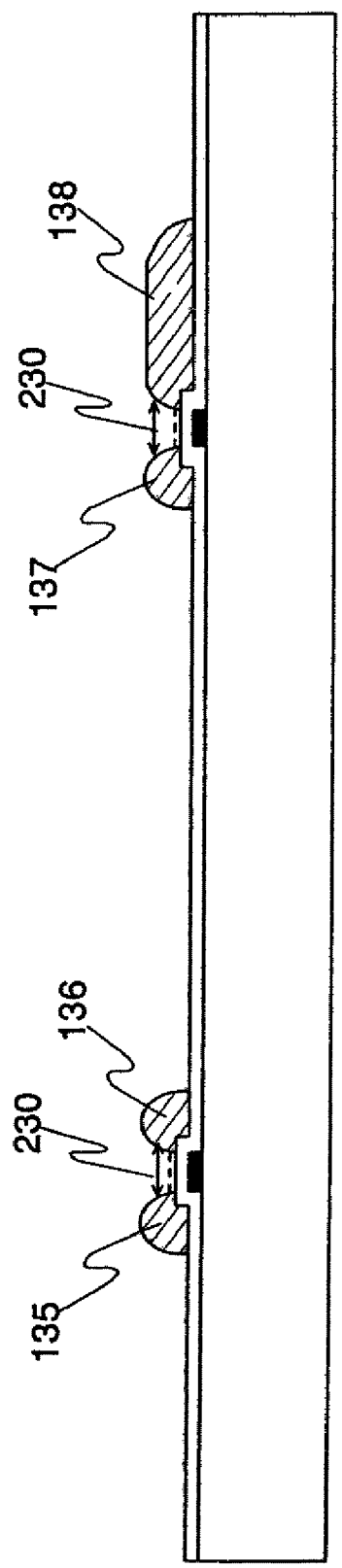
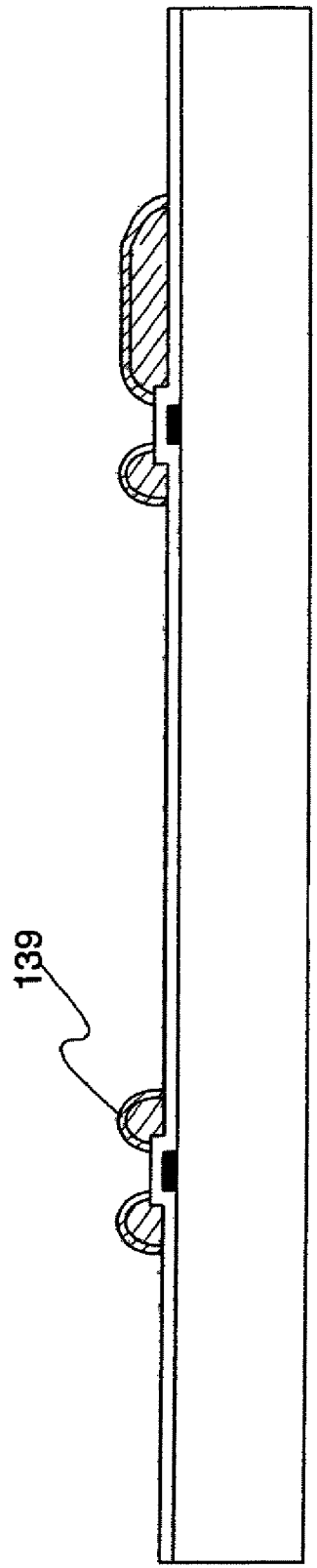
FIG. 44A
FIG. 44B

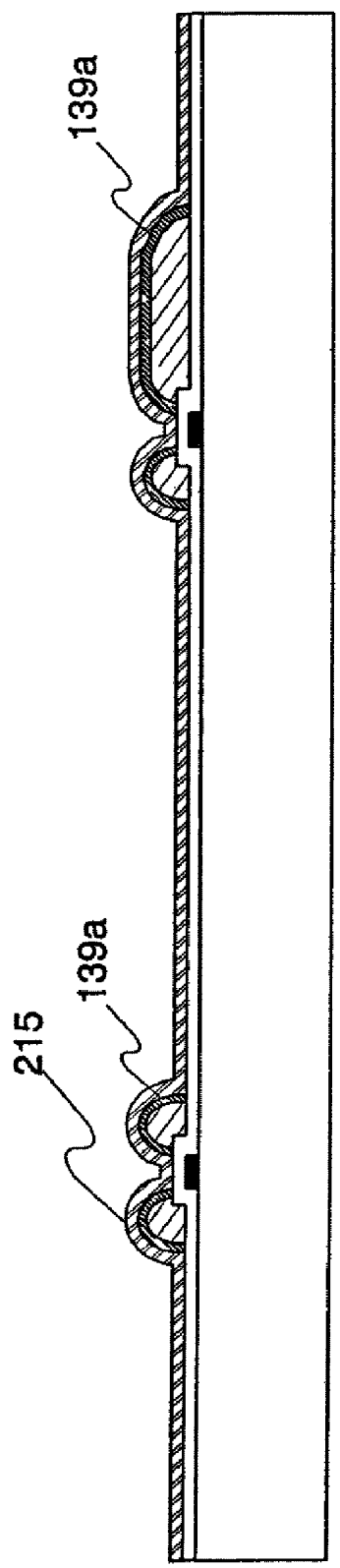
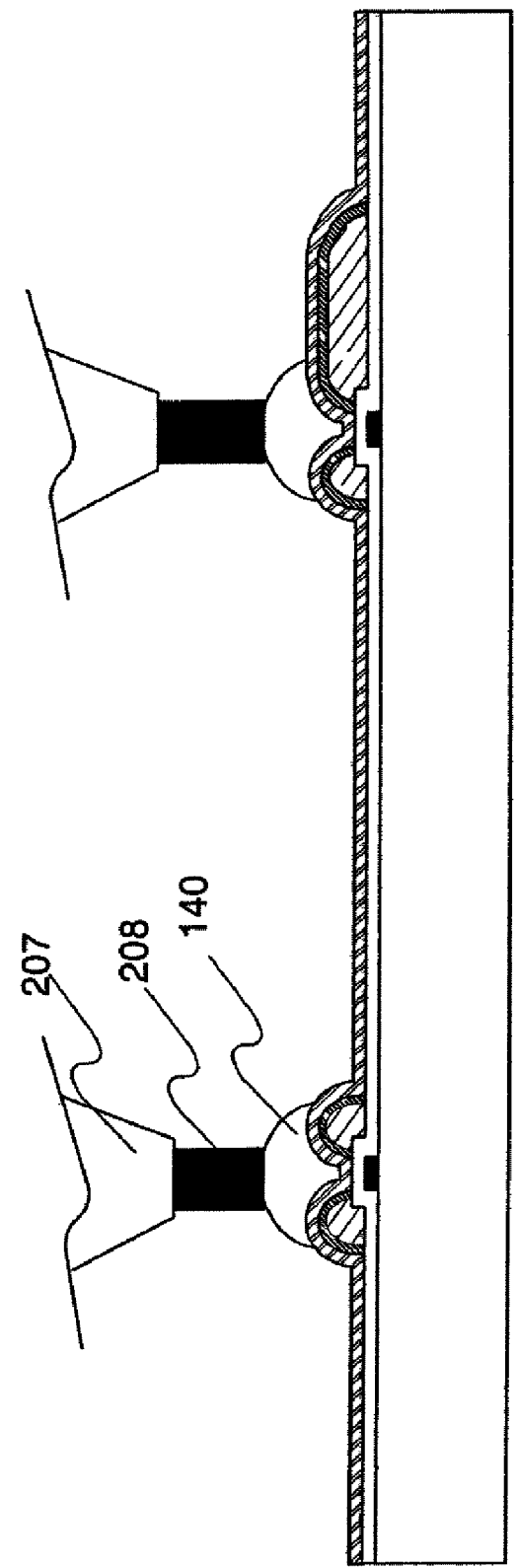
FIG. 45A
FIG. 45B

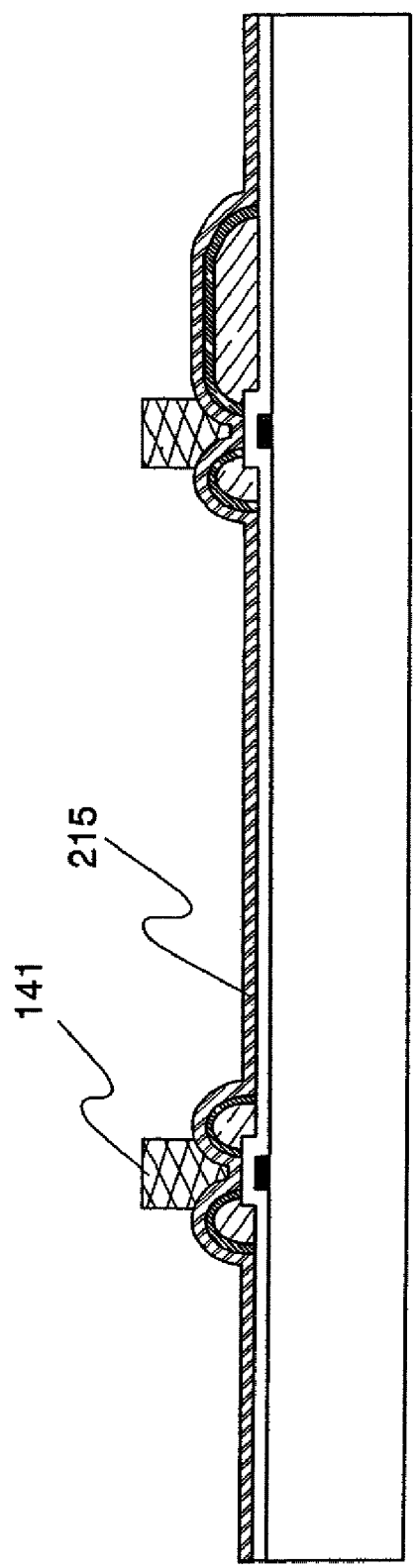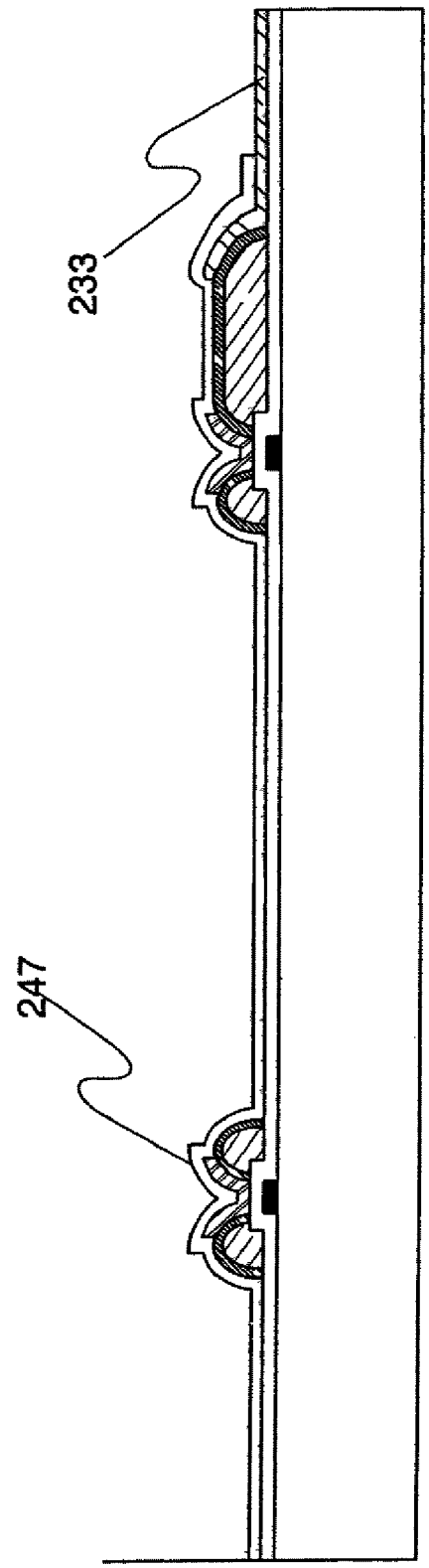

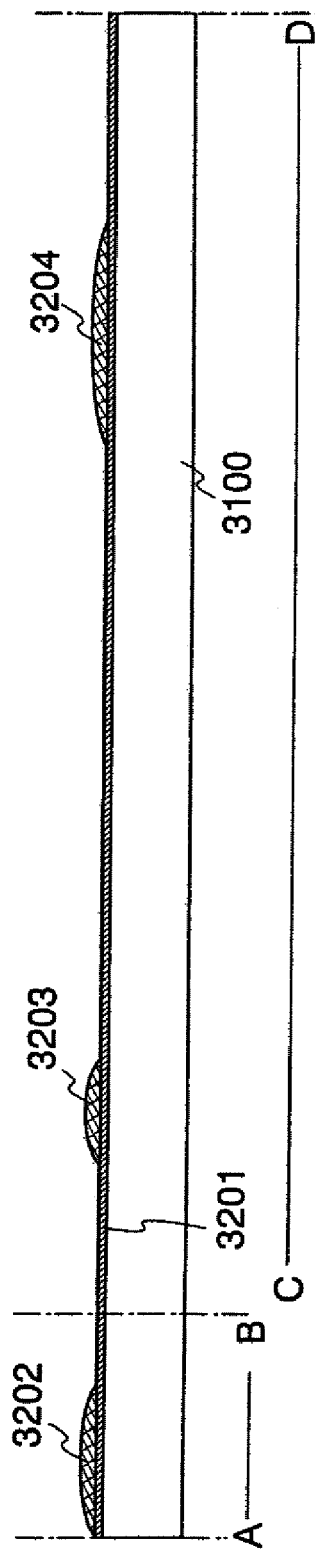
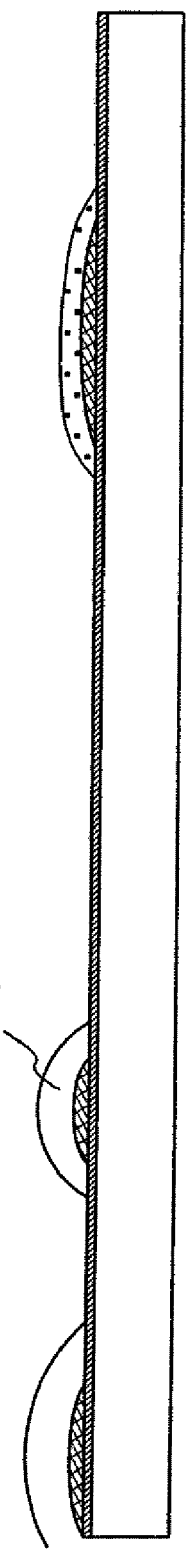
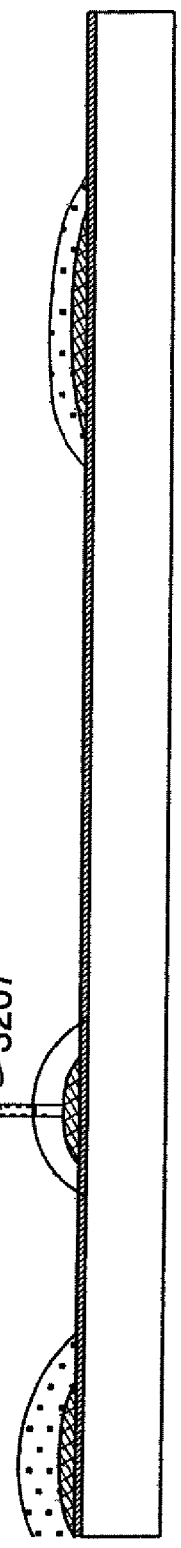
FIG. 47A
FIG. 47B
FIG. 47C

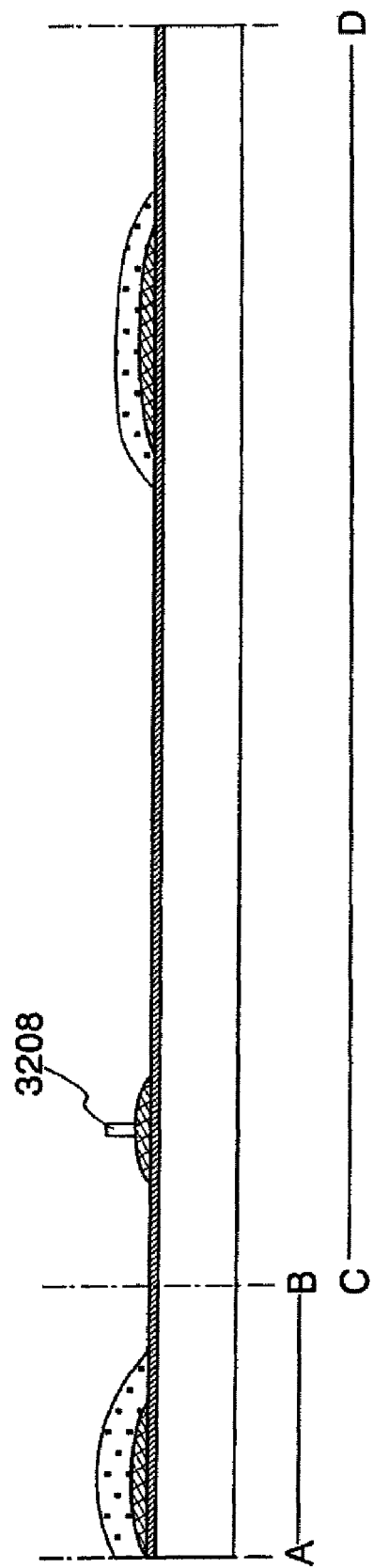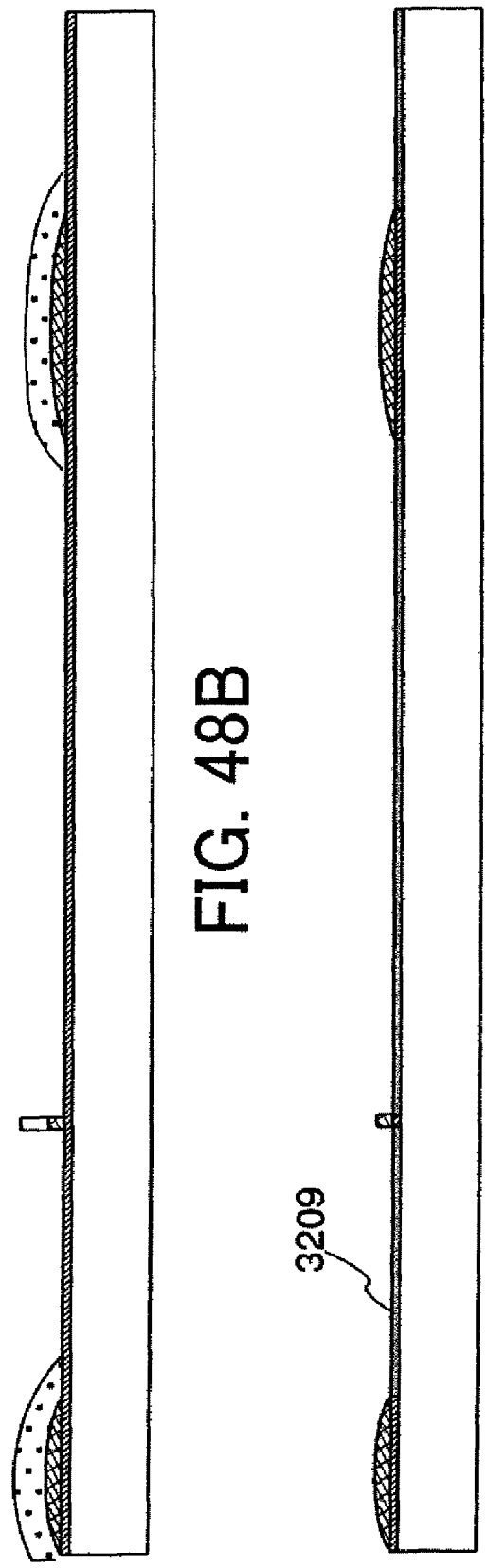

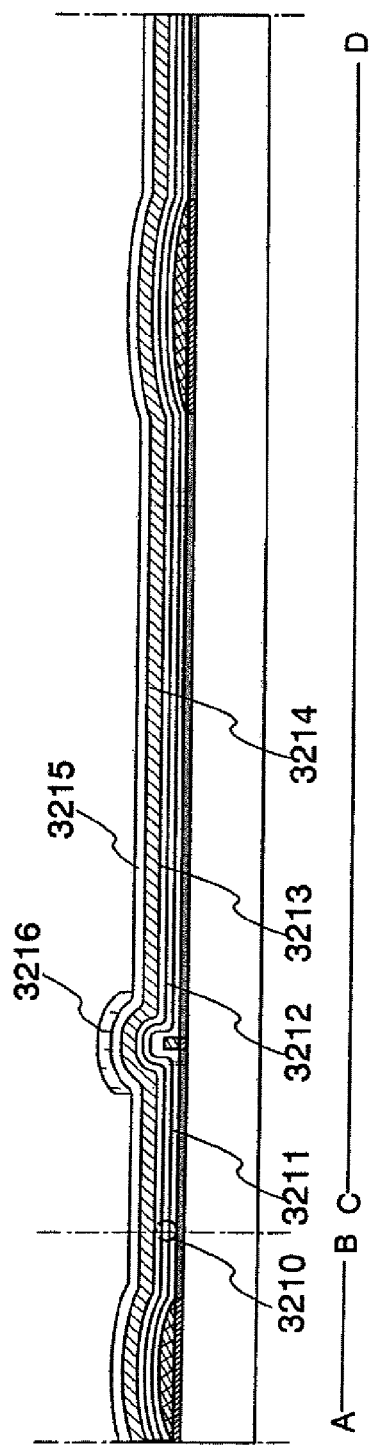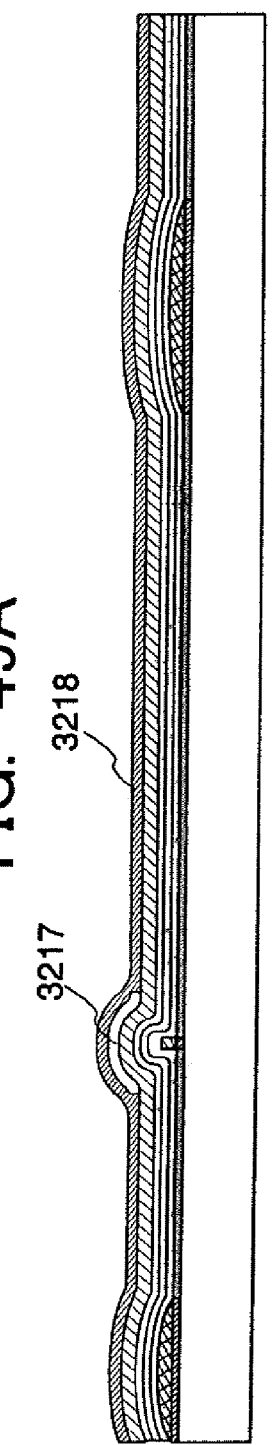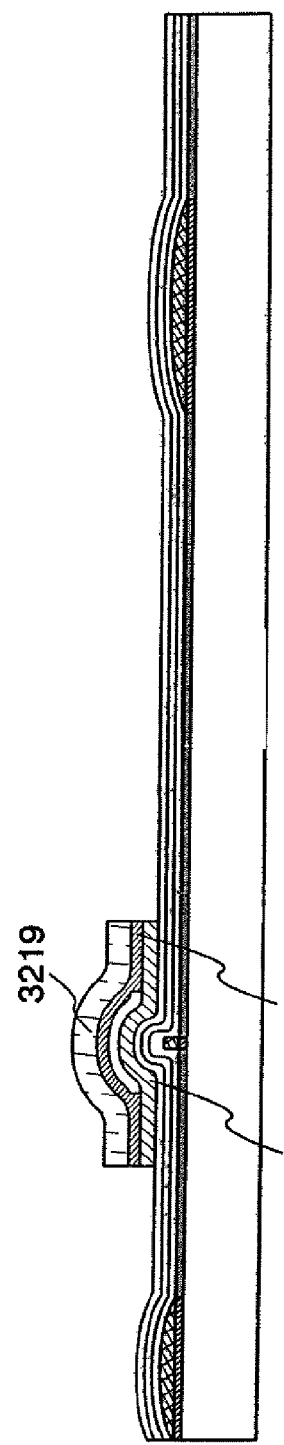
FIG. 49A
FIG. 49B
FIG. 49C

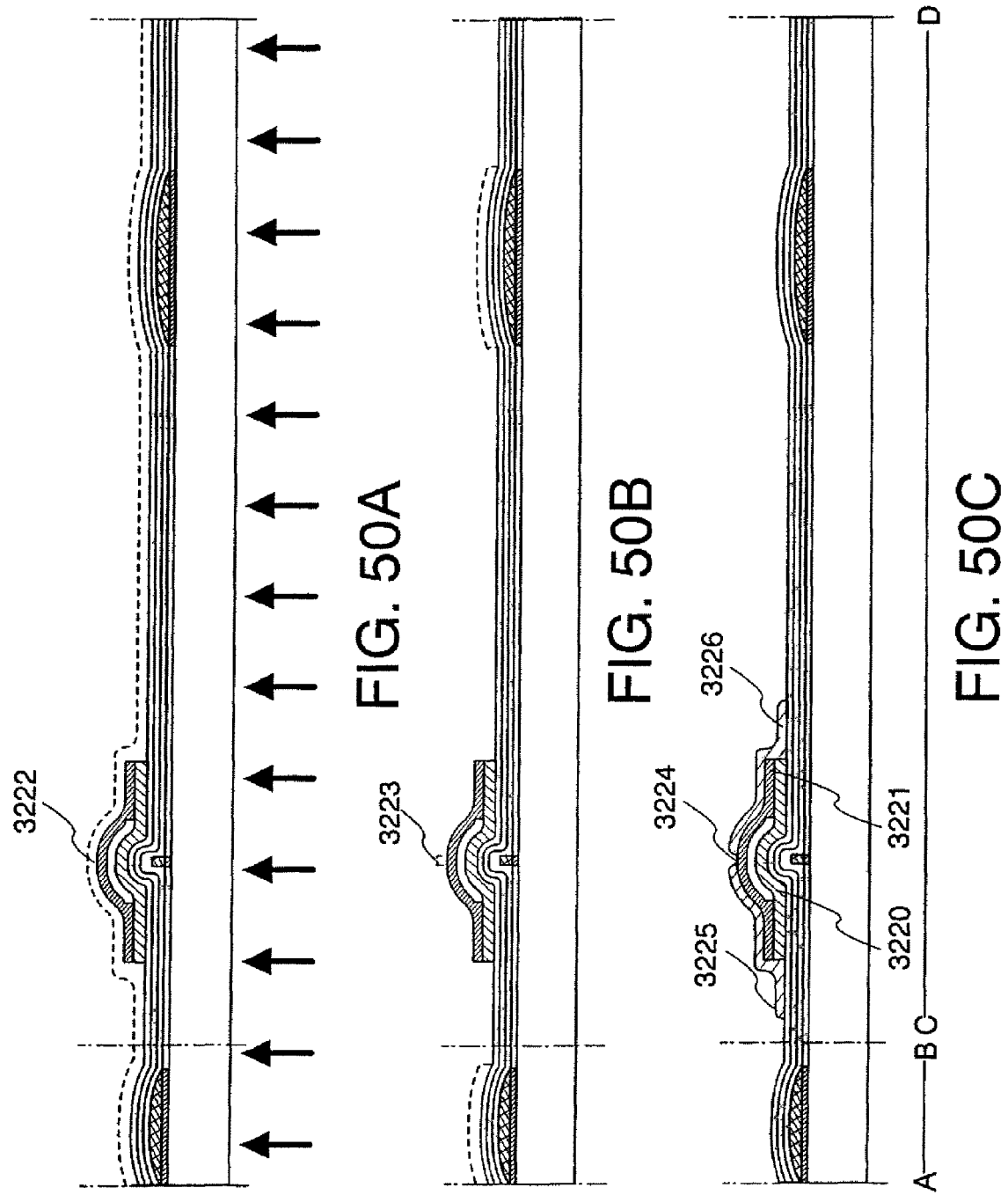

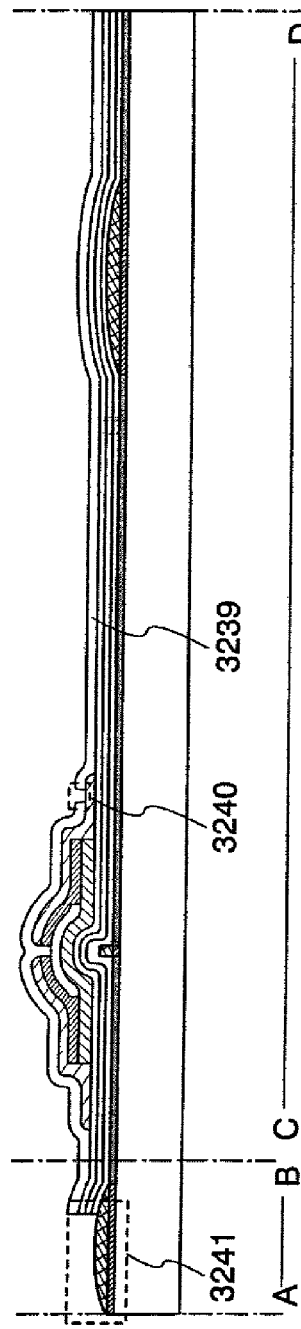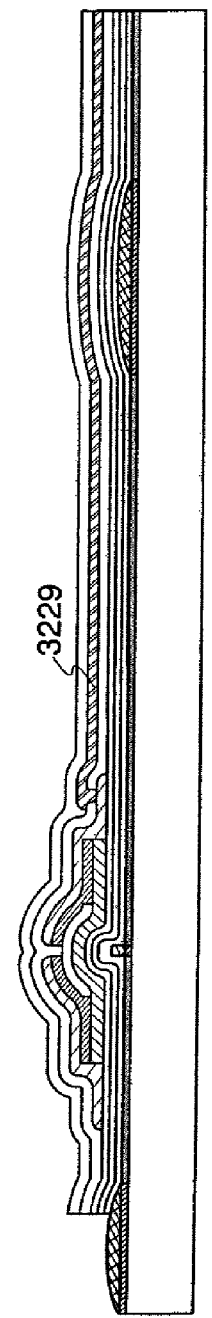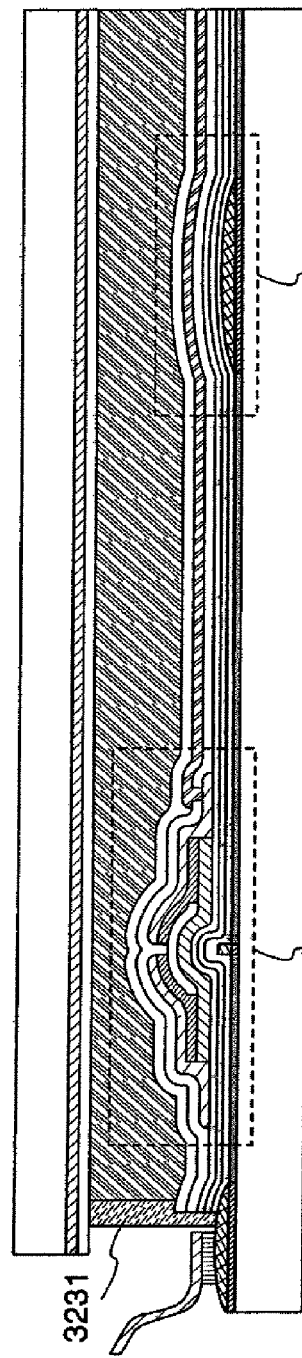

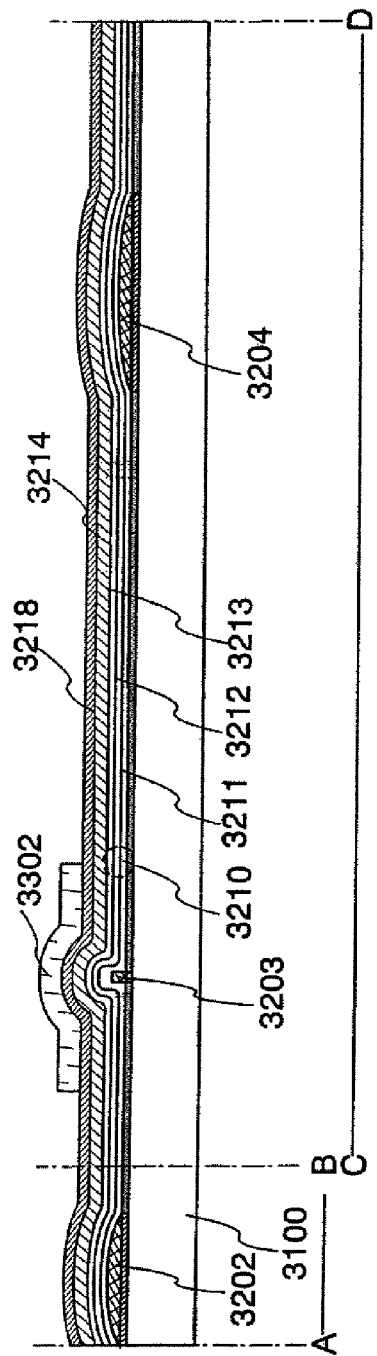
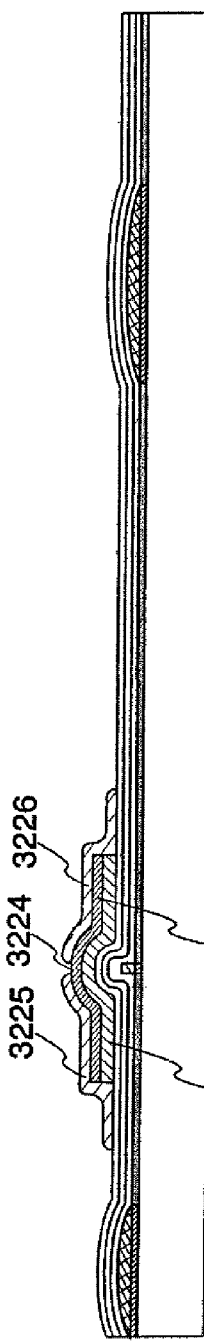
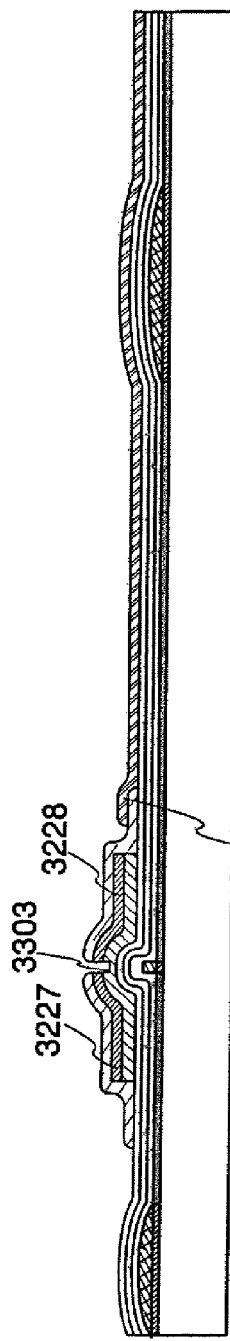
FIG. 54A
FIG. 54B
FIG. 54C

DISPLAY DEVICE, MANUFACTURING METHOD THEREOF, AND TELEVISION RECEIVER

BACKGROUND OF THE INVENTION

1. Field of the Invention

The present invention relates to a display device including a thin film transistor formed by a droplet-discharging method typified by an ink-jetting method and relates to a method for manufacturing the display device.

2. Related Art

A display panel including a thin film transistor (hereinafter also referred to as a TFT) over a substrate, which is so-called an active matrix display panel, has been conventionally manufactured by patterning various thin films according to a photolithography process using a photomask in the same way as a manufacturing technique of a semiconductor integrated circuit.

In other words, the TFT can be manufactured by forming the thin film pattern as follows. After applying resist all over the substrate, prebake is performed to the resist, and then an ultraviolet ray or the like is irradiated thereto in order to expose the resist and to form a resist pattern according to the photolithography process. After that, a film (a film formed of a semiconductor material, an insulating material, or a conductive material) existing in the part not to be the thin film pattern is etched a way using the resist pattern as a mask. Thus, the thin film pattern is formed.

When a glass substrate or a display panel is small, the patterning can be performed comparatively easily by an exposure apparatus. However, with the increase of the size of the substrate, it becomes impossible to expose the whole surface of the display panel in one exposure process. As a result, a method has been developed in which the whole surface of the substrate is exposed in such a way that the region with the photoresist applied is divided into several blocks and then the exposure is made to the respective blocks sequentially (for example, refer to Japanese Patent Document Laid-Open No. H11-326951).

In manufacturing a semiconductor device, it has been examined to employ a droplet-discharging apparatus to pattern a thin film and a wiring used in the TFT for the purpose of reducing the cost of the facility and simplifying the process.

Japanese Patent Document Laid-Open No. 2000-188251 discloses a technique for forming a film over a semiconductor wafer with the use of an apparatus that can discharge resist having a narrow line shape continuously from a nozzle in order to suppress the consumption of the liquid required to form the film.

The droplet may have a small diameter in order to form the TFT having the small size by the drop-discharging method according to Japanese Patent Document Laid-Open No. 2000-188251. For this purpose, the nozzle may have the small diameter. In this case, however, a composition of the discharging droplet is clogged in the top of the nozzle due to adhesion, drying, or solidification of the composition, and therefore it is difficult to discharge a constant amount of droplet stably and continuously. This causes problems of low throughput and low yield of the semiconductor device formed by using the TFT.

SUMMARY OF THE INVENTION

The present invention is made in view of these problems, and the object of the present invention is to provide a method for manufacturing a TFT having a fine structure by using the nozzle not having a small diameter. Moreover, another object of the present invention is to provide a method for manufacturing a semiconductor device with high throughput and high yield at low cost. The present invention discloses a method for manufacturing a display device comprising the steps of forming a thin film, discharging or applying a photosensitive resin (resist) over the thin film, forming a resist mask by irradiating the photosensitive resin with a laser beam, forming a thin film pattern having a desired shape by etching the thin film using the resist mask, and making a part of a droplet-shedding surface into a droplet-attracting surface using the thin film pattern.

The present invention discloses another method for manufacturing a display device comprising the steps of discharging or applying a photosensitive resin, forming a pattern by a step of irradiating the photosensitive resin with a laser beam, and performing a droplet-shedding process to the pattern of the photosensitive resin.

The present invention discloses another method for manufacturing a display device comprising the step of forming a droplet-shedding region and a droplet-attracting region in such a way that a part of the droplet-shedding region is irradiated with a laser beam so that the part irradiated with the laser beam becomes the droplet-attracting region.

Moreover, the present invention includes the following structure.

The present invention discloses another method for manufacturing a display device comprising the steps of forming a first film pattern over a substrate by using a photosensitive material, forming a second film pattern in such a way that the first film pattern is developed after being irradiated with a laser beam, modifying a surface of the second film pattern into a droplet-shedding surface, forming a source electrode and a drain electrode by discharging a conductive material to an outer edge of the droplet-shedding surface according to a droplet-discharging method, and forming a semiconductor layer, a gate insulating film, and a gate electrode over the source electrode and the drain electrode.

The present invention discloses another method for manufacturing a display device comprising the steps of forming a first film pattern over a substrate by using a solution for forming a droplet-shedding surface, forming a second film pattern having a droplet-shedding region and a droplet-attracting region by irradiating the first film pattern with a laser beam so as to change the droplet-shedding region into the droplet-attracting region, forming a source electrode and a drain electrode by discharging a conductive material over a surface of the droplet-shedding region according to a droplet-discharging method, and forming a semiconductor layer, a gate insulating film, and a gate electrode over the source electrode and the drain electrode.

The present invention discloses another method for manufacturing a display device comprising the steps of forming a first film pattern over a light-transmitting substrate by a droplet-discharging method, discharging or applying a photosensitive material over the first film pattern, forming a mask pattern in such a way that a region where the first film pattern and the photosensitive material are superposed is developed after being irradiated with a first laser beam, forming a gate electrode having a desired shape by etching the first film pattern using the mask pattern, forming a first insulating film over the gate electrode, forming a droplet-shedding surface over the first insulating film, modifying a part of the droplet-shedding surface into a droplet-attracting surface by irradiating the part of the droplet-shedding surface with a second laser beam transmitted through the light-transmitting substrate, forming a source electrode and a drain electrode over the droplet-attracting surface, the gate electrode, and the first insulating film, and forming a semiconductor layer over the droplet-shedding surface.

The present invention discloses another method for manufacturing a display device comprising the steps of forming a first film pattern over a light-transmitting substrate by a droplet-discharging method, discharging or applying a photosensitive material over the first film pattern, forming a mask pattern in such a way that a region where the first film pattern and the photosensitive material are superposed is developed after being irradiated with a first laser beam, forming a gate electrode having a desired shape by etching the first film pattern using the mask pattern, forming a first insulating film over the gate electrode, forming a semiconductor layer over the first insulating film, forming a droplet-shedding surface over a surface of the first insulating film and the semiconductor layer, modifying a part of the droplet-shedding surface into a droplet-attracting surface by irradiating the part of the droplet-shedding surface with a second laser beam transmitted through the light-transmitting substrate, forming a source electrode and a drain electrode over the droplet-attracting surface, and forming a source region and a drain region by etching a part of the semiconductor layer while using the source electrode and the drain electrode as a mask.

The present invention discloses another method for manufacturing a display device comprising the steps of forming a first film pattern over a light-transmitting substrate by a droplet-discharging method, discharging or applying a photosensitive material over the first film pattern, forming a mask pattern in such a way that a region where the first film pattern and the photosensitive material are superposed is developed after being irradiated with a first laser beam, forming a gate electrode having a desired shape by etching the first film pattern using the mask pattern, forming a first insulating film over the gate electrode, forming a first semiconductor layer over the first insulating film, forming a second insulating film over the first semiconductor layer, forming a second semiconductor layer over the first semiconductor layer and the second insulating film, forming a droplet-shedding surface over surfaces of the first insulating film and the second semiconductor layer, modifying a part of the droplet-shedding surface into a droplet-attracting surface by irradiating the part of the droplet-shedding surface with a second laser beam transmitted through the light-transmitting substrate, forming a source electrode and a drain electrode over the droplet-attracting surface, and forming a source region and a drain region by etching the second semiconductor layer while using the source electrode and the drain electrode as a mask.

In the present invention, the first laser beam has a wavelength in the range of an ultraviolet region to an infrared region, and the second laser beam has a wavelength in the range of an ultraviolet to infrared region.

The photosensitive material is a negative photosensitive resin or a positive photosensitive resin.

Moreover, the present invention discloses a television having a display device formed by the above method for manufacturing the display device.

It is noted that the display device is a liquid crystal display device or a light-emitting device.

[Advantageous Effect of the Invention]

The present invention can miniaturize the thin film pattern in the case of using the droplet-discharging method when the droplet-shedding process is performed in combination with a droplet-shedding process and partly changing the droplet-shedding surface into a droplet-attracting surface by the laser irradiation. For example, even a minute control of a space between the source wiring and the drain wiring over the channel-forming region of the TFT becomes possible, and the characteristic of the TFT can be enhanced.

Moreover, a TFT having the fine structure can be formed even when the diameter of the nozzle is not small in particular. A highly integrated circuit and a semiconductor display device such as a display device having high aperture can be manufactured using the TFT with high throughput and high yield at low cost.

BRIEF DESCRIPTION OF THE DRAWINGS

In the accompanying drawings;

FIGS. 4A to 4C are cross-sectional views for explaining a manufacturing process of an EL display panel of the present invention;

FIGS. 5A to 5C are cross-sectional views for explaining a manufacturing process of an EL display panel of the present invention;

FIGS. 6A to 6C are cross-sectional views for explaining a manufacturing process of an EL display panel of the present invention;

FIGS. 7A to 7C are cross-sectional views for explaining a manufacturing process of an EL display panel of the present invention;

FIGS. 8A to 8C are cross-sectional views for explaining a manufacturing process of an EL display panel of the present invention;

FIGS. 10A to 10C are cross-sectional views for explaining a manufacturing process of an EL display panel of the present invention;

FIGS. 19A and 19B are drawings for explaining a light-emitting element applicable in the present invention;

FIGS. 20A and 20B are drawings for explaining a light-emitting element applicable in the present invention;

FIGS. 35A and 35B are cross-sectional views for explaining a manufacturing process of an EL display panel of the present invention;

FIGS. 37A and 37B are cross-sectional views for explaining a manufacturing process of a display panel of the present invention;

FIGS. 39A and 39B are cross-sectional views for explaining a manufacturing process of a display panel of the present invention;

FIGS. 40A and 40B are cross-sectional views for explaining a manufacturing process of a display panel of the present invention;

FIGS. 41A and 41B are cross-sectional views for explaining a manufacturing process of a display panel of the present invention;

FIGS. 42A and 42B are cross-sectional views for explaining a manufacturing process of a display panel of the present invention;

FIGS. 43A and 43B are cross-sectional views for explaining a manufacturing process of a display panel of the present invention;

FIGS. 44A and 44B are cross-sectional views for explaining a manufacturing process of a display panel of the present invention;

FIGS. 45A and 45B are cross-sectional views for explaining a manufacturing process of a display panel of the present invention;

FIGS. 46A and 46B are cross-sectional views for explaining a manufacturing process of a display panel of the present invention;

FIGS. 47A to 47C are cross-sectional views for explaining a manufacturing process of a liquid crystal display panel of the present invention;

FIGS. 48A to 48C are cross-sectional views for explaining a manufacturing process of a liquid crystal display panel of the present invention;

FIGS. 49A to 49C are cross-sectional views for explaining a manufacturing process of a liquid crystal display panel of the present invention;

FIGS. 50A to 50C are cross-sectional views for explaining a manufacturing process of a liquid crystal display panel of the present invention;

FIGS. 53A to 53C are cross-sectional views for explaining a manufacturing process of a liquid crystal display panel of the present invention;

FIGS. 54A to 54C are cross-sectional views for explaining a manufacturing process of a liquid crystal display panel of the present invention;

DETAILED DESCRIPTION OF THE INVENTION

Figure 1:
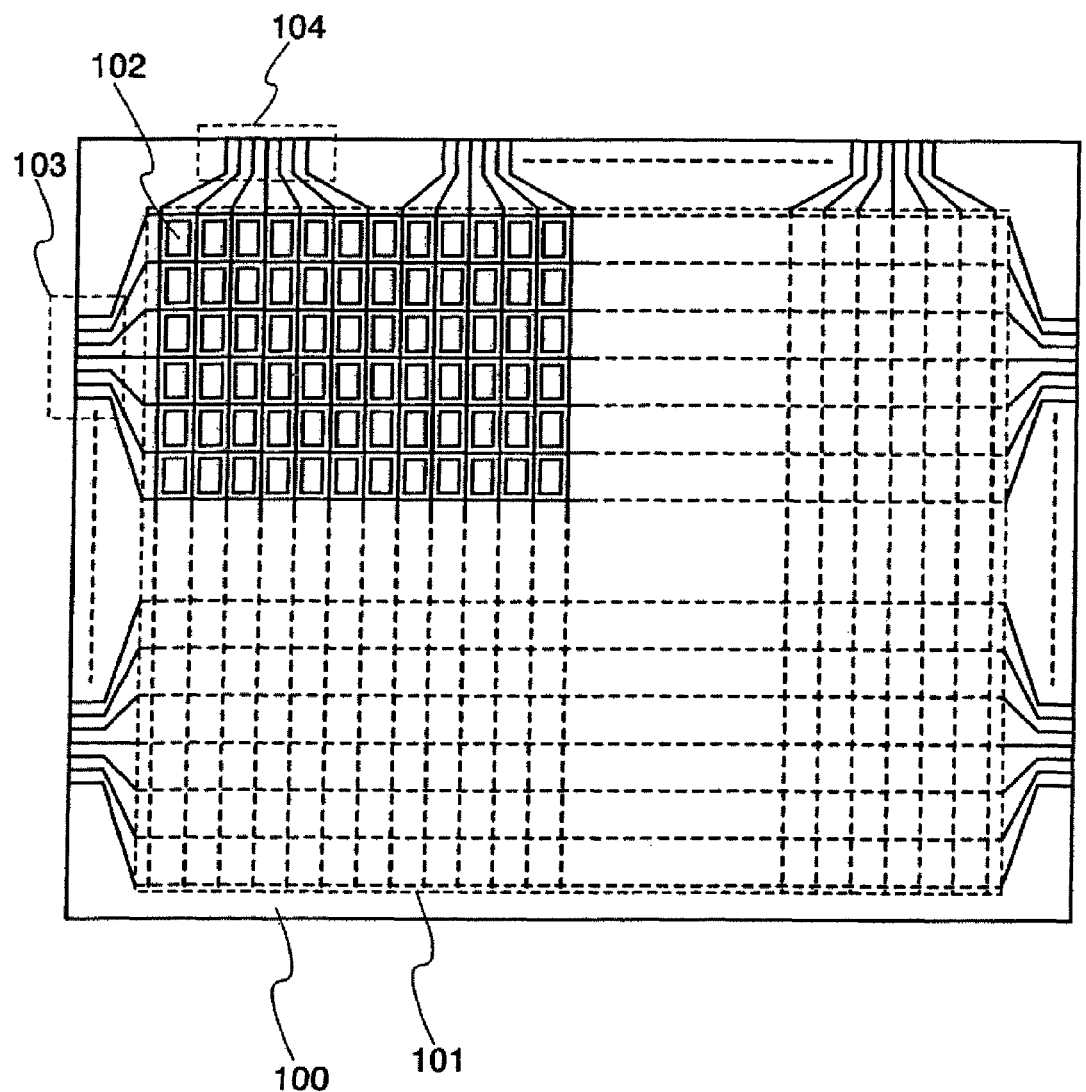
FIG. 1 is a top view for explaining a structure of a display panel of the present invention.

Embodiment modes of the present invention are hereinafter explained with reference to drawings. Since the present invention can be embodied in many different modes, it is easily understood by those skilled in the art that the modes and the details of the present invention can be changed and modified in various ways unless such changes and modifications depart from the scope and the content of the present invention hereinafter defined. Therefore, the present invention is not limited to the description of the embodiment modes. The same reference numerals are given to the same part throughout the drawings, and the explanation to the same parts is omitted.

FIG. 1 is a top view for showing a structure of a display panel of the present invention. A pixel portion 101 in which pixels 102 are arranged in a matrix form, an input terminal 103 on a scanning line side, and an input terminal 104 on a signal line side are formed over a substrate 100 having an insulating surface. The number of pixels may be determined based on various needs. It may be 1024×768×3 (RGB) in the case of XGA, and it may be 1600×1200×3 (RGB) in the case of UXGA. It may be 1920×1080×3 (RGB) in the case of a full-spec high definition.

When the display panel of the present invention is an EL display panel, the pixels 102 are arranged in a matrix form at intersection points of scanning lines and signal lines. The scanning lines extend from the input terminal 103 on the scanning line side, and the signal lines extend from the input terminal 104 on the signal line side. Each of the pixels 102 is provided with a transistor for controlling a connection state with the signal line (hereinafter this transistor is also referred to as a switching transistor or a switching TFT in case of using a TFT as the transistor) and a transistor for controlling current supplying to a light-emitting element (hereinafter this transistor is also referred to as a driver transistor or a driver TFT in case of using a TFT as the transistor), and the driver transistor is serially connected to the light-emitting element.

When the display panel of the present invention is a liquid crystal display panel, the pixels 102 are also arranged in a matrix form at intersection points of scanning lines and signal lines. The scanning lines extend from the input terminal 103 on a scanning line side, and the signal lines extend from the input terminal 104 on the signal line side. Each of the pixels 102 is provided with a switching element and a pixel electrode connected to the switching element. A typical example of the switching element is a TFT. When a gate electrode of the TFT is connected with the scanning line and when one of a source and a drain of the TFT is connected with the signal line, the respective pixels can be controlled independently by a signal input from the outside.

The main components of the TFT are a semiconductor layer, a gate-insulating layer, and a gate electrode layer, followed by an additional component such as a wiring to be connected to the source region or the drain region formed in the semiconductor layer. As the structure of the TFT, two structures are typically known. One of them is a top-gate structure in which the semiconductor layer, the gate-insulating layer, and the gate electrode layer are formed in order from the substrate side, and the other is a bottom-gate structure in which the gate electrode layer, the gate-insulating layer, and the semiconductor layer are formed in order from the substrate side. In the present invention, any structure may be employed.

The material for forming the semiconductor layer may be an amorphous semiconductor (hereinafter also referred to as an AS) manufactured by a vapor growth method or a sputtering method using a semiconductor material gas typified by silane or germane, a poly-crystalline semiconductor obtained by crystallizing the amorphous semiconductor while using photo energy or thermal energy, a semi-amorphous semiconductor (also referred to as microcrystal and hereinafter also referred to as an SAS for short), or the like.

The SAS has an intermediate characteristic between the amorphous semiconductor and the crystalline semiconductor (the crystalline semiconductor includes a single-crystal semiconductor and a poly-crystalline semiconductor) and has a third state that is stable in free energy. Moreover, the SAS includes a crystalline region having short-range order and having lattice distortion. A crystalline region having a width from 0.5 to 20 nm can be observed at least in a part of the region in an SAS film, and the raman spectrum of Si—Si conjection shifts to the side of lower wavenumber than 520 $cm^{-1}$ in the case of using silicon as a main component. According to an X-ray diffraction, a diffraction peak of (111) and (220), which is considered to be caused by a silicon crystal lattice, is observed. As a terminating agent of a dangling bond, hydrogen or halogen is included by 1 atomic % or more. The SAS can be formed by glow-discharging the silicide gas (this method is refereed a plasma CVD method). As the silicide gas, $SiH_4$, $Si_2H_6$, $SiH_2Cl_2$, $SiHCl_3$, $SiCl_4$, $SiF_4$, or the like can be used. Moreover, $GeF_4$ may be mixed into the above gas. Furthermore, the silicide gas may be diluted with one or a plurality of elements selected from the group consisting of $H_2$, He, Ar, Kr, and Ne by a dilution ratio of 2 to 1000 times under the condition where the pressure is from approximately 0.1 to 133 Pa, the power supply frequency is from 1 to 120 MHz, preferably from 13 to 60 MHz, and the substrate temperature is 300° C. or less. It is preferable that the concentration of the impurity in the atmospheric constituent such as oxygen, nitrogen, or carbon is $1\times10^{20}$ atoms/$cm^3$ or less. Particularly, the concentration of the oxygen is set to $5\times10^{19}$ atoms/$cm^3$ or less, preferably $1\times10^{19}$ atoms/$cm^3$ or less.

Figure 2:
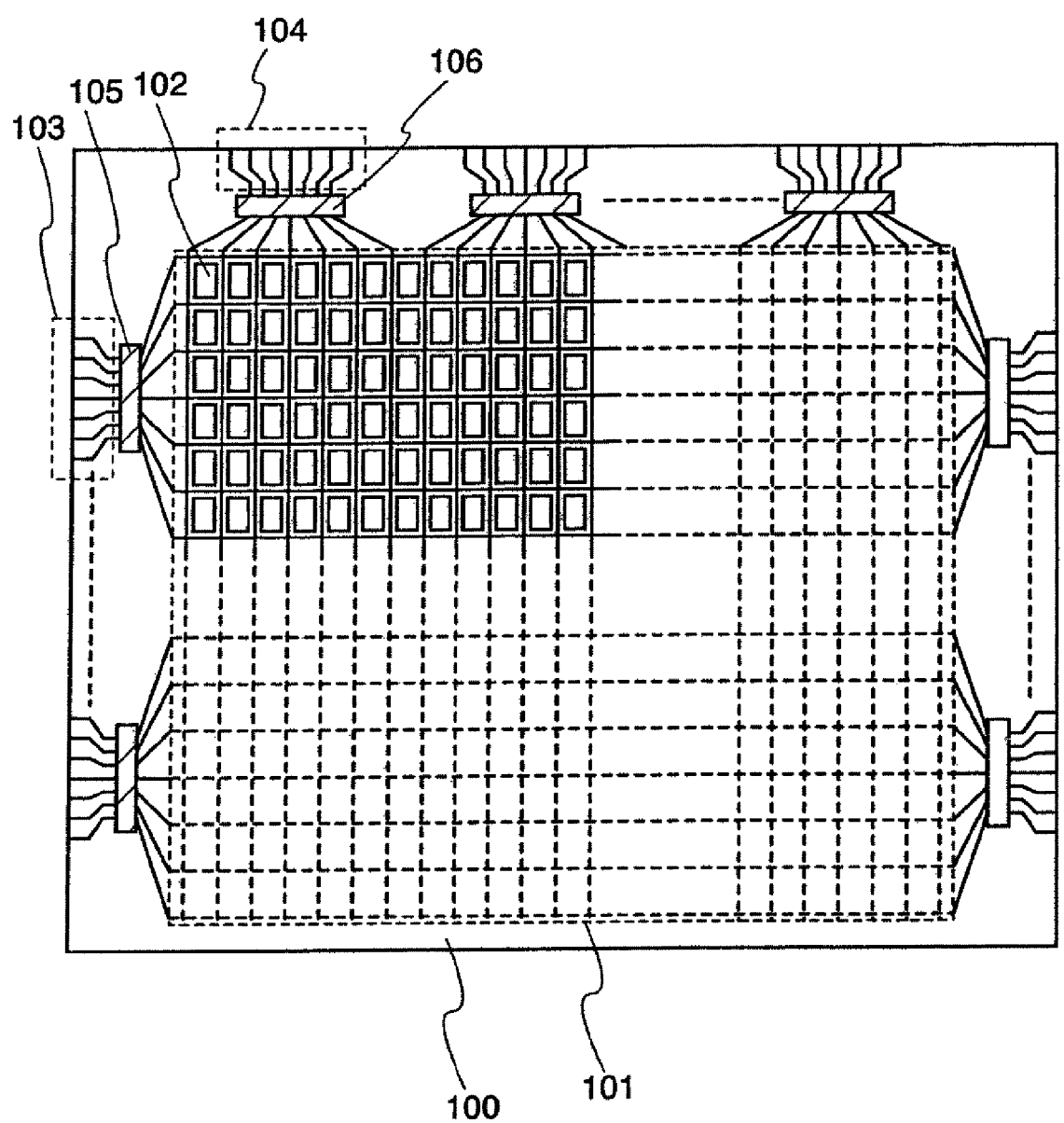
FIG. 2 is a top view for explaining a structure of a display panel of the present invention.

FIG. 1 shows a structure of the display panel in which the signals input into the scanning line and the signal line are controlled by an external driver circuit. However, driver ICs 105 and 106 may be mounted over the substrate 100 as a COG (Chip On Glass) as shown in FIG. 2. Moreover, the driver ICs 105 and 106 may be formed using a single-crystal semiconductor substrate or may be formed by a TFT over a glass substrate.

Figure 3:
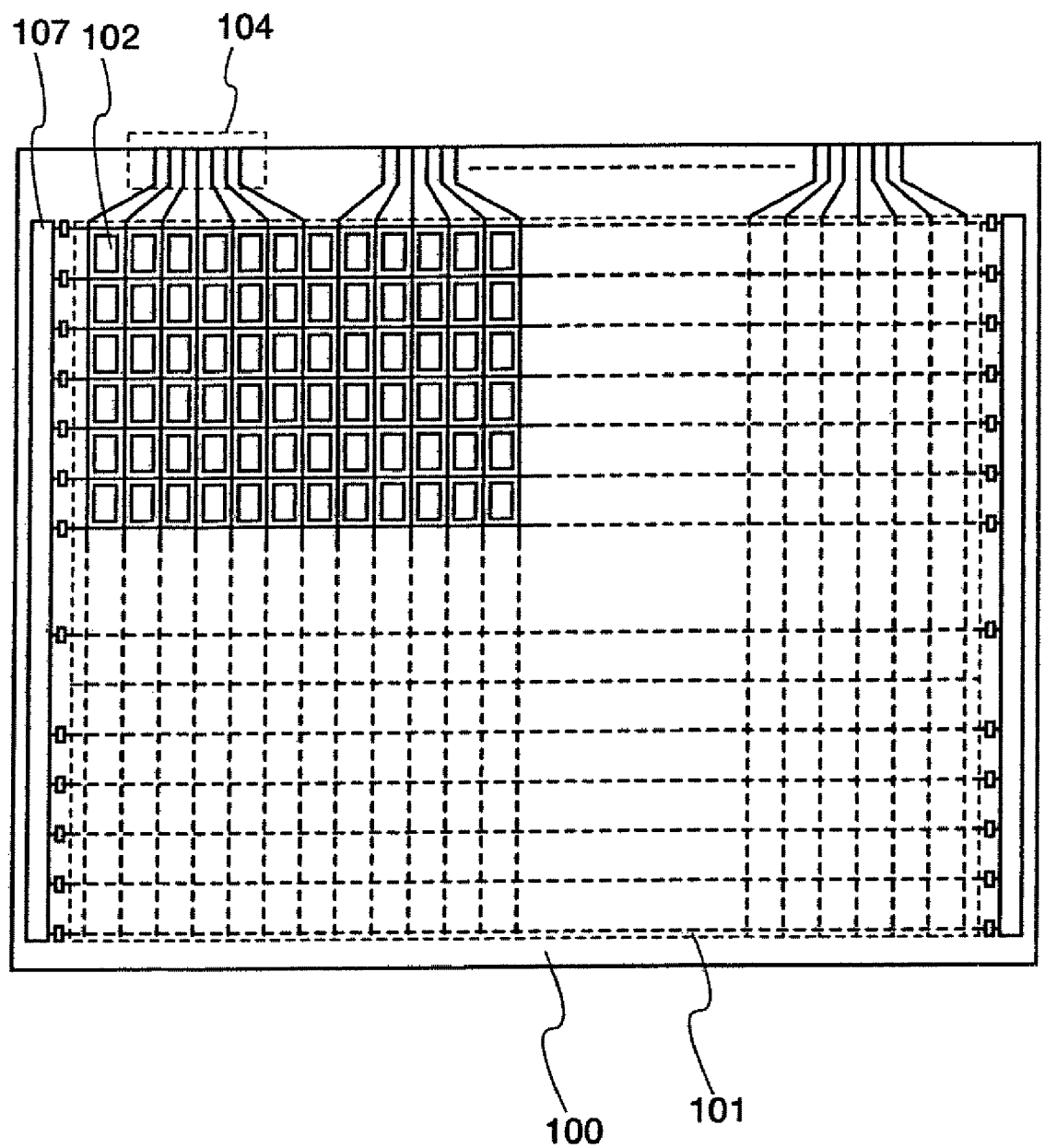
FIG. 3 is a top view for explaining a structure of a display panel of the present invention.

In addition, in the case of forming the TFT provided in the pixel with the use of the SAS, a scanning line driver circuit 107 can be formed integrally over the substrate 100 as shown in FIG. 3.

Figure 27:
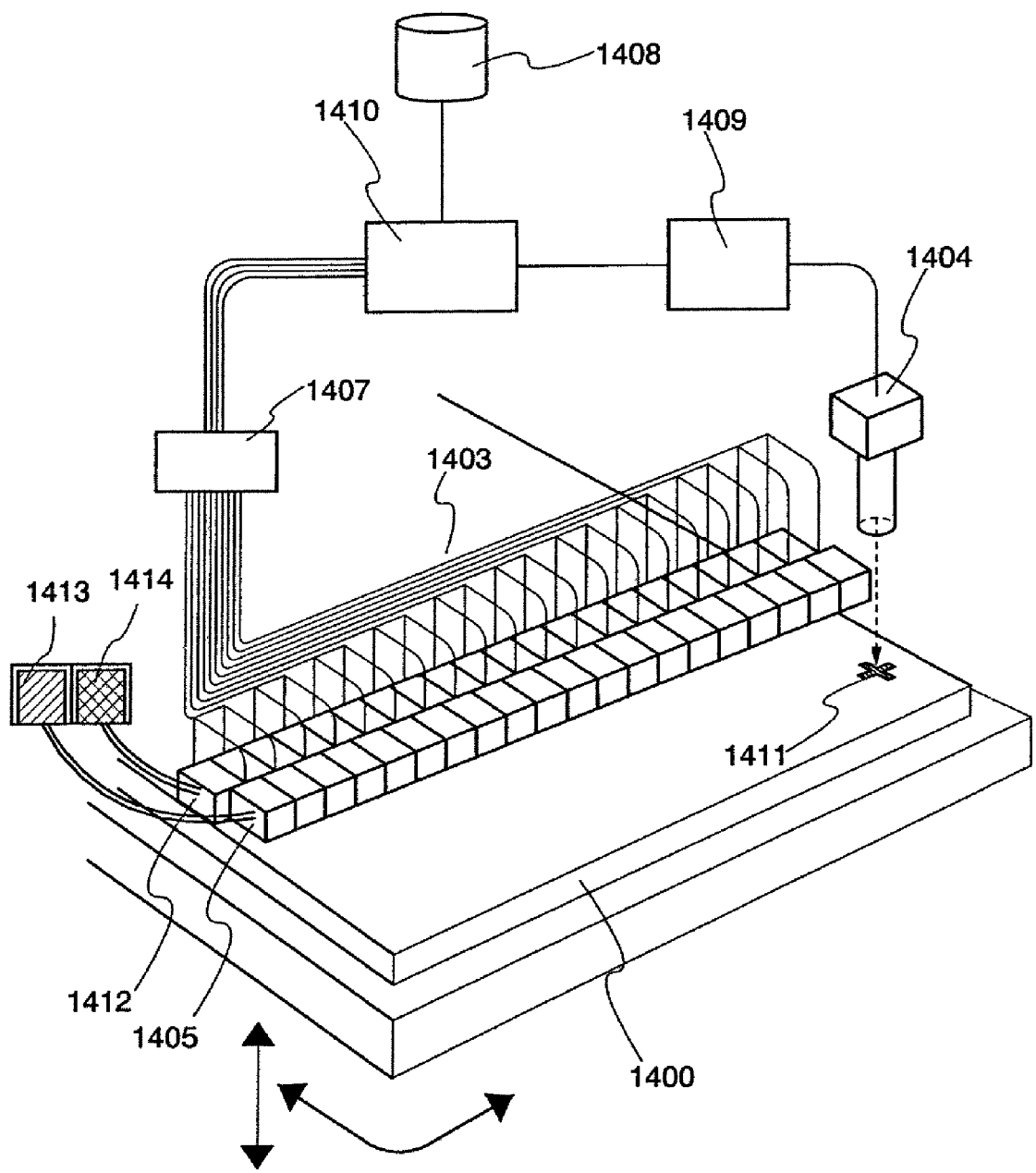
FIG. 27 is a drawing for explaining a structure of a droplet-discharging system applicable in the present invention.

An example of a droplet-discharging apparatus used for patterning is shown in FIG. 27. Heads 1405 and 1412 of droplet-discharging means 1403 are connected to controlling means 1407. The pattern programmed in advance can be written by controlling the controlling means 1407 with the use of a computer 1410. The position for writing may be determined based on a marker 1411, a reference point, formed over a substrate 1400. Alternatively, the reference point may be an edge of the substrate 1400. The reference point is detected by imaging means 1404 such as an image sensor using a charge-coupled device (CCD) or a complementary metal oxide semiconductor (CMOS) and is converted into a digital signal by image processing means 1409. Then, the digital signal is recognized by the computer 1410 to generate a control signal, which is sent to the control means 1407. The data of the pattern to be formed over the substrate 1400 is stored in a recording medium 1408, and the control signal is sent to the control means 1407 based on this data. Thus, the heads 1405 and 1412 of the droplet-discharging means 1403 can be controlled individually. The discharged material is supplied from material suppliers 1413 and 1414 to the heads 1405 and 1412 through pipes. At present, an apparatus is examined in which a metal, an organic material, and an inorganic material can be discharged separately in the same way as RGB colors are separately discharged by one ink-jet head as EL layers. Consequently, in the case of discharging an interlayer insulating layer or the like, the same material may be discharged for multiple times to form narrow lines in order to increase the throughput. In FIG. 27, the total length of the respective heads 1405 and 1412 of the droplet-discharging means 1403 is the same as the width of the substrate. However, even when the substrate has the width that is greater than the total length of the respective heads 1405 and 1412 of the droplet-discharging means 1403, the pattern can be formed by repeating the scanning. In this case, the same pattern can be written over a plurality of parts of the substrate because the heads 1405 and 1412 can be scanned freely in directions indicated by arrows over the substrate so that the region over which the pattern is written can be set freely.

Next, a manufacturing process of a light-emitting device of the present invention is hereinafter explained.

Embodiment Mode 1

A method for manufacturing a bottom-gate channel-protection type TFT is explained as the embodiment mode 1.

Figure 12:
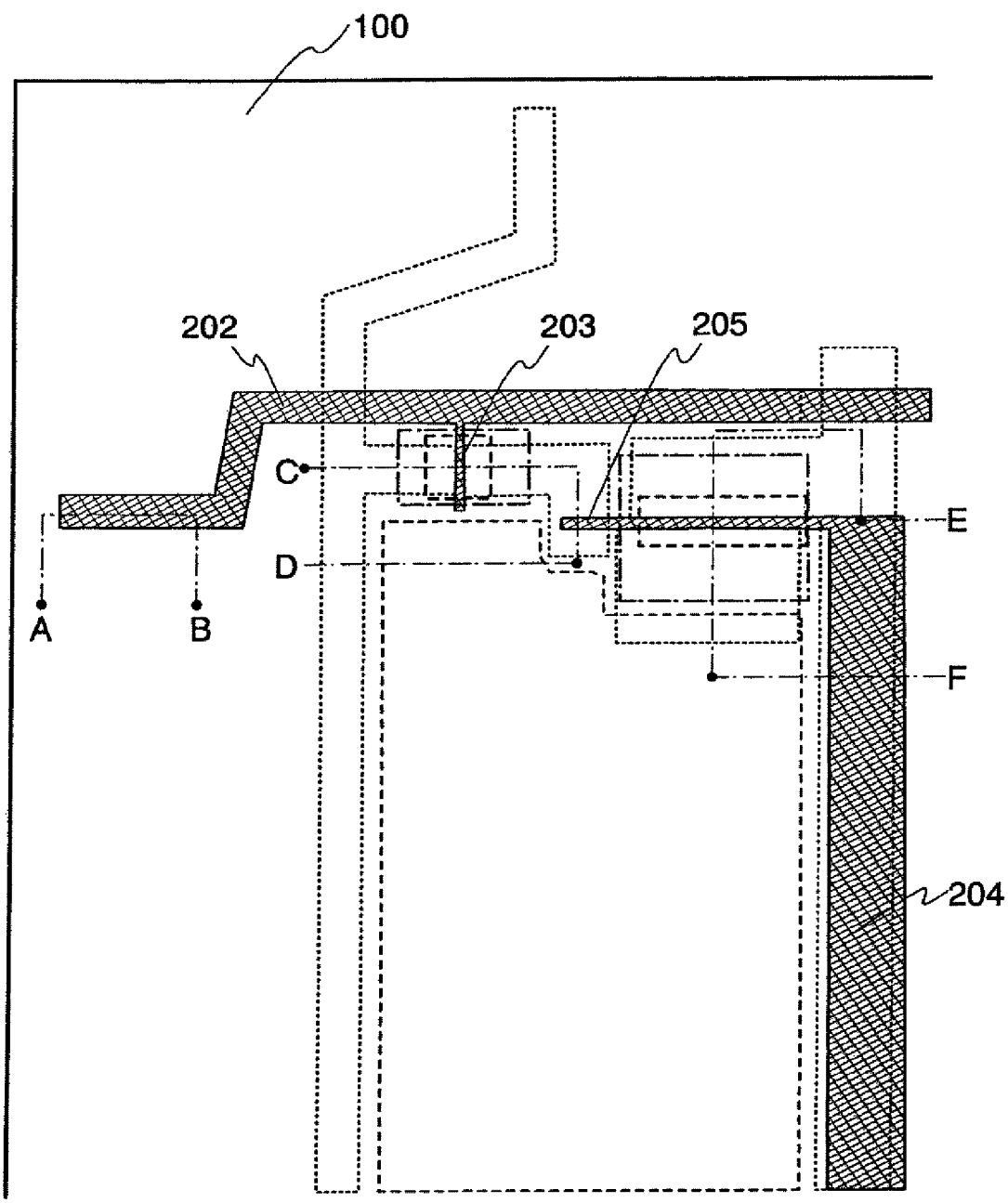
FIG. 12 is a top view for explaining a manufacturing process of an EL display panel of the present invention.

FIG. 4A shows a process for forming a gate electrode layer and a capacitor-wiring layer and a gate wiring layer connected to the gate electrode layer by a droplet-discharging method. It is noted that FIG. 4A shows schematically a vertical cross-sectional structure, and FIG. 12 shows its plain structure corresponding to A-B, C-D and E-F of FIG. 4A. Therefore, both figures may be referred to in this embodiment mode.

A non-alkaline glass substrate such as barium borosilicate glass, alumino borosilicate glass, or aluminosilicate glass manufactured by a fusion method or a floating method; a ceramic substrate; a plastic substrate having the heat resistance that can withstand the temperature in this manufacturing process; or the like can be used as the substrate 100. In addition, a semiconductor substrate such as single crystal silicon or a metal substrate such as a stainless substrate with an insulating layer provided thereover is also applicable. In addition, as the substrate 100, the large-sized substrate having the size of 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm can be used.

It is preferable that a base layer 201 formed of a metal material such as Ti (titanium), W (tungsten), Cr (chromium), Ta (tantalum), Ni (nickel), or Mo (molybdenum); or an oxide thereof over the substrate 100 by a method such as a sputtering method or an evaporation method. Although the base layer 201 may be formed in thickness from 0.1 to 10 μm, a multilayer structure is not always needed since it may be formed extremely thinly. It is noted that this base layer 201 is provided in order to form the gate electrode layer with much adhesiveness. When adequate adhesiveness is obtained, the gate electrode layer may be directly formed over the substrate 100 by a droplet-discharging method without forming the base layer 201. Moreover, atmospheric-pressure plasma treatment may be performed. Furthermore, not only before forming the gate electrode layer but also in the case where a conductive layer is formed over an organic layer, an inorganic layer, a metal layer, and the like by the droplet-discharging method or where the organic layer, the inorganic layer, the metal layer, and the like are formed over the conductive layer formed by the droplet-discharging method, the above process may be performed in the same way in order to improve the adhesiveness with the under layer.

A gate wiring layer 202, a gate electrode layer 203, a capacitor-wiring layer 204, and gate electrode layers 205 are formed on the base layer 201 by discharging a composition including a conductive material by a droplet-discharging method. A particle or a dispersive nanoparticle of a metal such as Ag, Au, Cu, Ni, Pt, Pd, Ir, Rh, W, Al, Ta, Mo, Cd, Zn, Fe, Ti, Si, Ge, Zr, Ba, or silver halide can be used as the conductive material. Moreover, ITO (alloy of indium oxide and tin oxide); ITO including silicon oxide; organic indium; organic tin; zinc oxide (ZnO); titanium nitride (TiN); or the like used for a transparent conductive layer can be used. Since the gate wiring layer 202 is preferably made to have low resistance, it is preferable to use any one of gold, silver, and copper that is dissolved or diffused in a solvent in consideration of the resistance. It is more preferable to use silver or copper, which has lower resistance among them. However, in the case of using silver or copper, a barrier film may be additionally formed so as to prevent the impurity from disparting. As the barrier layer when the copper is used as the wiring, an insulating or conductive material including nitrogen such as silicon nitride, silicon oxynitride, aluminum nitride, titanium nitride, or tantalum nitride may be formed by the droplet-discharging method. A solvent corresponds to esters such as butyl acetate, alcohols such as isopropyl alcohol, an organic solvent such as acetone, or the like. Surface tension and viscosity are appropriately adjusted by adjusting concentration of the solution or by adding a surface-active agent or the like.

The viscosity of the composition to be applied by the droplet-discharging method is preferable from 5 to 20 mPa·s in order to prevent the drying of the composition and to facilitate the discharging of the composition from the nozzle. It is preferable that the surface tension is 40 N/m or less. The viscosity and the like of the composition may be adjusted appropriately in accordance with the solvent and the application. For example, the composition in which ITO, ITO including silicon oxide, organic indium, or organic tin is dissolved or diffused in a solvent has the viscosity from 5 to 20 mPa·s, the composition in which the silver is dissolved or diffused in the solvent has the viscosity from 5 to 20 mPa·s, and the composition in which the gold is dissolved or diffused in the solvent has the viscosity from 10 to 20 mPa·s.

Although the diameter of the particle of the conductor depends on the diameter of the nozzle or the desired pattern shape, the diameter of the particle of the conductor is preferably small in order to prevent the clogging of the nozzle and to manufacture a minute pattern. Specifically, the diameter of the particle of the conductor is preferably approximately 0.1 μm or less. When the composition is formed by a known method such as an electrolytic method, an atomizing method, or a wet reduction method, the size of the particle is generally in the range of approximately 0.5 to 10 μm. On the other hand, when the composition is formed by a gas evaporation method, each nanoparticle protected with a dispersing agent is as small as approximately 7 nm in size. Furthermore, when a surface of each nanoparticle is covered by a coating agent, the nanoparticles in a solvent are not aggregated and are uniformly dispersed in the solvent at a room temperature, and therefore the solvent exhibits the similar behavior to that of liquid. Accordingly, the coating agent is preferably used.

The process for discharging the composition may be performed under the reduced pressure. This is because the following process of drying and baking can be omitted or shortened due to the volatilization of the solvent of the composition after the composition is discharged and before it lands on the processing object. After discharging the droplet, one or both of drying and baking are performed under normal pressure or reduced pressure by irradiation of a laser beam, rapid thermal annealing, a heating furnace, or the like. Although both of the drying and baking are heat treatment process, the purpose, the temperature, and the time are different respectively. Specifically, the drying process is performed for 3 minutes at 100° C., and the baking process is performed for 15 to 120 minutes at 200 to 350° C. In order to perform the drying and the baking processes well, the substrate may be heated in advance at temperatures from 100 to 800° C., preferably from 200 to 350° C. though it depends on the material and the like of the substrate. This process volatilizes the solvent in the droplet or removes the diffusing agent chemically so as to cure and shrink the peripheral resin and to accelerate the fusion and welding. The atmosphere is an oxygenic atmosphere, a nitrogenous atmosphere, or the air. However, it is preferable to employ the oxygenic atmosphere under which the metal element is easily decomposed or the diffused solvent is easily removed.

The laser irradiation may be performed by using a continuous wave or pulsed wave, gas laser or solid-state laser. As the gas laser, an excimer laser and the like are given. As the solid-state laser, a laser using a crystal such as YAG, $YVO_4$, $GdVO_4$ or the like each of which is doped with Cr, Nd, or the like is given. It is noted that the continuous wave laser is preferable in point of the absorption ratio of the laser beam. Moreover, a hybrid laser irradiation method in which the continuous wave laser is used in combination with the pulsed laser may be used. However, when the substrate does not have enough heat-resistance, the heat treatment by the laser irradiation is preferably as short as several microseconds to several tens seconds. A rapid thermal annealing (RTA) method is performed in such a way that an infrared lamp or a halogen lamp for emitting the light in the range of an ultraviolet to infrared region is used under the inert atmosphere to increase the temperature rapidly so that the heat can be added instantaneously for several microseconds to several minutes. Since this treatment can add the heat instantaneously, substantially only a thin film in an upper part is heated without giving any effect on a film in a lower part.

Although the gate wiring layer 202 and the capacitor-wiring layer 204 are formed by the droplet-discharging method in this embodiment mode, it may be formed by a plasma CVD method or a sputtering method.

Next, as shown in FIG. 4B, a photosensitive resin 206, which is a material of a resist mask, is discharged or applied over the gate wiring layer 202, the gate electrode layer 203, the capacitor-wiring layer 204, and the gate electrode layer 205. In the case of applying the photosensitive resin 206, a spin coater, a slit coater, or the like may be used. As the photosensitive resin 206, a negative photosensitive resin or a positive photosensitive resin that is photosensitive to the light in range of an ultraviolet to infrared region is used. The negative photosensitive resin is used in this embodiment mode.

Next, a laser imaging system 207 is used to irradiate the photosensitive resin 206 with a laser beam 208 and to write a pattern while moving the substrate or the laser.

Figure 33:
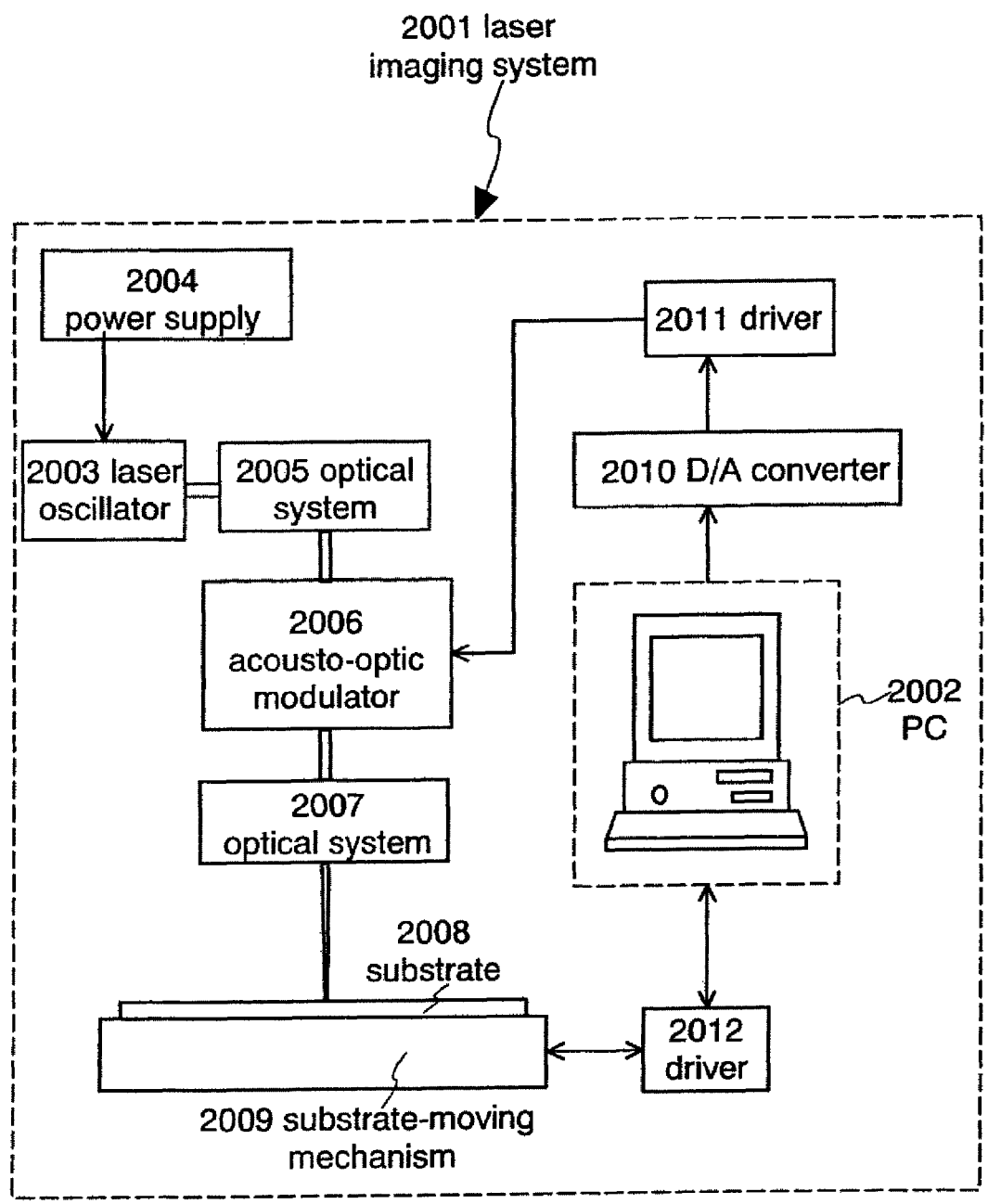
FIG. 33 is a drawing for explaining a structure of a laser direct image system applicable in the present invention.

The laser imaging system is explained with reference to FIG. 33 here. As shown in FIG. 33, a laser imaging system 2001 includes a personal computer (hereinafter referred to as a PC) 2002 for executing various controls when irradiating the laser beam; a laser oscillator 2003 for outputting the laser beam, a power supply 2004 of the laser oscillator 2003; an optical system (ND filter) 2005 for attenuating the laser beam; an acousto-optic modulator (AOM) 2006 for modulating the intensity of the laser beam; an optical system 2007 including a lens for expanding or converging a cross section of the laser beam, a mirror for changing the optical path of the laser beam, and the like; a substrate-moving mechanism 2009 having an X stage and a Y stage; a D/A converter 2010 for digital/analog converting a control data output from the PC; a driver 2011 for controlling the acousto-optic modulator 2006 in accordance with the analog voltage output from the D/A converter; and a driver 2012 for outputting a drive signal for driving the substrate-moving mechanism 2009.

As the laser oscillator 2003, a laser oscillator being able to oscillate ultraviolet, visible, or infrared light can be used. As the laser oscillator 2003, an excimer laser oscillator using a gas selected from the group consisting of KrF, ArF, KrF, XeCl, Xe, and the like; a gas laser oscillator using a gas selected from the group consisting of He, He—Cd, Ar, He—Ne, HF, and the like; a solid-state laser oscillator using a crystal such as YAG, $GdVO_4$, $YVO_4$, YLF, or $YAlO_3$ each of which is doped with Cr, Nd, Er, Ho, Ce, Co, Ti, or Tm; or a semiconductor laser oscillator using GaN, GaAs, GaAlAs, InGaAsP, or the like can be used. When the solid-state laser is used, it is preferable to use the second harmonic to the fifth harmonic of the fundamental wave.

Next, a method for exposing the photosensitive material using the laser imaging system is explained. When the substrate 2008 is loaded to the substrate moving-mechanism 2009, the PC 2002 detects a marker formed over the substrate with the use of a camera, which is not illustrated in the figure. Next, the PC 2002 produces motion data for moving the substrate-moving mechanism 2009 based on the image pattern data input in advance and on positional data of the detected marker. Then, the amount of light emission is controlled to be the predetermined amount in such a way that after the optical system 2005 attenuates the laser beam emitted from the laser oscillator 2003, the PC 2002 controls the acousto-optic modulator 2006 so as to emit the predetermined amount of light. After that, the optical path and the beam shape of the laser beam emitted from the acousto-optic modulator 2006 are changed by the optical system 2007, and then the laser beam is condensed by the lens. Then, the photosensitive material applied over the substrate is exposed by being irradiated with the laser beam. On this occasion, the substrate-moving mechanism 2009 moves in the X direction and the Y direction based on the motion data produced by the PC 2002. As a result, the predetermined region is irradiated with the laser beam, and thus the photosensitive material is exposed.

After being exposed, the photosensitive material is developed. Accordingly, as shown in FIG. 5A, the region irradiated with the laser beam becomes a resist mask 209. Since the negative photosensitive resin is used here, the region irradiated with the laser beam becomes the resist mask. A part of the energy of the laser beam is converted into heat in the resist to react a part of the resist, and therefore the resist mask becomes a little wider than the width of the laser beam. The shorter the wavelength of the laser beam is, the shorter the beam diameter can become when the laser beam is condensed. Therefore, it is preferable to irradiate the laser beam having the short wavelength in order to form the resist mask having fine width.

The beam spot on the surface of the photosensitive resin may be shaped into a dot, circle, ellipse, rectangle, or line (a long rectangle in a strict sense) through the optical system. Although the beam spot may be circular, the linear beam spot is preferable because the linear beam spot can form the resist mask having the uniform width.

Although the case irradiating the surface of the substrate with the laser beam is explained, the laser beam may be irradiated from a rear surface of the substrate by changing the optical system 2007 and the substrate-moving mechanism 2009 and so on as appropriate.

The laser irradiation can be performed selectively by moving not only the substrate but also the laser beam in X-Y directions. In the latter case, it is preferable to use a polygon mirror, a galvanometer mirror, or an acoust-optic deflector (AOD) in the optical system 2007. Moreover, the laser beam may be irradiated to the predetermined position in the substrate by scanning the laser beam in one of X direction and Y direction and moving the substrate in the other one of X direction and Y direction.

Next, the gate electrode layer 203 and the gate electrode layer 205 are etched by a known technique such as wet etching or dry etching with the use of the resist mask 209 (FIG. 5B). Subsequently, the resist mask is removed. Accordingly, as shown in FIG. 5C, the gate electrode layers 203 and 205 having the narrow width can be formed.

Next, it is desirable to perform one of the following two processes as treatment to the base layer 201 exposed to the surface.

One process is that a part of the base layer 201 that is not overlapping the gate wiring layer 202, the gate electrode layers 203 and 205, and the capacitor-wiring layer 204 is insulated to form an insulating layer 210 (refer to FIG. 5C). In other words, the part of the base layer 201 that is not overlapping the gate wiring layer 202, the gate electrode layer 203, the gate electrode layer 205, and the capacitor-wiring layer 204 is oxidized to form an insulator. Thus, in the case of insulating the base layer 201 by means of oxidization, it is preferable that the base layer 201 has a thickness from 0.1 to 10 nm in order to facilitate the oxidization. The oxidization may be performed by a method in which the substrate is exposed in the atmosphere of oxygen or by heat treatment.

The other process is that the base layer 201 is etched away using the gate wiring layer 202, the gate electrode layers 203 and 205, and the capacitor-wiring layer 204 as masks. In the case of using this process, the thickness of the base layer 201 is not limited.

Subsequently, a gate-insulating layer 211 is formed in a single-layer structure or a multilayer structure by the plasma CVD method or the sputtering method (refer to FIG. 6A). It is particularly preferable that the gate-insulating layer 211 is a multilayer including three layers: an insulating layer 212 formed of silicon nitride; an insulating layer 213 formed of silicon oxide; and an insulating layer 214 formed of silicon nitride. It is noted that in order to form an insulating layer of high density with low gate leak current at lower film-forming temperatures the reaction gas may include a noble gas element such as Ar, and the reaction gas may be mixed into the insulating layer to be formed. When the insulating layer 212 in contact with the gate-wiring layer 202, the gate electrode layers 203 and 205, and the capacitor-wiring layer 204 is formed of silicon nitride or silicon nitride oxide, the deterioration due to the oxidization can be prevented. In addition, when the insulating layer 212 in contact with the gate wiring layer 202, the gate electrode layers 203 and 205, and the capacitor-wiring layer 204 is formed of NiB (nickel boron), the surface can be smoothed.

Next, a semiconductor layer 215 is formed. The semiconductor layer 215 is formed of an AS or an SAS manufactured by a vapor growth method or the sputtering method using a semiconductor material gas typified by silane or germane. As the vapor growth method, the plasma-CVD method and the thermal CVD method can be used.

When the plasma CVD method is employed, the AS is formed using a mixed gas of $SiH_4$ and $H_2$ or using a gas of $SiH_4$, which are the semiconductor material gas. When $SiH_4$ is diluted with $H_2$ by from 3 to 1000 times to make a mixed gas or when $Si_2H_6$ is diluted with $GeF_4$ with a dilution rate of $Si_2H_6$: $GeF_4$=20 to 40:0.9, an SAS in which the composition ratio of Si is 80% or more can be obtained. In particular, the latter case is preferable because the semiconductor layer 215 can have crystallinity from the interface between the semiconductor layer 215 and the base layer.

An insulating layer 216 is formed over the semiconductor layer 215 by the plasma CVD method or the sputtering method. As shown in the following step, this insulating layer 216 is left over the semiconductor layer 215 over the gate electrode layers 203 and 205 and serves as a channel-protective layer. Therefore, the insulating layer 216 is preferably formed of a dense film in order to prevent the semiconductor layer 215 from being contaminated with external impurities such as metal or an organic material and to keep an interface between the insulating layer 216 and the semiconductor layer 215 clean. It is preferable to use a silicon nitride film, which is formed by diluting a silicide gas with argon or the like by 100 to 500 times according to a glow-discharging decomposition method, because a dense silicon nitride film can be formed even at a deposition temperature of 100° C. or less. Another insulating film may be formed thereover if necessary.

It is possible to perform the processes continuously from forming the gate-insulating layer 211 up to forming the insulating layer 216 without exposing to the atmosphere. In other words, each interface between laminated layers can be formed without being contaminated by an atmospheric constituent and a contaminated impurity element floating in the atmosphere, and therefore variations of characteristic can be decreased between TFTs.

Next, a mask layer 217 is formed by selectively discharging a composition in a position over the gate electrode layers 203 and 205 over the insulating layer 216 (refer to FIG. 6A). A resin material such as an epoxy resin, an acrylic resin, a phenol resin, a novolac resin, a melamine resin, or an urethane resin is used to form the mask layer 217. In addition, the mask layer 217 may be formed by a droplet-discharging method using an organic material such as benzocyclobutene, parylene, flare, or light-transmitting polyimide; a compound material made by polymerization of siloxane-based polymer or the like; a composition material including water-soluble homopolymer and water-soluble copolymer; or the like. Alternatively, a commercial resist material including a photosensitizer may be used. For example, a novolac resin and naphthoquinonediazide compound that is a photosensitizer, which are typical positive type resists; a base resin, diphenylsilane diol, an acid generation agent, and the like, which are negative type resists may be used. In using any one of materials, the surface tension and the viscosity are appropriately adjusted by adjusting the concentration of a solvent or by adding a surface-active agent or the like.

The insulating layer 216 is etched by using the mask layer 217, and an insulating layer 218 functioning as a channel-protective layer is formed. An n-type semiconductor layer 219 is formed over the semiconductor layer 215 and the insulating layer 218 by removing the mask layer 217. The n-type semiconductor layer 219 may be formed by using a silane gas and a phosphine gas and can be formed of an AS or an SAS.

Figure 13:
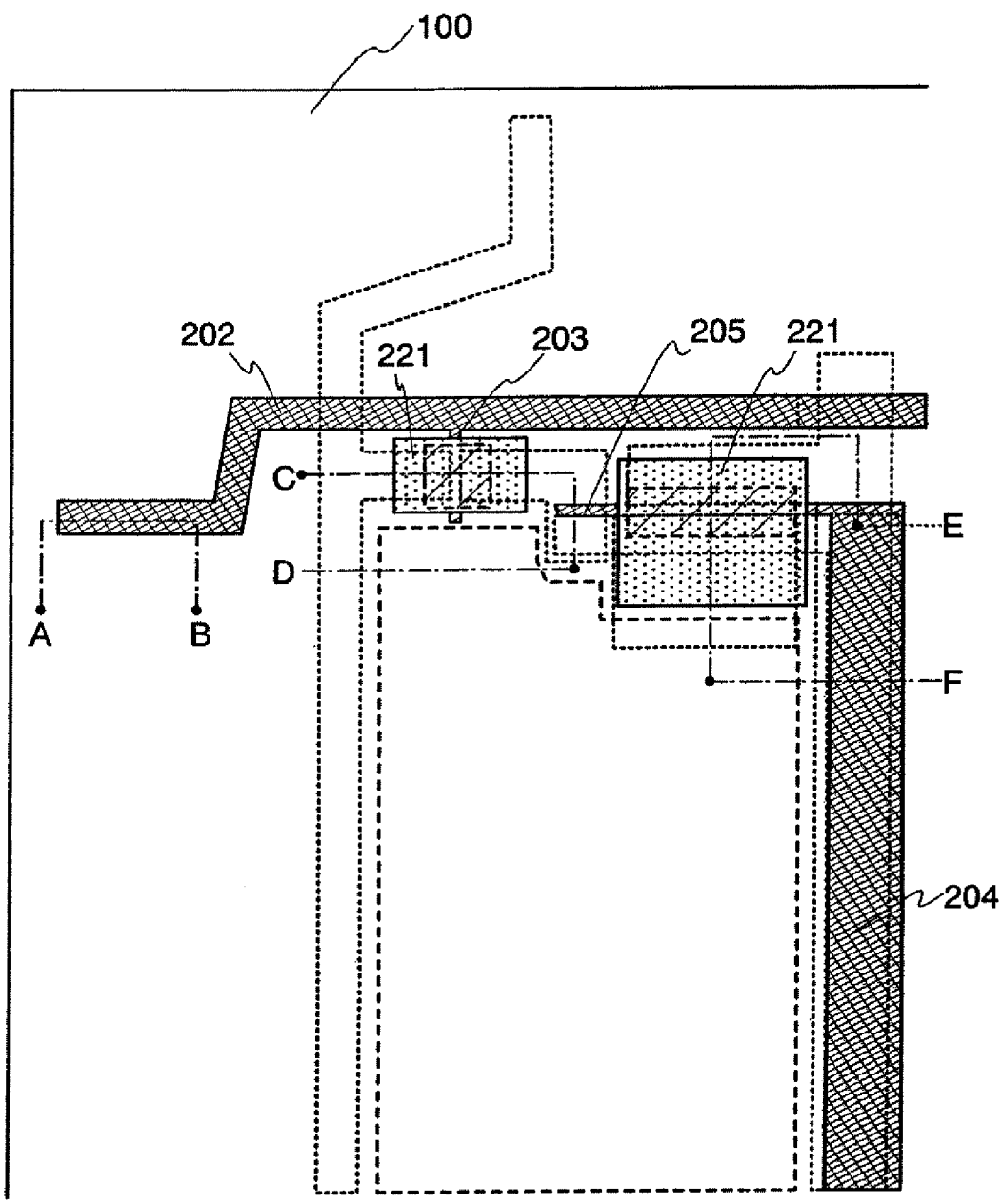
FIG. 13 is a top view for explaining a manufacturing process of an EL display panel of the present invention.

Next, a mask layer 220 is formed by a droplet-discharging method over the n-type semiconductor layer 219 (refer to FIG. 6B). The n-type semiconductor layer 219 and the semiconductor layer 215 are etched using this mask layer 220, and a semiconductor layer 221 and an n-type semiconductor layer 222 are formed (refer to FIG. 6C). In this case, the TFT can be miniaturized by forming the mask layer 220 minutely in such a way that the photosensitive resin is exposed using the laser beam. It is noted that FIG. 6C schematically shows a vertical cross-sectional structure, and FIG. 13 shows a planar structure corresponding to A-B, C-D and E-F of FIG. 6C. Therefore, both figures may be referred to simultaneously in this embodiment mode.

Subsequently, the mask layer 220 is removed.

Next, a through hole 223 is formed in a part of the gate-insulating layer 211 by an etching process, and the gate electrode layer 205 formed below the gate insulating layer 211 is partially exposed (refer to FIG. 7A). The etching process may be performed by using a mask formed by the above-mentioned droplet-discharging method. Plasma etching or wet etching may be applied for the etching process. The plasma etching is appropriate for processing a large-sized substrate. A fluorine-based or a chlorine-based gas such as $CF_4$, $NF_3$, $Cl_2$, or $BCl_3$ is used as an etching gas, and He or Ar may be added to the above gas appropriately. In addition, when an etching process of atmospheric pressure discharge is applied, a local discharge process is also possible, and it is not necessary to form a mask over the whole surface of the substrate.

Next, a solution for forming a droplet-shedding surface is discharged or applied. As an example of the composition of the solution for forming the droplet-shedding surface, a silane-coupling agent expressed with a chemical formula: $R_n$—Si—$X_{(4-n)}$ (n=1, 2, 3) is used. It is noted that R includes a group that is comparatively inactive, for example an alkyl group. Moreover, X includes a hydrolytic group being able to couple by means of shrinking with a hydroxyl group or adsorption water over the surface of the substrate. Such a hydrolytic group is, for example, halogen, a methoxy group, an ethoxy group, an acetoxy group, or the like.

The droplet-shedding property can be enhanced by using fluorite silane coupling agent (fluoroalkylsilane (FAS)) having a fluoroalkyl group as R, which is the typical example of the silane-coupling agent. The fluoroalkyl group R of FAS has a structure of $(CF_3)(CF_2)_x(CH_2)_y$, where x is not less than 0 nor more than 10 and y is not less than 0 nor more than 4. When a plurality of Rs or Xs are coupled with Si, all of Rs or Xs may be the same or may be different. As typical FAS, there are fluoroalkylsilane (hereinafter referred to as FAS) such as heptadefluorotetrahydrodecyltriethoxysilane, heptadecafluorotetrahydrodecyltrichlorosilane, tridecafluorotetrahydrooctyltrichlorosilane, and trifluoropropyltrimethoxysilane.

As the solvent of the solution for forming the droplet-shedding surface, there are a hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, and squalene; and tetrahydrofuran.

In addition, as an example of the composition of the solution for forming the droplet-shedding surface, a material having fluorine-carbon chain (fluorinated resin) can be used. As the fluorinated resin, there are polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene 6-fluorinated propylene copolymer resin), ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethylene-perfluorodioxole copolymer (TFE/PDD), polyvinyl fluoride (PVF; fluorinated vinyl resin), or the like can be used.

Subsequently, when the surface with the solution for forming the droplet-shedding surface applied thereon is washed using ethanol, a layer forming a droplet-shedding surface 224 that is extremely thin can be formed (refer to FIG. 7B).

Next, a laser of ultraviolet ray is irradiated from the side of the rear surface of the substrate for the purpose of an exposure. On this occasion, since the gate wiring layer 202, the gate electrode layer 203, the capacitor-wiring layer 204, and the gate electrode layer 205 block the laser beam, the layer forming the droplet-shedding surface 224 provided over them is not exposed. As a result, the layer forming the droplet-shedding surface 224 remains over the gate wiring layer 202, the gate electrode layer 203, the capacitor-wiring layer 204, and the gate electrode layer 205, and the other regions become a droplet-attracting surface. Then, a laser of ultraviolet ray is selectively irradiated from the side of the front surface of the substrate to the regions above the capacitor-wiring layer 204, and one of the gate electrode layer 205. The layer forming the droplet-shedding surface 224 remains only necessary parts. (refer to FIG. 7C).

In this Embodiment Mode, a method of forming the layer forming a droplet-shedding surface 224 entirely and then irradiating the laser selectively is explained, however, a method of forming the layer forming a droplet-shedding surface selectively by using one of resist mask and ink-jet method or a method of forming the layer forming a droplet-shedding surface selectively and irradiating the laser selectively may be used.

Subsequently, source and drain wiring layers 225 to 229 are formed by a droplet-discharging method by selectively discharging a composition including a conductive material (refer to FIG. 8A). On this occasion, since the n-type semiconductor layer 219 over the gate electrode layers 203 and 205 has the droplet-shedding surface, a space 230 between the source wiring and the drain wiring can be controlled in a self-aligning manner.

The extremely thin film 260 having the droplet-shedding property may be removed or may not be removed. In this embodiment mode, the extremely thin film 260 having the droplet-shedding property is removed when etching the n-type semiconductor layer 219 in the above step.

Figure 14:
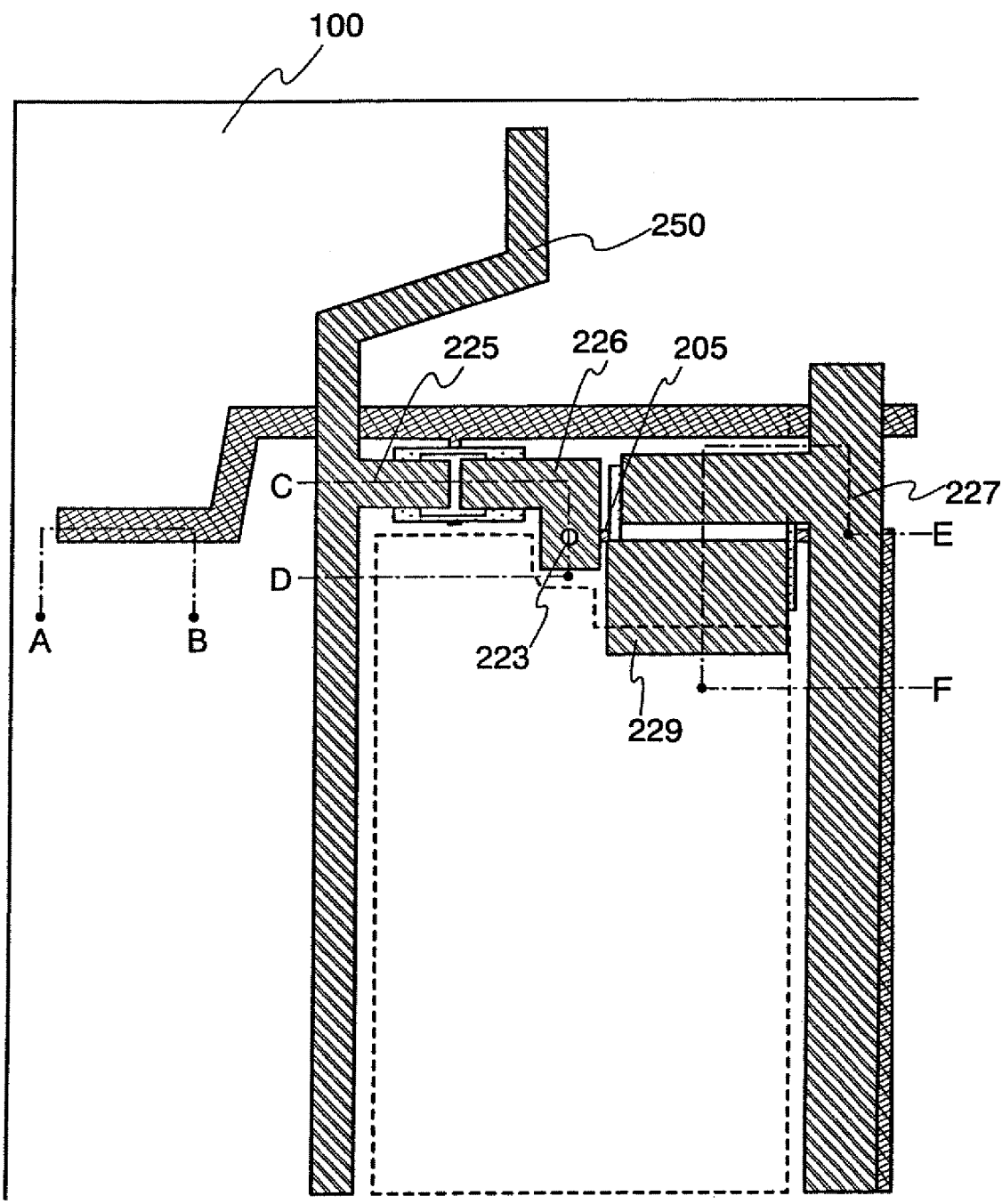
FIG. 14 is a top view for explaining a manufacturing process of an EL display panel of the present invention.
Figure 15:
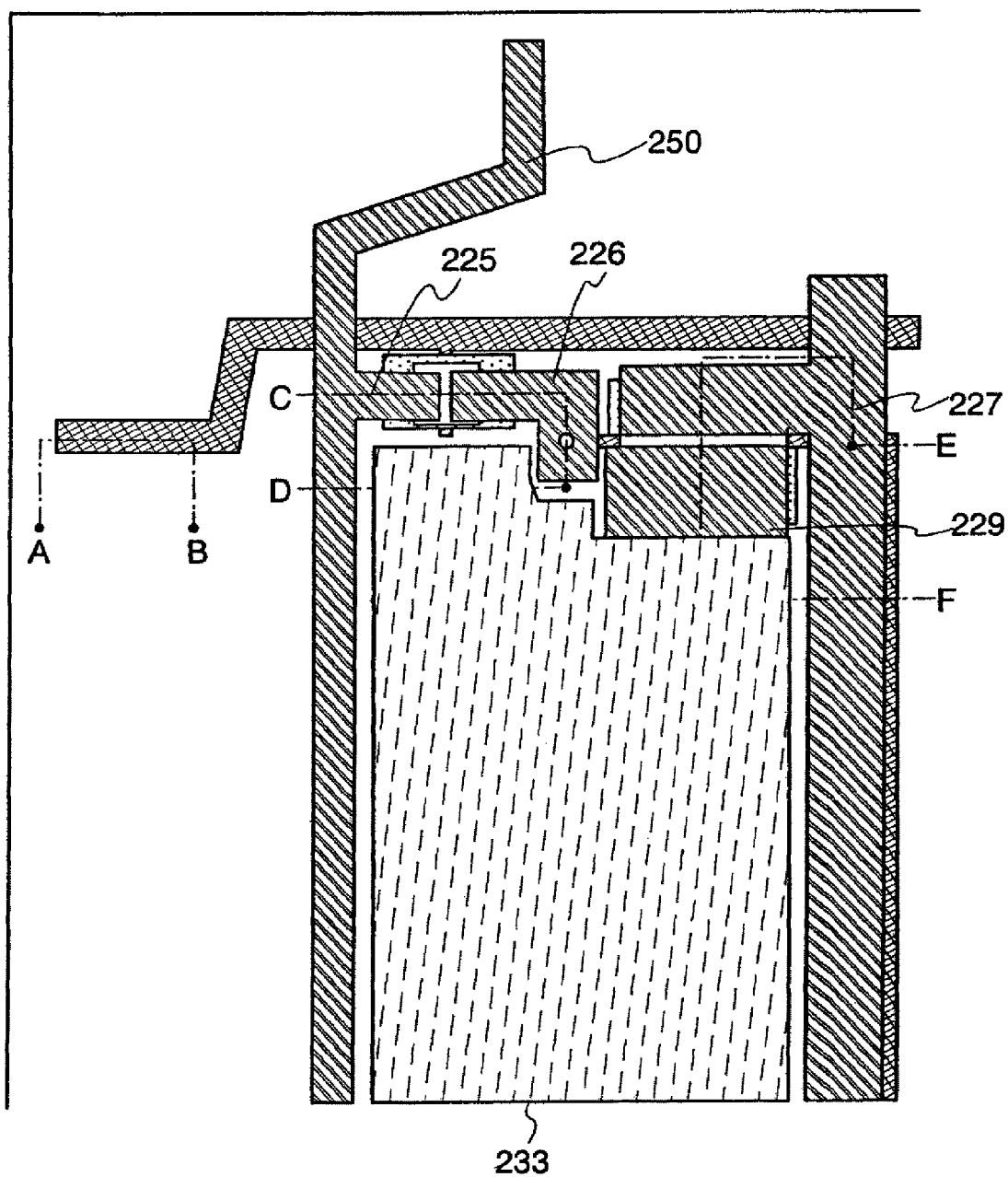
FIG. 15 is a top view for explaining a manufacturing process of an EL display panel of the present invention.

FIGS. 8A to 8C show schematically a vertical cross-sectional structure taken along A-B, C-D, and E-F in the plain structure of FIGS. 14 and 15. As shown in FIG. 14, a signal-wiring layer 250 extending from an end of the substrate 100 is formed simultaneously with a source-wiring layer 225 and a drain-wiring layer 226 in such a way that the source and drain wiring layers connect electrically with the signal-wiring layer 250. Moreover, the source and drain wiring layer 226 and the gate electrode layer 205 are electrically connected in the through hole 223 formed in the gate-insulating layer 211. A composition mainly including a particle of metal such as Ag (silver), Au (gold), Cu (copper), W (tungsten), or Al (aluminum) can be used as a conductive material for forming these wiring layers. Furthermore, light-transmitting indium tin oxide (ITO), organic indium including indium tin oxide and silicon oxide, organic tin, zinc oxide, titanium nitride, and the like may be combined.

Next, n-type semiconductor layers 231 and 232 for forming source and drain regions are formed by etching the n-type semiconductor layer 219 over the insulating layer 218 using the source and drain wirings 225 to 229 as the mask (refer to FIG. 8B).

A first electrode 233 corresponding to a pixel electrode is formed by selectively discharging a composition including a conductive material so that it is electrically connected to the source and drain wiring layer 229 (refer to FIG. 8C). It is noted that FIG. 8C schematically shows a vertical cross-sectional structure taken along A-B, C-D, and E-F in a plain structure of FIG. 15, and therefore both of FIGS. 8C and 15 can be referred to at the same time. Through the above-mentioned steps, a switching TFT 234, a driver TFT 235, and a capacitor portion 236 are formed.

In the case of manufacturing a bottom-emission type EL display panel by the droplet-discharging method, the first electrode 233 corresponding to the pixel electrode may be formed in such a way that a predetermined pattern is formed by the composition including indium tin oxide (ITO), indium tin oxide including silicon oxide (ITSO), zinc oxide, tin oxide ($SnO_2$), or the like and an annealing is performed thereafter.

Preferably, the first electrode 233 is formed of indium tin oxide (ITO), indium tin oxide including silicon oxide (ITSO), zinc oxide (ZnO), or the like by a sputtering method. More preferably, indium tin oxide including silicon oxide is formed by a sputtering method using a target in which silicon oxide is mixed in ITO by 2 to 10 wt %. Moreover, a conductive oxide material including silicon oxide in which zinc oxide (ZnO) is mixed in indium oxide by 2 to 20 wt % may be used. After forming the first electrode 233 by the sputtering method, a mask layer may be formed by the droplet-discharging method, and then the first electrode 233 connecting with the source and drain wiring layer 229 may be formed by etching with the use of the mask layer. As the preferred embodiment mode of the present invention, the first electrode 233 formed of indium tin oxide including silicon oxide is formed in close contact with the insulating layer 214 formed of silicon nitride included in the gate-insulating layer 211. According to this structure, it is possible to obtain an advantageous effect that the proportion of the light emitting to the outside to the light generated in the EL layer can be increased.

In the case of the structure in which the light is emitted to the side opposite to the substrate 100, which means a top-emission type EL display panel, the composition mainly including a particle of metal such as Ag (silver), Au (gold), Cu (copper), W (tungsten), or Al (aluminum) can be used as a material for the first electrode 233. As another method, the first electrode layer may be formed in such a way that a transparent or light-reflecting conductive film is formed by the sputtering method, a mask pattern is formed thereover by the droplet-discharging method, and then an etching process is performed thereto using the mask pattern.

Moreover, a protective layer 247 formed of silicon nitride or silicon nitride oxide and an insulating layer 248 are formed all over the substrate. After forming the insulating layer 248 all over the substrate by a spin coating method or a dip method, an opening is formed therein by an etching process. The first electrode 233 and the gate-wiring layer 202 are exposed by etching the protective layer 247 and the gate-insulating layer 211 under the insulating layer 248 at the same time in this process. This etching process is not always necessary when the insulating layer 248 is formed by the droplet-discharging method. When the region to become the opening has the droplet-shedding surface, the opening can be formed in a self-aligning manner.

The insulating layer 248 is formed in such a way that an opening is formed in accordance with a position over the first electrode 233. This insulating layer 248 can be formed of an inorganic insulating material such as silicon oxide, silicon nitride, silicon oxide including nitrogen, aluminum oxide, aluminum nitride, or aluminum oxide including nitrogen; acrylic acid, methacrylic acid, or a derivative thereof; a high-molecular material having heat resistance such as polyimide, aromatic polyamide, or polybenzimidazole; inorganic siloxane including a Si—O—Si bond or an organic siloxane insulating material in which hydrogen over the silicon is substituted by an organic group such as methyl or phenyl among the compound made of silicon, oxygen, and hydrogen formed by using a siloxane-based material as a start material. It is preferable that the insulating layer 248 is formed of a photosensitive material or a non-photosensitive material such as acrylic or polyimide because the opening having the cross-sectional shape whose radius of curvature continuously changes is formed so that a thin film in the upper layer is formed without the breakage due to the step.

Through the above-mentioned steps, a TFT substrate 200 for an EL display panel where a bottom gate type (also referred to as a reversely staggered type) TFT and the first electrode are connected over the substrate 100 is completed.

Before forming the EL layer 237, heat treatment at 200° C. under the atmospheric pressure is performed to remove the moisture adsorbed in the insulating layer 248 or on the surface thereof. In addition, heat treatment is performed at temperatures from 200 to 400° C., preferably from 250 to 350° C. under the reduced pressure. It is preferable to form the EL layer 237 by a vacuum evaporation method or a droplet-discharging method under the reduced pressure without exposing to the atmosphere.

In addition, surface treatment may be additionally performed by exposing the surface of the first electrode 233 to oxygen plasma or by irradiating the surface thereof with ultraviolet light. A second electrode 238 is formed over the EL layer 237 to form a light-emitting element 239. This light-emitting element 239 is connected to the driver TFT 235.

Figure 9:
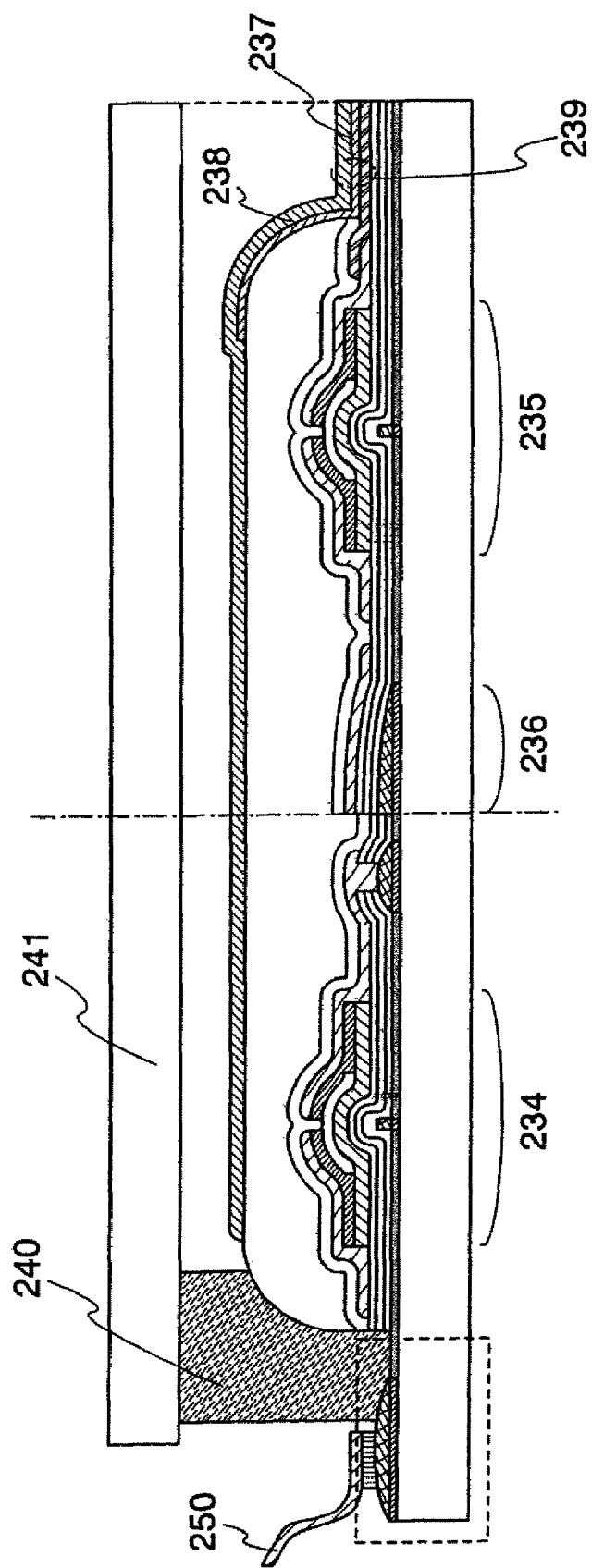
FIG. 9 is a cross-sectional view for explaining a manufacturing process of an EL display panel of the present invention.

Subsequently, a sealing material 240 is formed for sealing with the use of the sealing substrate 241. After that, a flexible wiring substrate 250 may be connected to the gate-wiring layer 202. This is the same thing to a signal-wiring layer (refer to FIG. 9).

According to the above processes, a light-emitting device having a bottom-gate channel-protective type TFT can be manufactured.

Embodiment Mode 2

A method for manufacturing a bottom-gate channel-etching type TFT is explained with reference to FIGS. 10A to 10C as the embodiment mode 2.

A composition including a conductive material is discharged over a substrate 100 to form a gate-wiring layer 202, a gate electrode layer 203, a capacitor-wiring layer 204, and a gate electrode layer 205. Next, a photosensitive resin is discharged or applied thereto, and then the photosensitive resin is irradiated with a laser beam to form a resist mask. The gate electrode layer 203 and the gate electrode layer 205 are processed minutely by means of etching with the use of the resist mask. Then, the resist mask is removed. Next, the gate-insulating layer 211 is formed in a single-layer structure or a multilayer structure by the plasma CVD method or the sputtering method. It is particularly preferable that the gate-insulating layer 211 is a multilayer including three layers: an insulating layer formed of silicon nitride; an insulating layer formed of silicon oxide; and an insulating layer formed of silicon nitride. Moreover, a semiconductor layer 215 serving as an active layer is formed. The above process is the same as that in the embodiment mode 1.

An n-type semiconductor layer 219 is formed over the semiconductor layer 215 (refer to FIG. 10A). Next, a mask layer 302 is formed by discharging the composition selectively over the n-type semiconductor layer 219. Subsequently, the semiconductor layer 215 and the n-type semiconductor layer 219 are etched at the same time using the mask layer 302 to transform them into an island-shape. In this case, the TFT can be miniaturized by forming the mask layer 302 minutely in such a way that the photosensitive resin is exposed using the laser beam.

Next, the mask layer 302 is removed.

Subsequently, after discharging or applying the solution for forming the droplet-shedding surface, it is washed using ethanol. Then, in order to use the gate electrode layer 203 and the gate electrode layer 205 as the masks, an exposure is made from the rear surface of the substrate to form the droplet-shedding surface of the n-type semiconductor layer 219 partly.

Next, the composition including the conductive material is discharged selectively to form source and drain wiring layers 225, 226, 228, and 229 by the droplet-discharging method (refer to FIG. 10B). On this occasion, since there is a minute droplet-shedding surface of the n-type semiconductor layer 219 electrodes 203 and 205, a space 230 between the source and drain wirings can be controlled minutely in a self-aligning manner. Next, the n-type semiconductor layer 219 is etched by using the source and drain wiring layers 225, 226, 228, and 229 as the mask to form n-type semiconductor layers 231 and 232. Since it is comparatively difficult to etch the n-type semiconductor layer 219 and the semiconductor layer 215 selectively, a part 303 of the semiconductor layer 303 for forming the channel is also etched in the same process. Moreover, before this etching process, another etching process may be performed in the same way as that in the embodiment mode 1 to form a through hole 223 in a part of the gate-insulating layer 211 and to expose a part of the gate electrode layer 205 positioned below the through hole 223. By doing this process, the source and drain wiring layer 226 and the gate electrode layer 205 can be connected (refer to FIG. 10C).

Next, a first electrode 233 is formed in such a way that the composition including the conductive material is discharged so that the first electrode 233 connects with the source and drain wiring layer 229 electrically (refer to FIG. 10C). After that, as well as in the embodiment mode 1, a protective layer 247, an insulating layer 248, an EL layer 237, and a second electrode 238 are formed. Then, a sealing material 240 is formed thereto and a sealing substrate 241 is used for sealing. Subsequently, a flexible wiring substrate 251 may be connected to the gate-wiring layer 202.

According to the above process, the light-emitting device having the bottom-gate channel-etching type TFT can be manufactured.

It is noted that the difference between the droplet-shedding property and the droplet-attracting property can be expressed with the difference of the wettability, which is the relative relation between the droplet-shedding region and the droplet-attracting region. The region where a semiconductor element is formed and the region in its vicinity where the semiconductor element is not formed may have the difference in the degree of wettability to the composition including the conductive material. The region where the wettability is different means the region where the contact angle between the surface of the region and the composition including the conductive material is different. The region having the large contact angle to the composition including the conductive material has low wettability while the region having the small contact angle to the composition including the conductive material has high wettability. When the contact angle is large, the fluid composition in a liquid form does not spread on the surface of the region and is shed from the surface, and therefore, the composition does not wet the surface. On the other hand, when the contact angle is small, the fluid composition spreads on the surface and wets the surface well. Therefore, the regions having the different wettability have different surface energy. The region having low wettability has low surface energy while the region having high wettability has high surface energy. In the present invention, the difference of the contact angle between the regions having the different wettability may be 30° or more, preferably 40° or more.

Embodiment Mode 3

A method for manufacturing a bottom-gate channel-protective TFT is explained as the embodiment mode 3.

Figure 56:
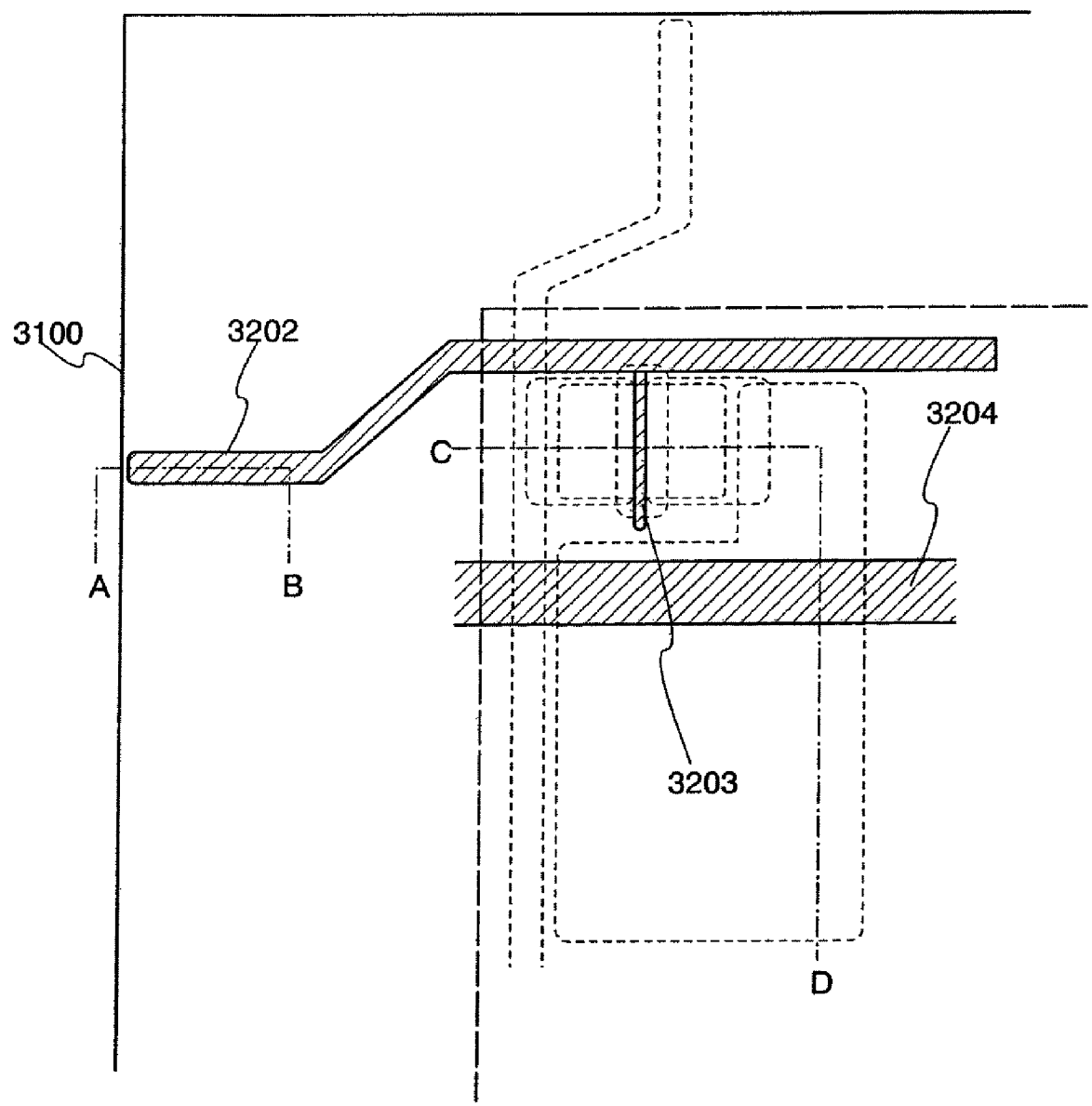
FIG. 56 is a top view for explaining a manufacturing process of a liquid crystal display panel of the present invention.
Figure 57:
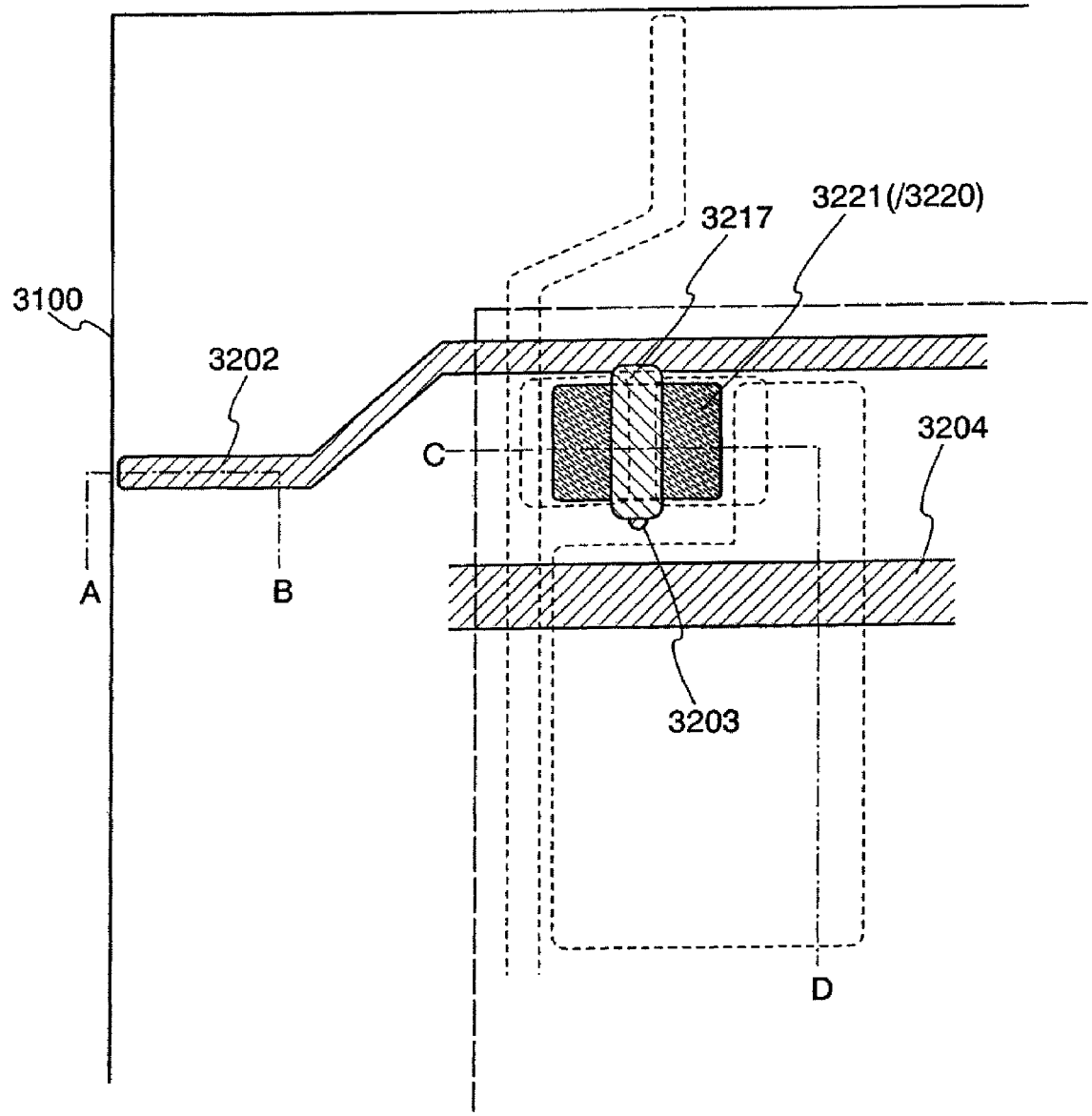
FIG. 57 is a top view for explaining a manufacturing process of a liquid crystal display panel of the present invention.

FIG. 47A shows a process for forming a gate electrode layer and a gate-wiring layer connected to the gate electrode layer over a substrate 3100. It is noted that FIG. 47A shows schematically a cross-sectional structure and FIG. 56 shows its plain structure corresponding to lines A-B and C-D in FIG. 47A. Therefore, both figures may be referred to at the same time.

A glass substrate made of a non-alkali glass manufactured by a fusion method or a float method, for example, a barium borosilicate glass, an alumino borosilicate glass, or an aluminosilicate glass; a ceramic substrate; a plastic substrate that can resist the heat in the manufacturing process; or the like can be used as the substrate 3100. In addition, a semiconductor substrate such as single-crystal silicon or a metal substrate such as a stainless substrate with an insulating layer formed over its surface may be applied. The substrate 3100 may have a large size, for example 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm.

A base layer 3201 formed of a metal selected from the group consisting of Ti (titanium), W (tungsten), Cr (chromium), Ta (tantalum), Ni (nickel), and Mo (molybdenum) or formed of the oxide thereof is preferably formed over the substrate 3100 by a method such as the sputtering method or the evaporation method. The base layer 3201 may be formed in thickness from 0.1 to 10 nm. Since the base layer is formed very thinly, the base layer does not always need to have a multilayer structure. The base layer 3201 is provided in order to form the gate electrode layer with sufficient adhesiveness. Therefore, a gate electrode layer may be formed over the substrate 3100 by the droplet-discharging method without forming the base layer 3200 when the sufficient adhesiveness can be obtained. Instead of the droplet-discharging method, an atmospheric plasma process may be performed. Moreover, in the case of forming the conductive layer by the droplet-discharging method over the organic layer, the inorganic layer, and the metal layer or in the case of forming the organic layer, the inorganic layer, the metal layer over the conductive layer formed by the droplet-discharging method, the same process may be performed in order to increase the adhesiveness with the under layer.

The gate wiring layer 3202, the gate electrode layer 3203, and the capacitor-wiring layer 3204 are formed over the base layer 3201 by discharging the composition including the conductive material according to the droplet-discharging method. As the conductive material for forming these layers, a metal selected from the group consisting of Ag, Au, Cu, Ni, Pt, Pd, Ir, Rh, W, Al, Ta, Mo, Cd, Zn, Fe, Ti, Si, Ge, Zr, Ba, and the like; an alloy made of the above elements; a microparticle of silver halide; or a dispersive nanoparticle can be used. Moreover, ITO (alloy of indium oxide and tin oxide) used as a transparent conductive film, ITO including silicon oxide, organic indium, organic tin, zinc oxide (ZnO), titanium nitride (TiN), or the like can be also used. Particularly, since the gate electrode layer preferably has low resistance, it is preferable to use a solution in which any one of gold, silver, and copper is dissolved or diffused in consideration of the resistivity, and it is more preferable to use silver or copper having lower resistance. However, as a measure against the impurity, a barrier layer may be formed in combination. In the case of using the copper as the wiring, the barrier layer may be formed of an insulating or conductive material including nitrogen such as silicon nitride, silicon oxynitride, aluminum nitride, titanium nitride, or tantalum nitride by the droplet-discharging method. The solvent may be an organic solvent: esters such as butyl acetate; alcohols such as isopropyl alcohol; or acetone. The surface tension and the viscosity are adjusted as appropriate by adjusting the concentration of the solvent or by adding an surface-active agent or the like.

The viscosity of the composition applied by the droplet-discharging method is preferably 5 mPa·s and more and 20 mPa or less in order to prevent the composition from drying and to discharge the composition smoothly from the nozzle. The surface tension is preferably 40 N/m or less. The viscosity of the composition may be adjusted appropriately in accordance with the solvent to be used or the intended purpose. As an example, the viscosity of the composition in which ITO, ITO including silicon oxide, organic indium, or organic tin is dissolved or diffused in the solvent is in the range of 5 to 20 mPa·s, and the viscosity of the composition in which gold is dissolved or diffused in the solvent is in the range of 10 to 20 mPa·s.

Although the diameter of the particle of the conductor depends on the diameter of the nozzle or the desired pattern shape, the diameter of the particle of the conductor is preferably small in order to prevent the clogging of the nozzle and to manufacture a miniature pattern. Specifically, the diameter of the particle of the conductor is preferably approximately 0.1 μm or less. The composition is formed by a known method such as an electrolytic method, an atomize method, or a wet reducing method. The size of the particle is generally in the range of approximately 0.5 to 10 μm. However, when the composition is made by a gas evaporation method, each nanoparticle protected with a dispersing agent is as minute as approximately 7 nm in size. Furthermore, when a surface of each nanoparticle is covered by a coating agent, the nanoparticles in a solvent are not aggregated to each other and are uniformly dispersed in the solvent at a room temperature, thereby exhibiting behavior similar to that of aqueous fluid. As a result, the coating agent is preferably used.

The process for discharging the composition may be performed under the reduced pressure. This is because the following process of drying and baking can be omitted or shortened due to the volatilization of the solvent of the composition after the composition is discharged and before it lands on the processing object. After discharging the solvent, one or both of drying and baking are performed under normal pressure or reduced pressure by the irradiation of a laser beam, rapid thermal annealing, a heating furnace, or the like. Although both of the drying and baking require heat treatment, the purpose, the temperature, and the time are different respectively. Specifically, the drying process is performed for 3 minutes at 100° C., and the baking process is performed for 15 to 120 minutes at 200 to 350° C. In order to perform the drying and baking processes well, the substrate may be heated in advance at temperatures from 100 to 800° C., preferably from 200 to 350° C., though it depends on the material and the like of the substrate. This process volatilizes the solvent in the solution or removes the diffusing agent chemically so as to cure and shrink the peripheral resin and to accelerate the fusion and welding. The atmosphere may be an oxygenic atmosphere, a nitrogenous atmosphere, or the air. However, it is preferable to employ the oxygenic atmosphere under which the metal element is easily decomposed or the diffused solvent is easily removed.

The laser irradiation may be performed using a continuous wave or pulsed gas laser or using a continuous wave or pulsed solid-state laser. As the gas laser, an excimer laser and the like are given. As the solid-state laser, a laser using a crystal such as YAG, $YVO_4$, $GdVO_4$, or the like each of which is doped with Cr, Nd, or the like is given. It is noted that the continuous wave laser is preferable in point of the absorption ratio of the laser beam. Moreover, a hybrid laser irradiation method in which the continuous wave laser is used in combination with the pulsed laser may be used. However, in consideration of the heat resistance of the substrate, the heat treatment by the laser irradiation is preferably as short as several microseconds to several tens seconds. Rapid thermal annealing (RTA) is performed in such a way that an infrared lamp or a halogen lamp for emitting the light in the range of an ultraviolet to infrared region is used under the inert atmosphere to increase the temperature rapidly so that the heat can be added instantaneously for several microseconds to several minutes. Since this treatment can add the heat instantaneously, substantially only a thin film in an upper part is heated without giving any effect on a film in a lower part.

Although the gate wiring layer and the capacitor-wiring layer are formed by the droplet-discharging method in this embodiment mode, it may be formed by a plasma CVD method or a sputtering method.

Next, as shown in FIG. 47B, a photosensitive resin 3205 is discharged or applied over the gate wiring layer 3202, the gate electrode layer 3203, and the capacitor-wiring layer 3204. In the case of applying the photosensitive resin 3205, a spin coater, a slit coater, or the like may be used. The photosensitive resin may be a negative photosensitive resin or a positive photosensitive resin, both of which are the material sensitive to the light in the range of an ultraviolet to infrared region.

Next, the photosensitive resin 3205 is irradiated with a laser beam 3207 using a laser imaging system 3206 by which a pattern is written while moving the substrate or the laser beam (FIG. 47C).

As a result, a predetermined position is irradiated with the laser beam. Thus, the photosensitive material is exposed and developed, and a resist mask 3208 is formed in the region irradiated with the laser beam that is indicated in FIG. 48A. Here, since the negative photosensitive resin is used, the region irradiated with the laser beam becomes the resist mask. Since a part of the energy of the laser beam is changed into heat in the resist to react a part of the resist, the width of the resist mask becomes a little larger than the width of the laser beam. Moreover, the shorter the wavelength of the laser beam is, the shorter the beam diameter can become when the laser beam is condensed. Therefore, it is preferable to irradiate the laser beam having the short wavelength in order to form the resist mask having fine width.

The beam spot on the surface of the photosensitive resin 3205 is shaped into a dot, circle, ellipse, rectangle, or line (a long rectangle in a strict sense) through the optical system. Although the beam spot may be circular, the linear beam spot is preferable because it can form the resist mask having the uniform width.

Next, the gate electrode layer 3203 is etched by a known method such as a dry etching method or a wet etching method using the resist mask 3208 (FIG. 48B). As a result, the gate electrode layer 3203 having a narrow width can be formed as shown in FIG. 48C.

Next, it is desirable to perform one of the following two processes as treatment to the base layer 3201 exposed to the surface.

One process is that the base layer 3201 not overlapping the gate wiring layer 3202, the gate electrode layer 3203, and the capacitor-wiring layer 3204 is insulated to form an insulating layer 3209 (refer to FIG. 48C). In other words, the base layer 3201 not overlapping the gate wiring layer 3202, the gate electrode layer 3203, and the capacitor-wiring layer 3204 is oxidized so as to be insulated. Thus, in the case of insulating the base layer 3201 by means of oxidization, it is preferable that the base layer 3201 has a thickness from 0.1 to 10 nm in order to facilitate the oxidization. The oxidization may be performed by a method in which the substrate is exposed in the atmosphere of oxygen or by heat treatment.

The other process is that the base layer 3201 is etched away using the gate wiring layer 3202, the gate electrode layer 3203, and the capacitor-wiring layer 3204 as a mask. In the case of using this process, the thickness of the base layer 3201 is not limited.

Subsequently, a gate-insulating layer 3210 is formed in a single-layer structure or a multilayer structure by the plasma CVD method or the sputtering method (refer to FIG. 49A). It is particularly preferable that the gate-insulating layer is a multilayer including three layers: an insulating layer 3211 formed of silicon nitride; an insulating layer 3212 formed of silicon oxide; and an insulating layer 3213 formed of silicon nitride. It is noted that in order to form an insulating layer of high density with low gate leak current at lower film-forming temperature, the reaction gas may include a noble gas element such as Ar and may be mixed into the insulating layer to be formed. By forming a first layer using silicon nitride or silicon nitride oxide in contact with the gate wiring layer 3202, the gate electrode layer 3203, and the capacitor-wiring layer 3204, the deterioration due to the oxidization can be prevented. In addition, when the first layer in contact with the gate wiring layer 3202, the gate electrode layer 3203, and the capacitor-wiring layer 3204 is formed of NiB (nickel boron), the surface can be smoothed.

Next, a semiconductor layer 3214 is formed. The semiconductor layer 3214 is formed of an AS or an SAS manufactured by a vapor deposition growth method or the sputtering method using a semiconductor material gas typified by silane or germane. As the vapor deposition growth method, the plasma-CVD method and the thermal CVD method can be used.

When the plasma CVD method is employed, the AS is formed using a mixed gas of $SiH_4$ and $H_2$ or using a gas of $SiH_4$, which are the semiconductor material gas. When $SiH_4$ is diluted with $H_2$ by from 3 to 1000 times to make a mixed gas or when $Si_2H_6$ is diluted with $GeF_4$ so that a gas flow rate of $Si_2H_6$ to $GeF_4$ is 20 to 40 to 0.9, an SAS in which Si composition ratio is 80% or more can be obtained. In particular, the latter case is preferable because the semiconductor layer 3214 can have crystallinity from the interface between the semiconductor layer 3214 and the base layer.

An insulating layer 3215 is formed over the semiconductor layer 3214 by the plasma CVD method or the sputtering method. As shown in the following step, this insulating layer 3215 is left over the semiconductor layer 3214 over the gate electrode layer and serves as a channel-protective layer. Therefore, the insulating layer 3215 is preferably formed of a dense film in order to prevent the semiconductor layer 3214 from being contaminated with external impurities such as metal or an organic material by keeping an interface between the insulating layer 3215 and the semiconductor layer 3214 clean. It is preferable to use a silicon nitride film, which is formed by diluting a silicide gas by 100 to 500 times with argon or the like by a glow-discharging decomposition method, because the dense film can be formed even at a film-forming temperature of 100° C. or less. Another insulating film may be formed thereover if necessary.

It is possible to form the gate-insulating layer 3210 continuously up to the insulating layer 3215 without exposing to the atmosphere. In this case, each interface between laminated layers can be formed without being contaminated by an atmospheric constituent and an airborne contaminated impurity element in an atmosphere, and therefore variations in properties of a TFT can be decreased.

Next, a mask layer 3216 is formed by selectively discharging a composition at a position over the gate electrode 3203 over the insulating layer 3215 (refer to FIG. 49A). A resin material such as an epoxy resin, an acrylic resin, a phenol resin, a novolac resin, an acrylic resin, a melamine resin, or an urethane resin is used to form the mask layer 3216. In addition, the mask layer 217 may be formed by a droplet-discharging method using an organic material such as benzocyclobutene, parylene, flare, or light-transmitting polyimide; a compound material made of polymerization such as siloxane-based polymer; a composition material including water-soluble homopolymer and water-soluble copolymer; or the like. Alternatively, a commercial resist material including a photosensitizer may be used. For example, a novolac resin and naphthoquinonediazide compound that is a photosensitizer, which are typical positive type resists; a base resin, which is a negative type resist; an acid generation agent such as diphenylsilane diol; or the like may be used. In using any one of materials, surface tension and viscosity are appropriately adjusted by diluting density of a solution or by adding a surface-active agent or the like.

The insulating layer 3215 is etched by using the mask layer 3216, and an insulating layer 3217 functioning as a channel-protective layer is formed. An n-type semiconductor layer 3218 is formed over the semiconductor layer 3214 and the insulating layer 3217 by removing the mask layer 3216. The n-type semiconductor layer 3218 may be formed by using a silane gas and a phosphine gas and can be formed of an AS or an SAS.

Next, a mask layer 3219 is formed by a droplet-discharging method over the n-type semiconductor layer 3218. By using this mask layer 3219, the n-type semiconductor layer 3218 and the semiconductor layer 3214 are etched, and a semiconductor layer 3220 and an n-type semiconductor layer 3221 are formed (refer to FIG. 49C). In this case, the TFT can be miniaturized by forming the mask layer 3219 microscopically in such a way that the photosensitive resin is exposed by the laser beam. It is noted that FIG. 49C schematically shows a vertical sectional structure, and FIG. 13 shows a planar structure corresponding to A-B and C-D thereof.

Subsequently, the mask layer 3219 is removed.

Next, a solution for forming a droplet-shedding surface is discharged or applied (FIG. 50A). As an example of the composition of the solution for forming the droplet-shedding surface, a silane-coupling agent expressed with a chemical formula: $R_n$—Si—$X_{(4-n)}$ (n=1, 2, 3) is used. It is noted that R includes a group that is comparatively inactive, for example an alkyl group. Moreover, X includes a hydrolytic group being able to couple by means of shrinking with a hydroxyl group or adsorption water on the surface of the substrate. Such a hydrolytic group is, for example, halogen, a methoxy group, an ethoxy group, an acetoxy group, or the like.

The droplet-shedding property can be enhanced by using a fluorite silane coupling agent (fluoroalkylsilane (FAS)) having fluoroalkyl in R, which is the typical example of the silane-coupling agent. R of FAS has a structure of $(CF_3)(CF_2)_x(CH_2)_y$ where x is not less than 0 nor more than 10 and y is not less than 0 nor more than 4. When a plurality of Rs or Xs are coupled with Si, all of Rs and Xs may be the same or may be different. As typical FAS, there are fluoroalkylsilane (hereinafter referred to as FAS) such as heptadefluorotetrahydrodecyltriethoxysilane, heptadecafluorotetrahydrodecyltrichlorosilane, tridecafluorotetrahydrooctyltrichlorosilane, and trifluoropropyltrimethoxysilane.

As the solvent of the solution for forming the droplet-shedding surface, there are hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, or squalene; or tetrahydrofuran.

In addition, as an example of the composition of the solution for forming the droplet-shedding surface, a material having fluorine-carbon chain (fluorinated resin) can be used. As the fluorinated resin, there are polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene 6-fluorinated propylene copolymer resin), ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethylene-perfluorodioxole copolymer (TFE/PDD), polyvinyl fluoride (PVF; fluorinated vinyl resin), or the like can be used.

Subsequently, when the surface with the solution for forming the droplet-shedding surface applied thereon is washed using ethanol, a layer forming a droplet-shedding surface 3222 that is extremely thin can be formed.

Next, a laser of ultraviolet ray or the like is irradiated from the side of the rear surface of the substrate. On this occasion, since the gate-wiring layer 3202, the gate electrode layer 3203, and the capacitor-wiring layer 3204 block the laser beam, the layer forming the droplet-shedding surface provided over them is not irradiated. As a result, the droplet-shedding surface of the n-type semiconductor layer 3218 is formed only over the gate electrode layer 3203, and the other regions of the n-type semiconductor layer 3218 become a droplet-attracting surface (refer to FIG. 50B).

Subsequently, source and drain wiring layers 3225 and 3226 are formed by a droplet-discharging method by selectively discharging a composition including a conductive material (refer to FIG. 50C). On this occasion, since an extremely thin film 3223 having the droplet-shedding property exists over the gate electrode layer 3203, a space 3224 between the source wiring and the drain wiring can be controlled in a self-aligning manner.

The extremely thin film 3223 having the droplet-shedding property may be removed or may not be removed. In this embodiment mode, the extremely thin film 3223 having the droplet-shedding property is removed when etching the n-type semiconductor layer 3218 in the following step.

Figure 51A:
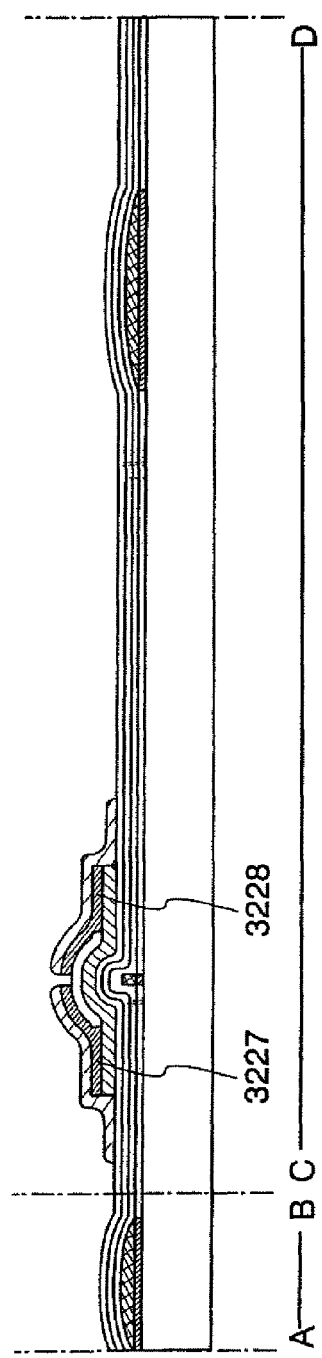
FIGS. 51A to 51C are cross-sectional views for explaining a manufacturing process of a liquid crystal display panel of the present invention.
Figure 58:
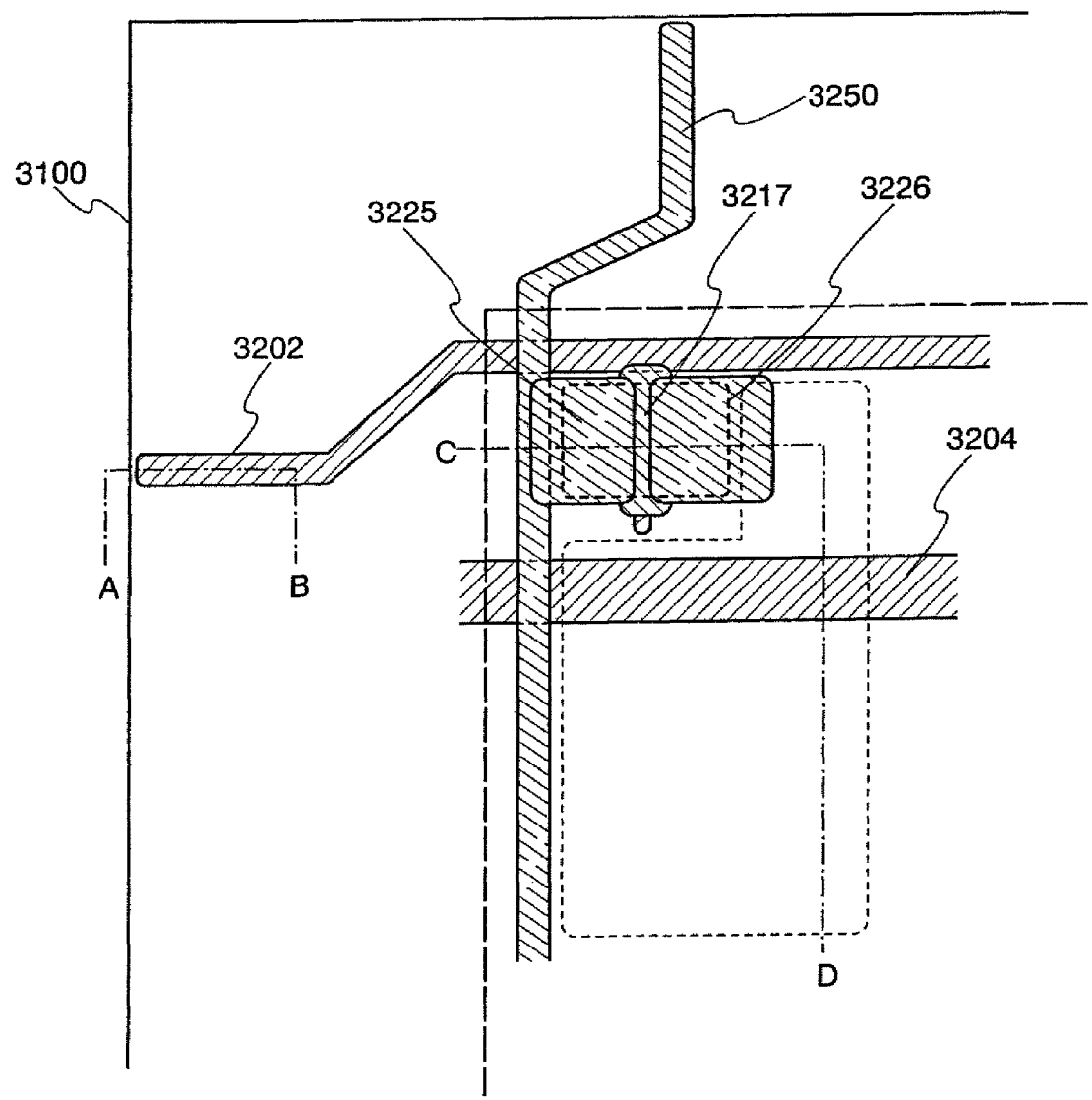
FIG. 58 is a top view for explaining a manufacturing process of a liquid crystal display panel of the present invention.

FIG. 51A shows a vertical cross-sectional structure and FIG. 58 shows a plain structure corresponding to A-B and C-D of FIG. 51A. As shown in FIG. 58, a signal-wiring layer 3250 is formed simultaneously with the source and drain wiring layers 3225 and 3226 so that the signal-wiring layer 3250 is connected with the source and drain wiring layers 3225 and 3226 electrically. As the conductive material for forming these wiring layers, a composition mainly including a particle of a metal selected from the group consisting of Ag (silver), Au (gold), Cu (copper), W (tungsten), Al (aluminum), and the like can be used. Moreover, light-transmitting indium tin oxide (ITO), organic indium including indium tin oxide and silicon oxide, organic tin, zinc oxide, titanium nitride, and the like may be combined.

Next, the n-type semiconductor layer 3221 over the insulating layer 3217 is etched using the source and drain wiring layers 3225 and 3226 as masks to form n-type semiconductor layers 3227 and 3228 for forming source and drain regions (refer to FIG. 51A).

Figure 51B:
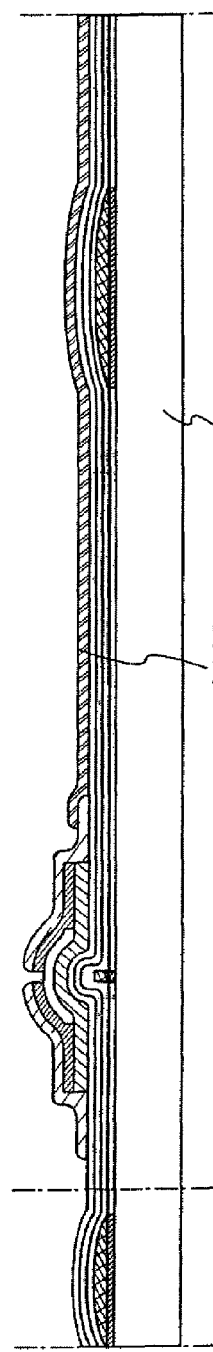
Figure 59:
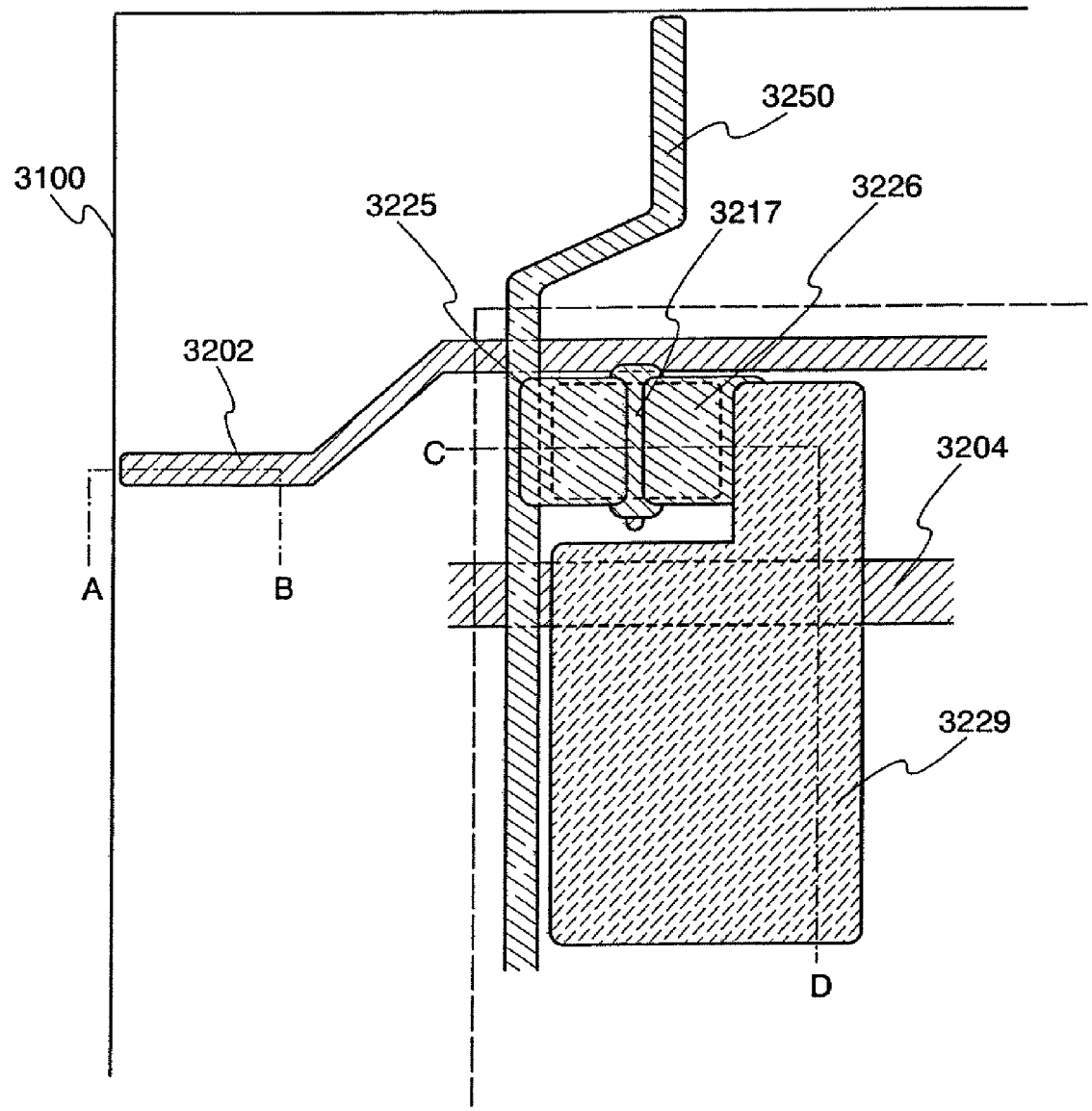
FIG. 59 is a top view for explaining a manufacturing process of a liquid crystal display panel of the present invention.

A pixel electrode layer 3229 is formed by discharging a composition including a conductive material so as to connect with the source and drain wiring layer 3226 electrically (refer to FIG. 51B). In the case of manufacturing a transmission-type liquid crystal display panel, the pixel electrode layer 3229 may be formed in such a way that a predetermined pattern is formed using a composition including indium tin oxide (ITO), indium tin oxide including silicon oxide, zinc oxide (ZnO), tin oxide ($SnO_2$), or the like and the pattern is baked. In the case of manufacturing a reflection-type liquid crystal display panel, a composition mainly including a particle of metal such as Ag (silver), Au (gold), Cu (copper), W (tungsten), Al (aluminum), or the like can be used. As another method, the pixel electrode layer may be formed in such a way that a transparent or light-reflecting conductive film is formed by the sputtering method, a mask pattern is formed by the droplet-discharging method, and then the etching is performed using the mask pattern. It is noted that FIG. 51B schematically shows a vertical cross-sectional structure, and FIG. 59 shows a plain structure corresponding to A-B and C-D of FIG. 51B. Therefore, both figures may be referred to at the same time.

According to the above process, a TFT substrate 3200 for a liquid-crystal display panel in which a bottom-gate type (also referred to as a reversely staggered type) TFT is connected with the pixel electrode over the substrate 3100 is obtained.

Figure 51C:
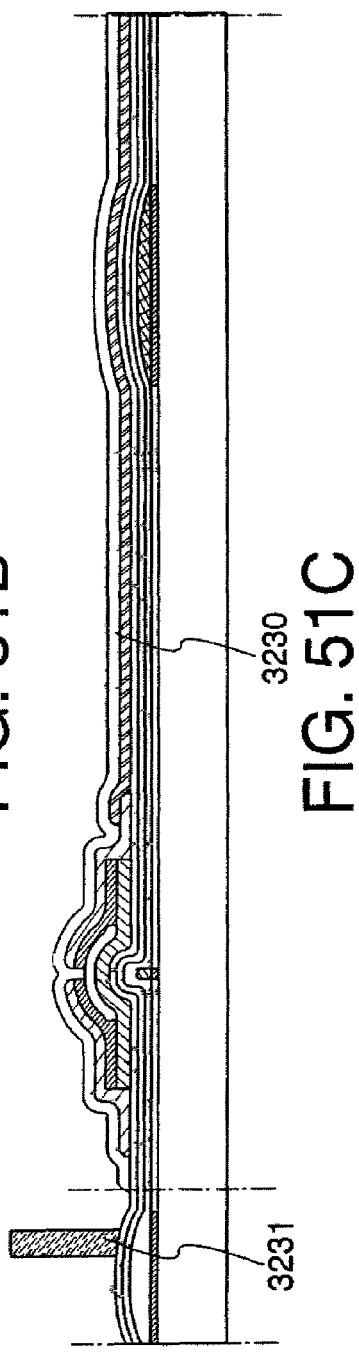

Next, an insulating layer 3230, which is called an orientation film, is formed over the pixel electrode layer 3229 by a printing method or a spin-coating method. It is noted that the insulating layer 3230 can be formed selectively as being illustrated in the figure by a screen-printing method or an offset-printing method. After that, a rubbing is performed. Subsequently, a sealing material 3231 is formed in the peripheral region of the pixel by the droplet-discharging method (refer to FIG. 51C).

Figure 52A:
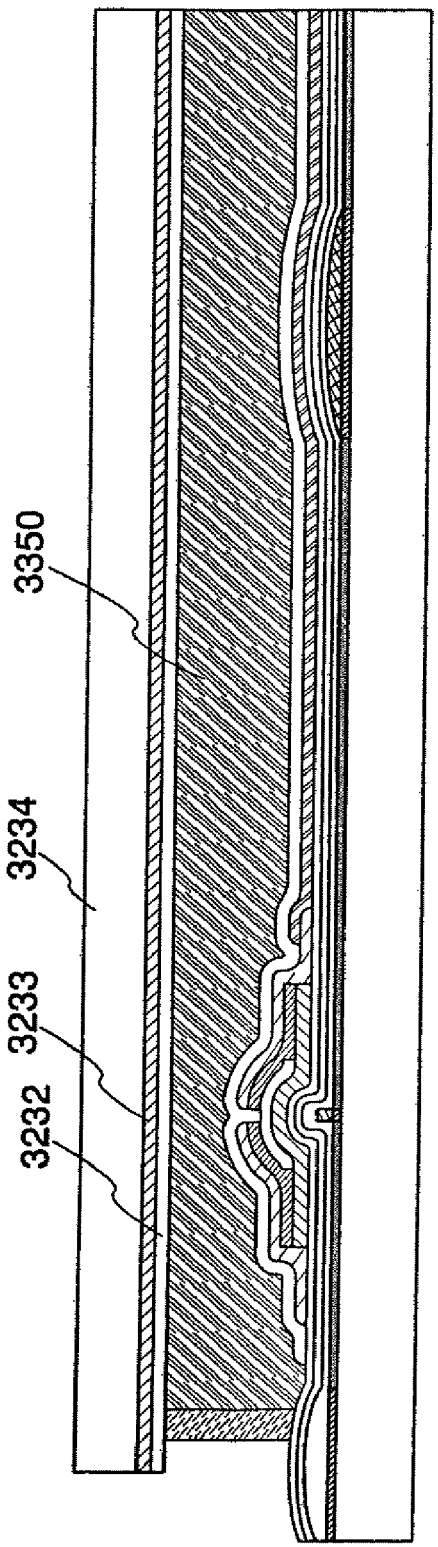
FIGS. 52A and 52B are cross-sectional views for explaining a manufacturing process of a liquid crystal display panel of the present invention.
Figure 52B:
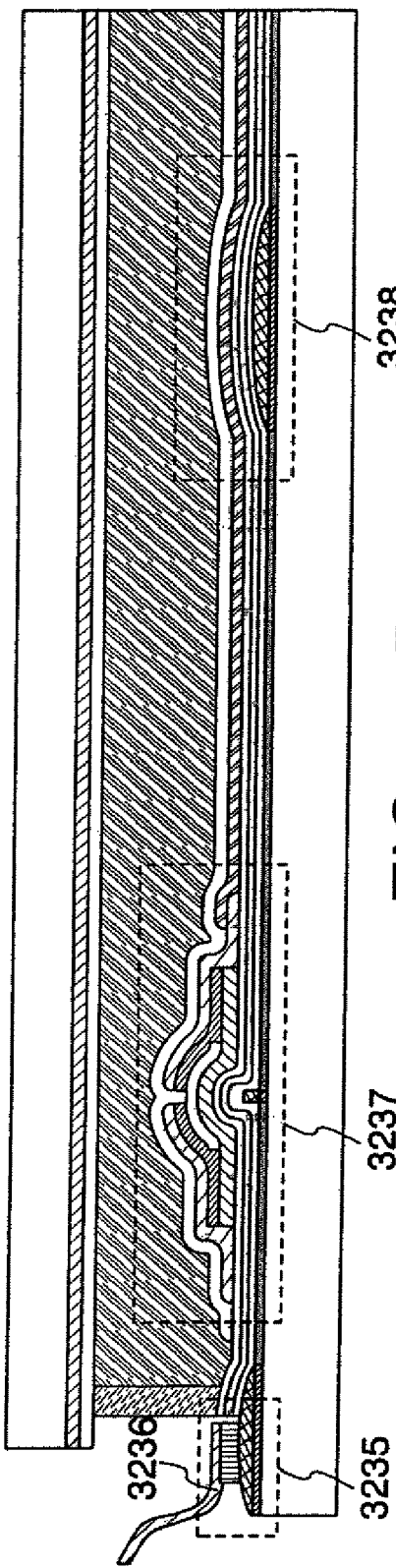
Figure 55:
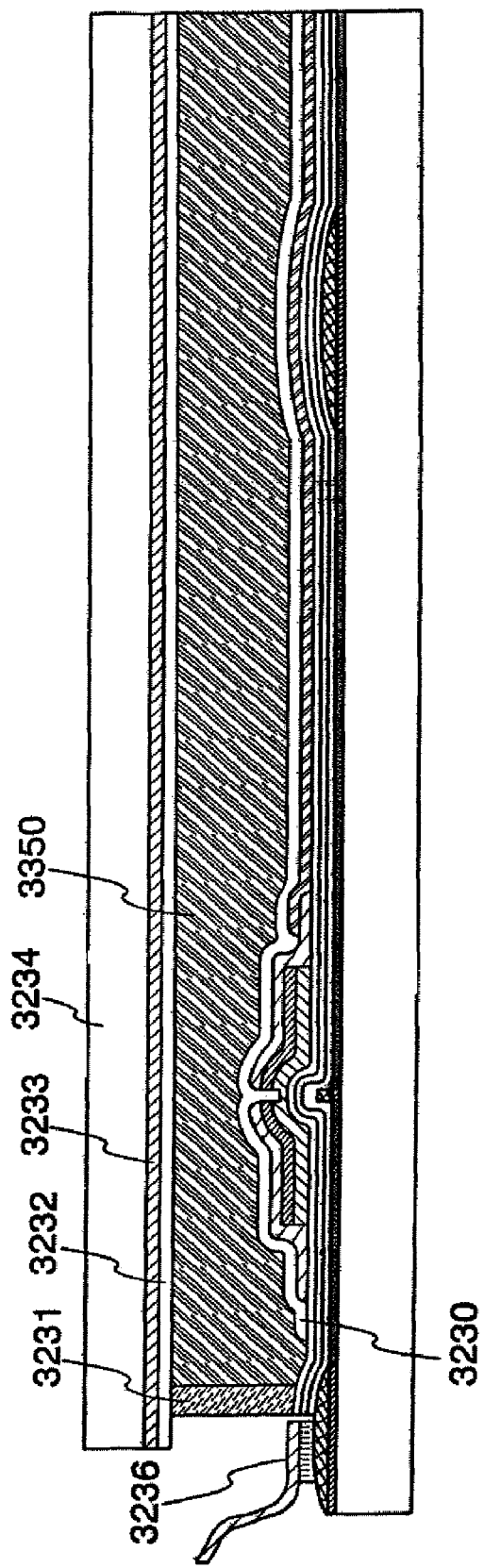
FIG. 55 is a cross-sectional view for explaining a manufacturing process of a liquid crystal display panel of the present invention.

After that, an opposing substrate 3234 over which the insulating layer 3232 functioning as the orientation film and the conductive layer 3233 functioning as the opposing electrode is pasted to the TFT substrate 3200 with the spacer interposed therebetween. Then, a liquid crystal layer 3350 is provided in its space, and the liquid crystal display panel can be thus manufactured (FIG. 52A). A filler may be mixed in the sealant 3231, and a color filter or a shielding film (such as a black matrix) may be formed to the opposing substrate 3234. As the method for forming the liquid crystal layer 3350, a dispensing system (dropping system) or a dip system (drawing system) in which a liquid crystal is injected using capillary phenomenon after pasting the opposing substrate 3234 can be used.

According to the liquid crystal injection method using the dispensing system, the sealing material 3231 is used to form a closed loop into which the liquid crystal is dripped once or multiple times. Subsequently, the substrates are pasted in vacuum, and then ultraviolet ray curing is performed to have the space between the substrates filled with the liquid crystal.

Next, the insulating layers 3211 to 3213, which are indicated by a region 3235, are removed by means of ashing with the use of oxygen gas under the atmospheric pressure or near-atmospheric pressure. This process uses oxygen gas and one or a plurality of gases selected from the group consisting of hydrogen, $CF_4$, $NF_3$, $H_2O$, and $CHF_3$. In this process, the ashing process is performed after sealing with the use of the opposing substrate in order to prevent the damage or breakdown due to the electrostatic. However, the ashing process may be performed anytime when the effect due to the electrostatic is small.

Subsequently, a connection terminal 3236 for connection is provided in such a way that the gate-wiring layer 3202 is electrically connected through an anisotropic conductive layer. The connection terminal 3236 translates the signal or the potential from the outside. The above process completes a liquid crystal display panel including a channel-protective switching TFT 3237 and a capacitor element 3238. The capacitor element 3238 is formed of the capacitor-wiring layer 3204, the gate-insulating layer 3210, and the pixel electrode layer 3229.

According to the above process, the liquid-crystal display device having the bottom-gate channel-protective type TFT can be manufactured.

Embodiment Mode 4

The embodiment mode 3 showed the structure in which the pixel electrode layer 3229 is in a direct contact with the source and drain wiring layer 3226. An example in which an insulating layer may be interposed therebetween is shown as another embodiment mode in this Embodiment Mode.

After completing the processes up to the process of FIG. 51A similarly as Embodiment Mode 3, an insulating layer 3239 functioning as the protective film is formed (refer to FIG. 53A). A film of silicon nitride or silicon oxide formed by the sputtering method or the plasma CVD method may be applied as this protective film. An opening 3240 is formed in the insulating layer 3239 in order to connect the source and drain wiring layer 3226 with the pixel electrode layer 3229 electrically through the opening 3240 (refer to FIG. 53B). Another opening 3241 required to paste the connection terminal afterward may be formed simultaneously as the opening 3240.

The way to form the openings 3240 and 3241 is not limited in particular. For example, the openings can be formed selectively by the plasma etching under the atmospheric pressure or can be formed by a wet etching process after forming a mask according to the droplet-discharging method. When the insulating layer 3239 is an inorganic siloxane film or an organic siloxane film formed by the droplet-discharging method, the process for forming the opening can be omitted. Moreover, when the region where the opening is formed is made to have a droplet-shedding surface, it is possible to form the opening in a self-aligning manner.

After conducting following manufacturing steps similarly as Embodiment Mode 3, the liquid crystal display panel with a bottom-gate channel-protective type switching TFT 3237 and a capacitor element 3238 shown in FIG. 53 is completed.

Embodiment Mode 5

A method for manufacturing a channel-etching type TFT is explained as the embodiment mode 5 with reference to FIGS. 54A to 54C and 55.

A gate-wiring layer 3202, a gate electrode layer 3203, and a capacitor-wiring layer 3204 are formed over a substrate 3100 by discharging a composition including a conductive material according to a droplet-discharging method. Next, after discharging or applying a photosensitive resin, the photosensitive resin 3205 is irradiated with a laser beam and developed, and thus a resist mask is formed. The etching is performed using the resist mask 3208 to process the gate electrode layer 3203 minutely, and then the resist mask 3208 is removed. Next, the gate-insulating layer 3210 is formed in a single-layer or multilayer structure by means of a plasma CVD method or a sputtering method. It is particularly preferable that the gate-insulating layer is the multilayer including three layers: an insulating layer 3211 formed of silicon nitride; an insulating layer 3212 formed of silicon oxide; and an insulating layer 3213 formed of silicon nitride. Moreover, a semiconductor layer 3214 functioning as the active layer is formed. The above process is the same as that in the embodiment mode 1.

An n-type semiconductor layer 3218 is formed on the semiconductor layer 3214 (refer to FIG. 54A). Next, a mask layer 3302 is formed by discharging the composition selectively on the n-type semiconductor layer 3218. Subsequently, the semiconductor layer 3214 and the n-type semiconductor layer 3218 are etched simultaneously using the mask layer 3302 to transform them into an island-shape. In this case, the TFT is miniaturized by forming the mask layer 3302 minutely in such a way that the photoresist is exposed with the laser beam. After that, the mask layer 3302 is removed.

Subsequently, after discharging or applying the solution for forming the droplet-shedding surface, it is washed using ethanol. Then, in order to use the gate-wiring layer 3202, the gate electrode layer 3203, and the capacitor-wiring layer 3204 as the masks, an irradiation of light is made from the rear surface of the substrate to form a droplet-attracting surface from a part of the droplet-shedding surface and.

Next, the composition including the conductive material is discharged selectively to form source and drain wiring layers 3225 and 3226 by the droplet-discharging method (refer to FIG. 54B). On this occasion, since there is a minute droplet-shedding surface over the gate electrode layer 3203, a space 3224 between the source and drain wirings can be controlled minutely in a self-aligning manner. Next, the n-type semiconductor layer 3218 is etched by using these wiring layers as the masks to form n-type semiconductor layers 3227 and 3228. Since it is difficult to etch an n-type semiconductor layer 3220 and a semiconductor layer 3221 selectively, a part 3303 of the semiconductor layer 3221 for forming the channel forming region is also etched partially in the same process. Subsequently, a pixel electrode 3229 is formed by discharging the composition including the conductive material so that the pixel electrode 3229 is connected electrically with the source and drain wiring layer 3226 (refer to FIG. 54C).

Next, an insulating layer 3230 functioning as an orientation film is formed. Subsequently, a sealing material 3231 is formed by which the substrate 3100 is pasted to an opposing substrate 3234 over which an conductive layer 3233 functioning as an opposing electrode and an insulating layer 3232 functioning as the orientation film are formed. Then, a liquid crystal layer 3350 is provided between the substrate 3100 and the opposing substrate 3234. Next, a region to which a connection terminal is pasted is exposed by means of etching under the atmospheric pressure or near-atmospheric pressure, and a flexible wiring substrate 3236 is pasted to a connection terminal. Thus, a liquid crystal display panel having a display function can be manufactured (refer to FIG. 55).

Embodiment Mode 6

This embodiment mode explains the case of forming a scanning line driver circuit over a substrate 100 as shown in FIG. 3 by forming the semiconductor layer using an SAS in the EL display panel or the liquid-crystal display panel manufactured according to any one of the embodiment modes 1 to 5.

Figure 24:
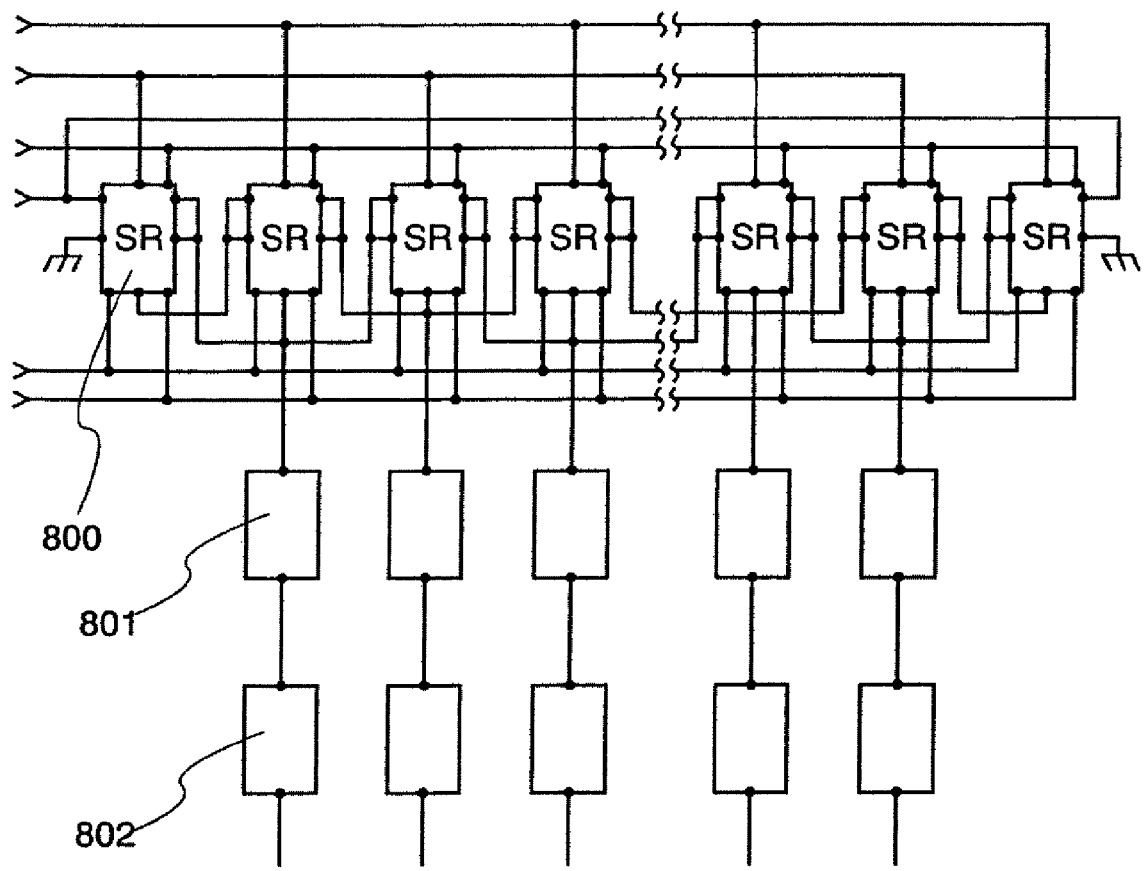
FIG. 24 is a drawing for explaining a circuit structure in the case of forming a scanning line driver circuit with the use of a TFT in a display panel of the present invention.

FIG. 24 shows a block diagram of the scanning line driver circuit including the n-channel TFT using the SAS in which the electric-field mobility in the range of 1 to 15 cm$^2$/V·sec is obtained.

In FIG. 24, a block corresponds to a pulse output circuit 800 for outputting a sampling pulse of one line and a shift resistor includes n number of pulse output circuits. A pixel 802 (corresponding to the pixel 102 in FIG. 3) is connected to an end of a buffer circuit 801.

Figure 25:
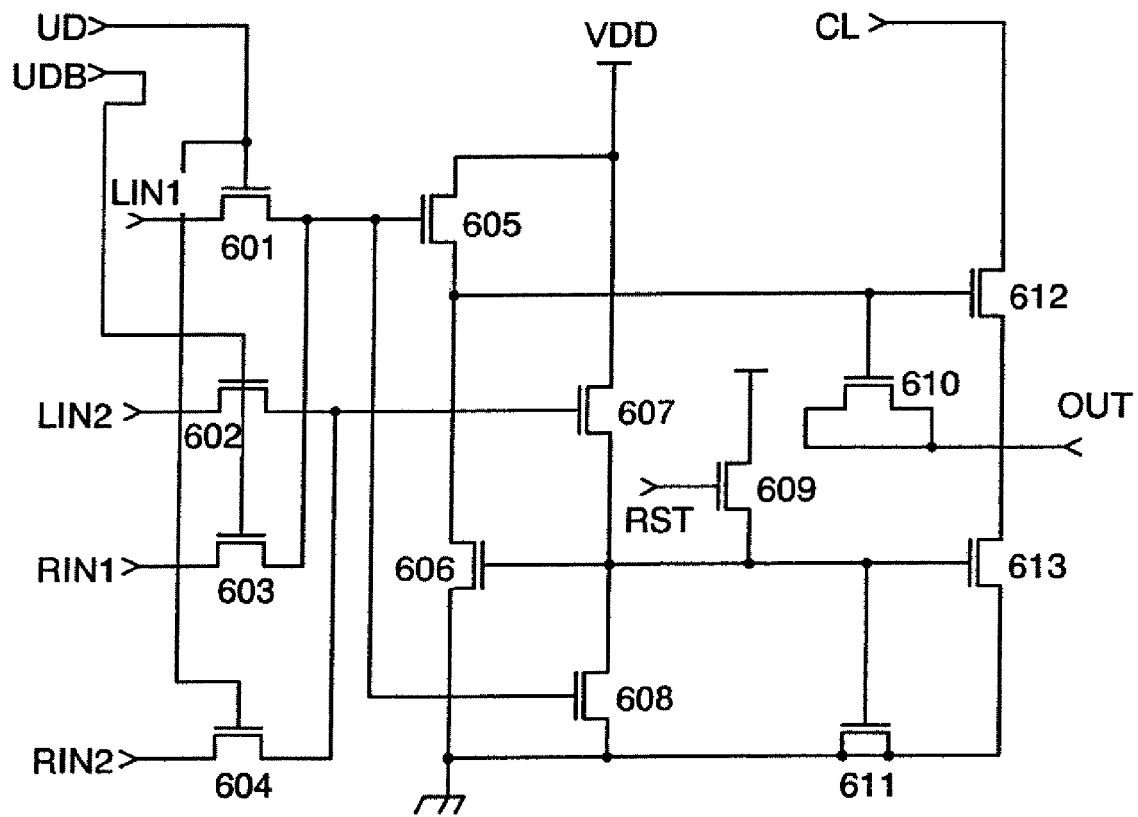
FIG. 25 is a drawing for explaining a circuit structure in the case of forming a scanning line driver circuit with the use of a TFT in an EL display panel of the present invention (a pulse output circuit)

FIG. 25 shows a specific structure of a pulse output circuit 800 including n-channel TFTs 601 to 613. On this occasion, the size of the TFT may be determined in consideration of the operating characteristic of the n-channel TFT using the SAS. For example, when the channel length is set to 8 μm, the channel width can be set in the range of 10 to 80 μm.

Figure 26:
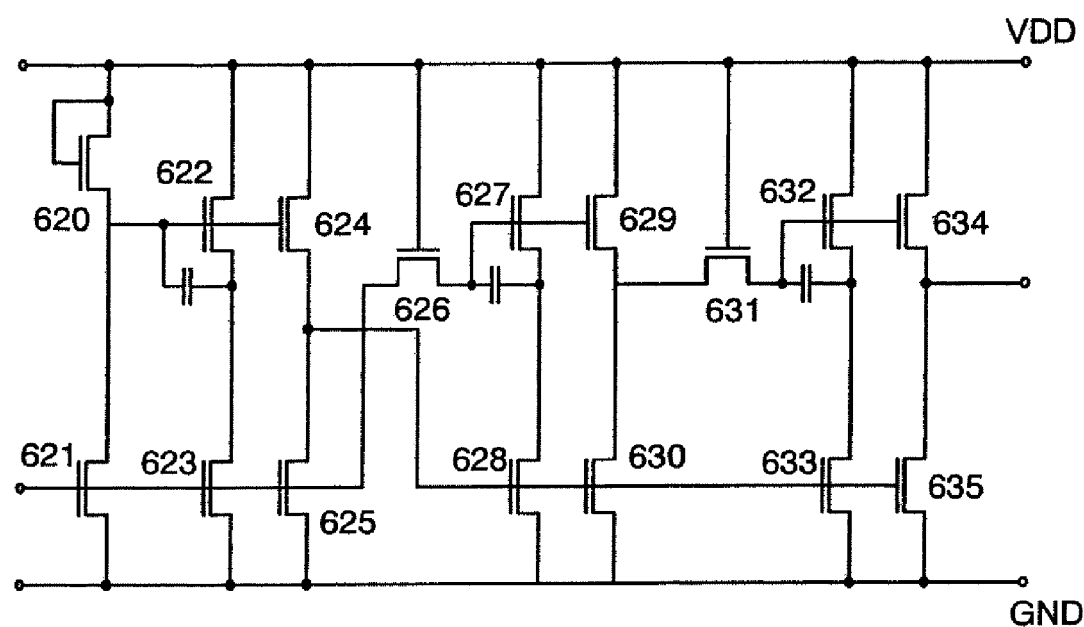
FIG. 26 is a drawing for explaining a circuit structure in the case of forming a scanning line driver circuit with the use of a TFT in a display panel of the present invention (a buffer circuit)

FIG. 26 shows a specific structure of the buffer circuit 801. In the same way, the buffer circuit in this figure also includes n-channel TFTs 620 to 635. On this occasion, the size of the TFT may be determined in consideration of the operating characteristic of the n-channel TFT using the SAS. For example, when the channel length is set to 10 μm, the channel width can be set in the range of 10 to 1800 μm.

Figure 16:
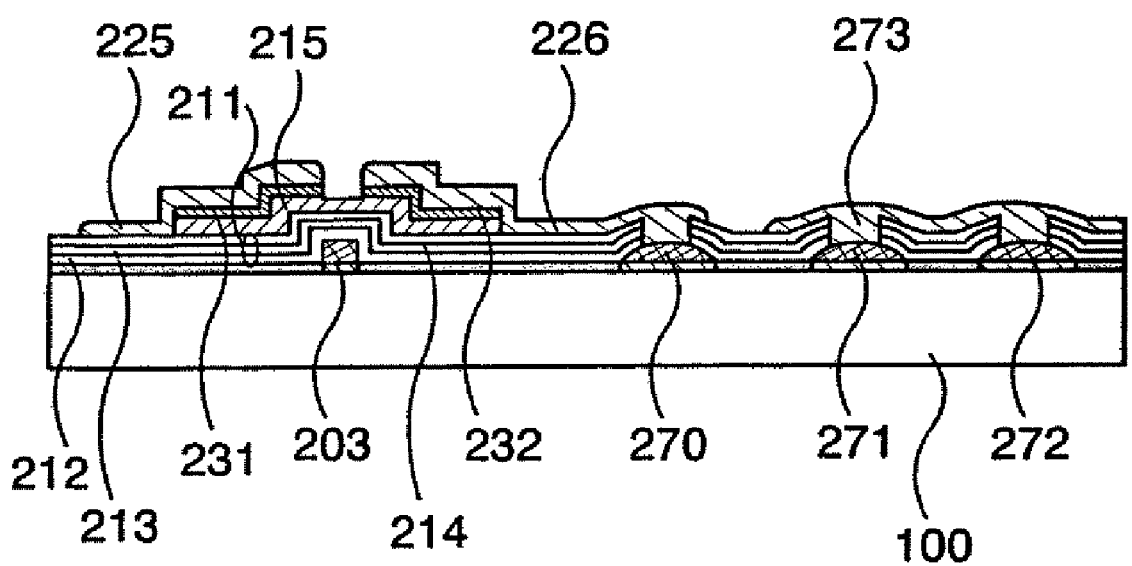
FIG. 16 is a cross-sectional view for explaining a manufacturing process of an EL display panel of the present invention.

In the case of manufacturing an EL display panel, in order to achieve such a circuit, it is necessary to connect the respective TFTs with wirings. FIG. 16 shows the structure of the wirings in such a case. As well as in the embodiment mode 1, FIG. 16 shows a gate electrode layer 203, a gate-insulating layer 211 (a multilayer including three layers: an insulating layer 212 formed of silicon nitride; an insulating layer 213 formed of silicon oxide; and an insulating layer 214 formed of silicon nitride), an n-type semiconductor layer 215 formed of an SAS, and n-type semiconductor layers 231 and 232 for forming source and drain wiring layers 225 and 226. In this case, connection-wiring layers 270, 271, and 272 are formed over the substrate 100 in the same process for forming the gate electrode layer 203. Then, the TFTs are connected appropriately with the use of source and drain wiring layers 225 and 226 and a connection wiring layer 273 formed in the same process for forming the source and drain wiring layers 225 and 226 performed by etching a part of the gate-insulating layer so as to expose the connection wiring layers 270, 271, and 272. Thus, various circuits are achieved.

Figure 11:
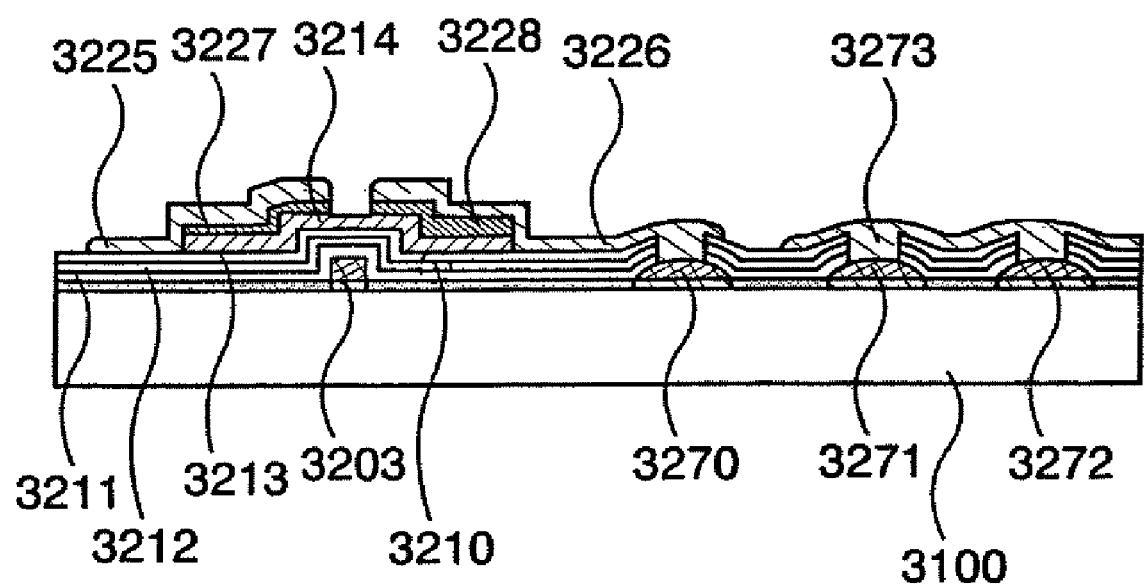
FIG. 11 is a cross-sectional view for explaining a manufacturing method of a liquid crystal display panel of the present invention.

On the other hand, in order to achieve such a circuit in the liquid crystal display panel, it is also necessary to connect the respective TFTs with wirings. FIG. 11 shows an example of the structure of the wiring in such a case. As well as in the embodiment mode 3, FIG. 11 shows a gate electrode layer 3203, a gate-insulating layer 3210 (a multilayer including three layers: an insulating layer 3211 formed of silicon nitride; an insulating layer 3212 formed of silicon oxide; and an insulating layer 3213 formed of silicon nitride), an n-type semiconductor layer 3214 formed of an SAS, n-type semiconductor layers 3227 and 3228 for forming a source and a drain, and source and drain wiring layers 3225 and 3226. In this case, connection-wiring layers 3270, 3271, and 3272 are formed over the substrate 3100 in the same process for forming the gate electrode layer 3203. Then, the TFTs are connected appropriately with the use of the source and drain wiring layers 3225 and 3226 and a connection-wiring layer 3273 formed through the same process for forming the source and drain wiring layers 3225 and 3226 performed by etching a part of the gate-insulating layer so as to expose the connection-wiring layers 3270, 3271, and 3272. Thus, various circuits are achieved.

Embodiment Mode 7

A top-gate TFT is explained with reference to FIG. 28 and FIGS. 34A to 36B as the embodiment mode 7.

A base layer 201 is formed over a substrate 100 by means of a sputtering method or an evaporation method. A solution for forming a droplet-shedding surface is discharged or applied to the base layer 201 (refer to FIG. 34A). Subsequently, an extremely thin film 120 being superior in the droplet-shedding property can be formed by using ethanol to wash the surface with the solution for forming the droplet-shedding surface applied thereon.

Figure 34A:
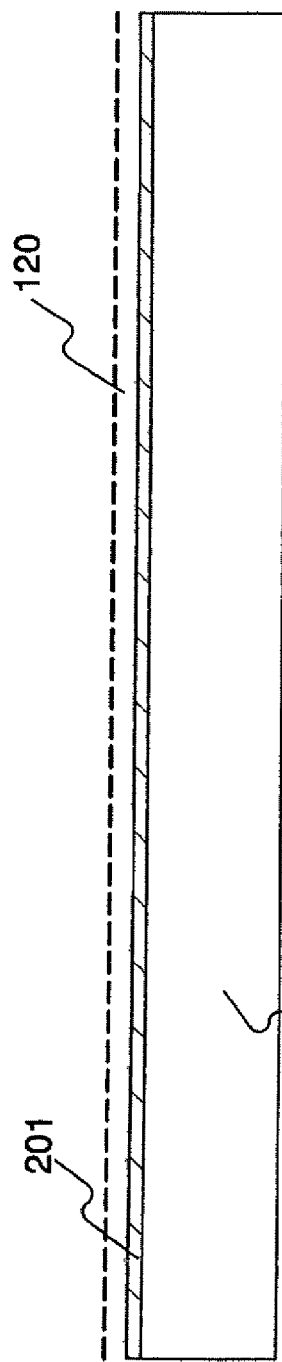
FIGS. 34A and 34B are cross-sectional views for explaining a manufacturing process of an EL display panel of the present invention.
Figure 34B:
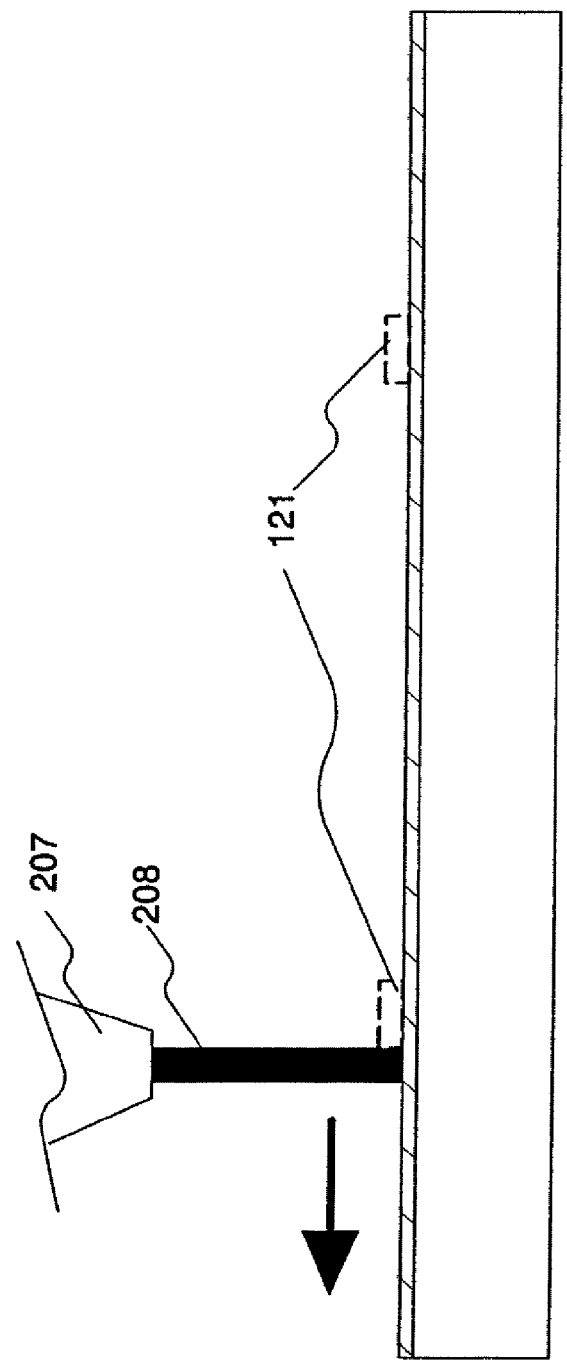

Next, a droplet-attracting surface is formed by irradiating a laser beam 208 to a part of the droplet-shedding surface 121 using a laser imaging system 207 while moving the substrate or the laser (refer to FIG. 34B). Moreover, contrary to this embodiment mode, another method may be employed to make the irradiated region have the droplet-shedding surface by irradiating a part of the droplet-attracting surface with the use of the laser beam.

Next, source and drain wiring layers 122 to 125 are formed by a droplet-discharging method in such a way that a composition including a conductive material is discharged so as to sandwich the droplet-shedding surface 121 (refer to FIG. 35A). On this occasion, since there is the droplet-shedding surface 121, a space 230 between the source and drain wirings can be controlled minutely in a self-aligning manner. Subsequently, the base layer 201 is insulated. On this occasion, the extremely thin film having the droplet-shedding property 120 may be removed or may not be removed. Moreover, the extremely thin film having the droplet-shedding property 120 can be removed at the same time as insulating the base layer.

Next, regions 126 to 129 with phosphorous doped is formed selectively over the source and drain wiring layers 122 to 125 by the plasma immersion method.

Figure 36A:
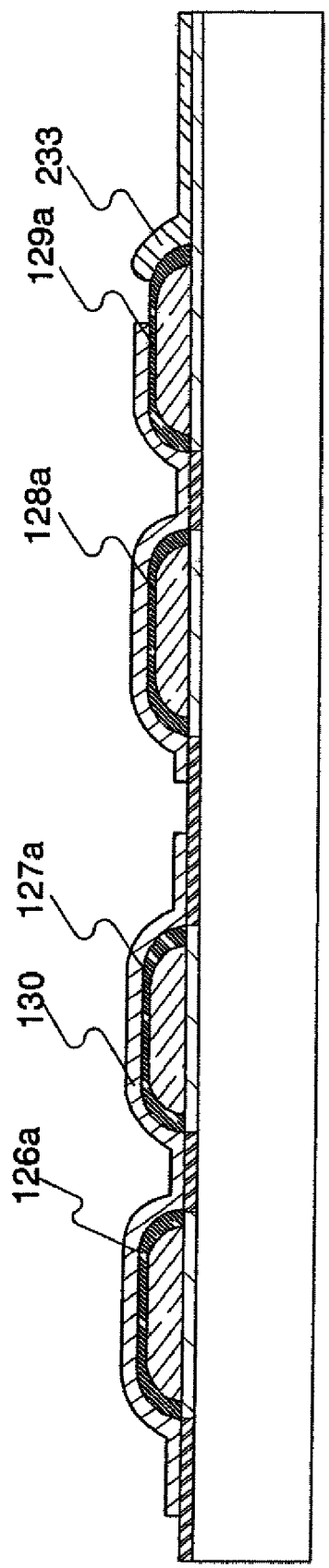
FIGS. 36A and 36B are cross-sectional views for explaining a manufacturing process of an EL display panel of the present invention.

The region where the phosphorous is doped reacts with a part of the semiconductor layer to be formed afterward, and n-type semiconductor layers 126a to 129a are formed as shown in FIG. 36A.

The plasma immersing method is a method for doping selectively only the surface of the source and drain wiring layer by RF glow discharging while flowing a phosphine gas or the like with the use of a P-CVD apparatus or the like.

Next, an AS or an SAS is formed by a vapor growth method such as a plasma CVD method or a sputtering method. In the case of using the plasma CVD method, the AS is formed using $SiH_4$ or a mixed gas of $SiH_4$ and $H_2$, which are the semiconductor material gas. The SAS is formed using the mixed gas in which $SiH_4$ is diluted with $H_2$ by 3 to 1000 times. When the SAS is formed using these kind of gas, the crystallinity is superior in the upper part of the semiconductor layer to the lower part thereof, and therefore, the combination with the top-gate TFT in which the gate electrode is formed over the upper layer of the semiconductor layer is appropriate.

The semiconductor layer 130 is formed in the position corresponding to the source and drain wiring layers 122 to 125 using a mask layer formed by the droplet-discharging method. In other words, the semiconductor layer 130 is formed so as to cover the source and drain wiring layers 122 and 123 (or 124 and 125) (refer to FIG. 36A).

Figure 28:
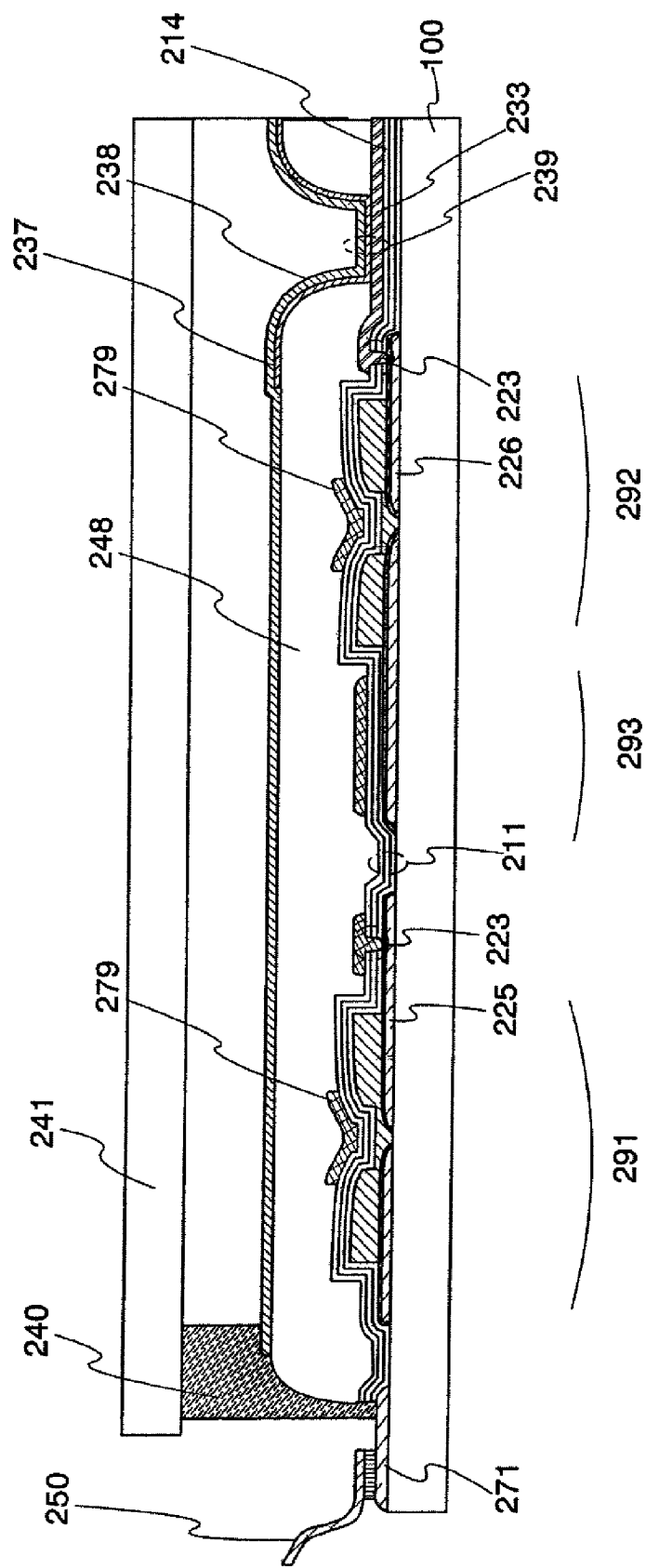
FIG. 28 is a cross-sectional view for explaining an EL display panel of the present invention.

Next, a gate-insulating layer 211 used in the TFT manufactured by the above process is formed by the plasma CVD method or the sputtering method as shown in FIG. 28. It is more preferable that the gate-insulating film 211 is a multi-layer including three layers: an insulating layer formed of silicon nitride; an insulating layer formed of silicon oxide; and an insulating layer 214 formed of silicon nitride. Next, after forming a through hole 223 in the gate-insulating layer 211 to expose a part of the source and drain wiring layers 122 and 125, a gate electrode layer 279 is formed by the droplet-discharging method (refer to FIG. 28). As the conductive material for forming this layer, it is possible to use the composition mainly including a particle of metal such as Ag (silver), Au (gold), Cu (copper), W (tungsten), or Al (aluminum).

A first electrode 233 corresponding to the pixel electrode is formed by discharging the composition including the conductive material so as to connect electrically with the source and drain wiring layer 125 through the n-type semiconductor layer 129a. According to the above processes, it is possible to obtain a TFT substrate over which a switching TFT 291, a driver TFT 292, and a capacitor portion 293 are formed (refer to FIG. 28).

Figure 36B:
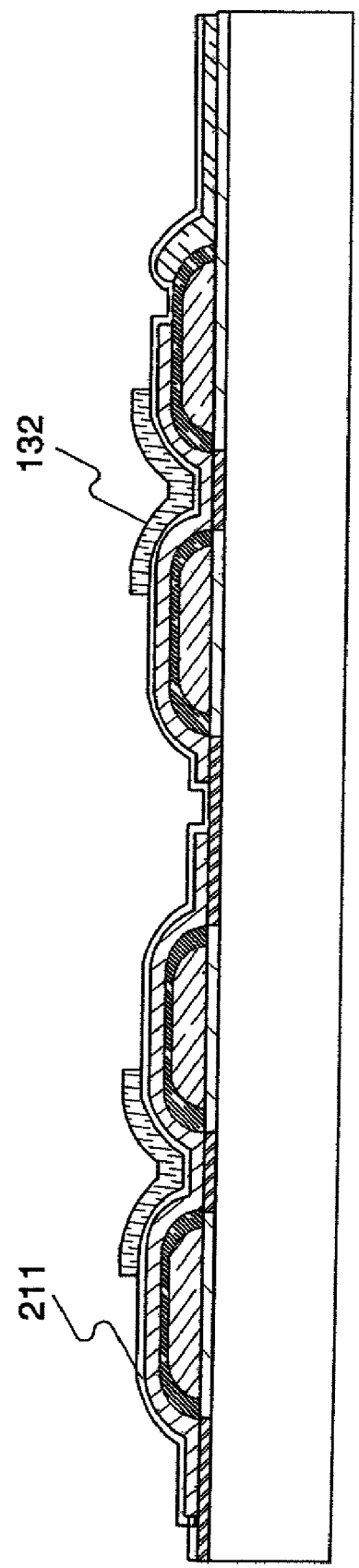
Figure 38:
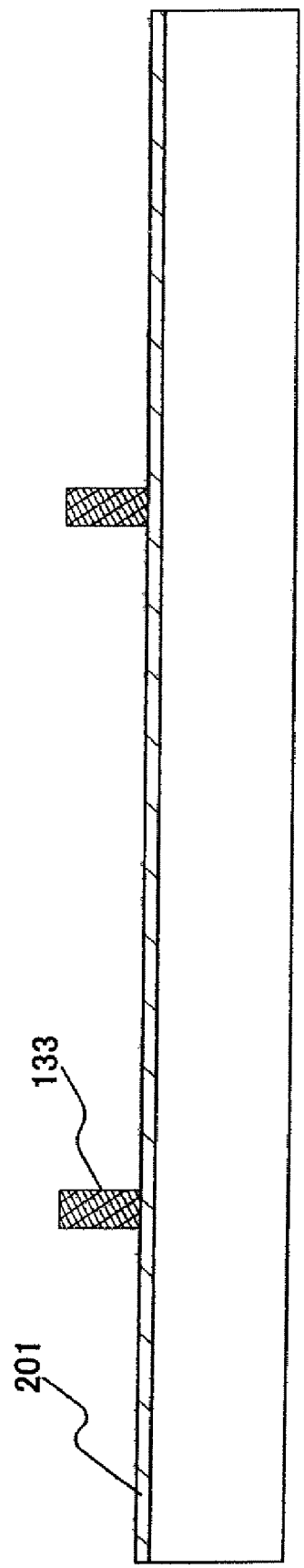
FIG. 38 is a cross-sectional view for explaining a manufacturing process of a display panel of the present invention.

As shown in FIG. 36B, when the first electrode 233 corresponding to the pixel electrode is formed before forming the gate-insulating layer 211, it is not necessary to expose the source and drain wiring layer 125.

When a bottom-emission type EL display panel is manufactured by a droplet-discharging method, the first electrode 233 may be formed in such a way that a predetermined pattern is formed using the composition including indium tin oxide (ITO), indium tin oxide including silicon oxide, zinc oxide (ZnO), tin oxide ($SnO_2$), or the like and then the pattern is annealed.

It is preferable that the first electrode is formed of indium tin oxide (ITO), indium tin oxide including silicon oxide, tin oxide, or the like by the sputtering method. It is more preferable to use indium tin oxide including silicon oxide formed by the sputtering method with the use of a target in which ITO includes silicon oxide by 2 to 10 wt %.

It is preferable in this embodiment mode that the first electrode 233 formed of the indium tin oxide including silicon oxide is formed in close contact with the insulating layer 214 formed of silicon nitride included in the gate-insulating layer 211. With this structure, it is possible to obtain an advantage that the proportion of the light emitted to the outside to the light emitted from the EL layer is increased.

Moreover, an insulating layer 248 is formed all over the substrate. After forming the insulating layer 248 by a spin-coating method or a dip method, an opening is formed by an etching process as shown in FIG. 28. This process is performed in such a way that the gate-insulating layer 211 under the insulating layer 248 at an edge portion of the substrate are etched at the same time so that the first electrode 233 and the source and drain wiring layer are exposed. When the insulating layer 248 is selectively formed by the droplet-discharging method, the etching process is not always necessary. When the droplet-shedding surface is formed over the region where the opening is formed, the opening can be formed in a self-aligning manner.

The insulating layer 248 is formed in such a way that the opening is formed in the position where the light-emitting region is formed in accordance with the first electrode 233. This insulating layer 248 can be formed of an inorganic insulating material such as silicon oxide, silicon nitride, silicon oxynitride, aluminum oxide, aluminum nitride, or aluminum oxynitride; acrylic acid, methacryl acid, or a derivative of these; heat-resistant polymer such as polyimide, aromatic polyamide, or polybenzimidazole; or, among the compound made of silicon, oxygen, and hydrogen formed by using a siloxane-based material as a start material, an inorganic siloxane insulating material including a Si—O—Si bond or an organic siloxane insulating material in which hydrogen over the silicon is substituted by an organic group such as methyl or phenyl. It is preferable that the insulating layer 248 is formed of a photosensitive or non-photosensitive material such as acrylic or polyimide because the opening having the cross-sectional shape whose radius of curvature continuously changes is formed so that a thin film in the upper layer is formed without the breakage due to the step.

According to the above processes, a TFT substrate for the EL display panel where a top-gate type (also referred to as staggered-type) TFTs 291 and 292 and the first electrode 233 are connected over the substrate 100 is completed.

Before forming the EL layer 237, the moisture in the insulating layer 248 or adsorbed on its surface is removed by means of heat treatment at a temperature of 200° C. under the atmospheric pressure. It is preferable that after heat treatment at temperatures from 200 to 400° C., preferably from 250 to 350° C. under the reduced pressure, the EL layer 237 is formed by the vacuum evaporation method or the droplet-discharging method under the reduced pressure without being exposed to the atmosphere.

Moreover, a light-emitting element 239 is formed by forming a second electrode 238 over the EL layer 237. This light-emitting element 239 is connected to the driver TFT 292.

Subsequently, a sealing material 240 is formed, and a sealing substrate 241 is used for sealing. After that, a flexible wiring substrate 250 may be connected to the connecting-wiring layer 271. This is the same thing to a signal-wiring layer.

According to the above processes, a light-emitting device having a top-gate type TFT can be manufactured.

Embodiment Mode 8

The method of making a resist mask drop-shedding is explained with reference to FIG. 28 and FIGS. 37A to 40B as the embodiment mode 8.

As shown in FIG. 37A, a photosensitive resin 206, which is a material of a resist mask, is discharged or applied on a base layer on a substrate 100. In the case of applying the photosensitive resin 206, a spin coater or a slit coater may be used. The photosensitive resin 206 may be a negative photosensitive resin or a positive photosensitive resin that are sensitive to the light in the range of an ultraviolet to infrared region. The negative photosensitive resin is used in this embodiment mode.

Next, a pattern is written in such a way that the photosensitive resin 206 is irradiated with a laser beam 208 using a laser imaging system 207 while moving the substrate or the laser.

After developing the photosensitive resin, a resist mask 133 is formed in a region irradiated with the laser beam as shown in FIG. 38A. Since the negative photosensitive resin is used here, the region irradiated with the laser beam becomes the resist mask.

Next, the resist mask 133 is processed by plasma of fluorine so that the resist mask 133 has a droplet-shedding property.

Next, source and drain wiring layers 135 to 138 are formed by a droplet-discharging method in such a way that a composition including a conductive material is discharged selectively so as to sandwich the resist mask 133 (refer to FIG. 39A). On this occasion, the droplet-shedding property of the resist mask 133 makes it possible to control a space 230 between the source and the drain wirings precisely in a self-aligning manner. Subsequently, the base layer 201 is insulated. On this occasion, the resist mask 133 may be removed or may not be removed. Then, regions 126 to 129 with phosphorous doped, n-type semiconductor layers 126a to 129a, first electrode 233, a gate-insulating film 211 and a semiconductor layer 132 are formed similarly as Embodiment Mode 7.

The following processes are the same as those in the embodiment mode 7.

Embodiment Mode 9

A bottom-gate TFT is explained with reference to FIGS. 41A to 46B as the embodiment mode 9.

As shown in FIG. 41A, a gate electrode layer 203 is formed over a substrate 100 by a plasma CVD method or a sputtering method. The gate electrode layer 203 may be formed selectively by a droplet-discharging method.

Next, the photosensitive resin 206 is discharged or applied. In the case of applying the photosensitive resin 206, a spin coater or a slit coater may be used. The photosensitive resin 206 may be a negative photosensitive resin or a positive photosensitive resin that are sensitive to the light in the range of an ultraviolet to infrared region. The negative photosensitive resin is used in this embodiment mode.

Next, a pattern is written in such a way that the photosensitive resin 206 is irradiated with a laser beam 208 using a laser imaging system 207 while moving the substrate or the laser as shown in FIG. 41B.

After developing, the region irradiated with the laser beam becomes a resist mask 209 as shown in FIG. 42A because the negative photosensitive resin is used here.

Next, the resist mask 209 is used as a mask to etch the gate electrode layer 203 by means of a known technique such as dry etching or wet etching, and then the resist mask 209 is removed. As a result, the gate electrode 203 that is minute can be formed.

Next, a gate-insulating layer 211 is formed in a single-layer or multilayer structure by the plasma CVD method or the sputtering method (refer to FIG. 43A). It is particularly preferable that the gate-insulating layer is a multilayer including three layers: an insulating layer formed of silicon nitride, an insulating layer formed of silicon oxide, and an insulating layer formed of silicon nitride.

Next, a solution for forming a droplet-shedding surface is discharged or applied.

Then, a surface on which the solution for forming the droplet-shedding surface applied is washed using ethanol. Thus, an extremely thin film forming a droplet-shedding surface 224 is formed.

Next, a laser beam of ultraviolet ray or the like is irradiated from the rear surface of the substrate for the purpose of exposure. On this occasion, since the gate electrode layer 203 blocks the laser beam, the extremely thin film forming the droplet-shedding surface 224 over the gate electrode layer 203 is not exposed. As a result, only the upper part of the gate electrode layer 203 remains the droplet-shedding surface, and the other regions become a droplet-attracting surface (refer to FIG. 43B).

Next, source and drain wiring layers 135 to 138 are formed by a droplet-discharging method in such a way that a composition including a conductive material is discharged selectively (refer to FIG. 44A). On this occasion, since the extremely thin film forming the droplet-shedding surface 224 exists over the gate electrode layer 203, a space 230 between the source and drain wirings can be minutely controlled in a self-aligning manner.

Then, a region 139 with phosphorus doped is formed selectively only over surfaces of the source and drain wiring layers 135 to 138 by the plasma immersion method (refer to FIG. 44B).

On this occasion, an extremely thin film forming droplet-shedding surface 224 can be removed by a condition of the plasma doping.

The region with phosphorus doped 139 reacts with a part of a semiconductor layer to be formed afterward so that n-type semiconductor layers 139a shown in FIG. 45A are formed.

Next, a semiconductor layer 215 is formed. The semiconductor layer 215 is formed of an AS or an SAS manufactured by a vapor growth method or a sputtering method with the use of a semiconductor material gas typified by silane or germane. As the vapor growth method, the plasma CVD method or a thermal CVD method can be used.

Next, a resist mask 141 is formed by discharging or applying a negative photosensitive resin 140, irradiating the negative photosensitive resin 140 with a laser beam using a laser imaging system 207 and developing the photosensitive resin 140. When the resist mask 141 does not need to be formed minutely, it may be formed by a droplet-discharging apparatus.

Next, the semiconductor layer 215 is patterned by means of etching with the use of the resist mask 141. After that, a first electrode 233 corresponding to a pixel electrode is formed, and then, a protective film 247 is formed.

The following processes are the same as those in the embodiment modes 1 and 3.

Embodiment Mode 10

An example of a light-emitting element applicable in the embodiment modes 1 to 9 is described with reference to FIGS. 19A and 20B.

FIG. 19A is an example in which a first electrode 11 is formed of a light-transmitting conductive oxide material including silicon oxide by the density of 1 to 15 atomic %. An EL layer 16 in which a hole-injecting or hole-transporting layer 41, a light-emitting layer 42, and an electron-transporting or electron-injecting layer 43 are laminated is provided over the first electrode 11. A second electrode 17 is formed of a first electrode layer 33 including an alkali metal such as Li or MgAg; or an alkali-earth metal and a second electrode layer 34 including a metal material such as aluminum. With this structure, the pixel can emit the light from the side of the first electrode 11 as indicated with an arrow in the figure.

FIG. 19B shows an example in which the light is emitted from the side of the second electrode 17. In this figure, the first electrode 11 is formed of a third electrode layer 35 made of a metal such as aluminum or titanium or a metal material including both the metal and nitrogen by the concentration of the stoichiometric composition ratio or less and formed of a fourth electrode layer 32 made of a conductive oxide material including silicon oxide by the density from 1 to 15 atomic %. An EL layer 16 in which a hole-injecting or hole-transporting layer 41, a light-emitting layer 42, or an electron-transporting or electron-injecting layer 43 are laminated is provided over the first electrode 11. The second electrode 17 is formed of a first electrode layer 33 including an alkali metal such as LiF or CaF or an alkali-earth metal and formed of a second electrode layer 34 made of a metal material such as aluminum. When both layers are formed in 100 nm thick or less so that the light can transmit therethrough, it is possible to emit light from the side of the second electrode 17.

FIG. 20A shows an example to emit light from the first electrode 11 and shows the structure formed by laminating the electron-transporting or electron-injecting layer 43, the light-emitting layer 42, and the hole-injecting or hole-transporting layer 41 in order. The second electrode 17 is formed of the fourth electrode layer 32 made of a conductive oxide material including silicon oxide by the concentration from 1 to 15 atomic % and formed of the third electrode layer 35 made of a metal such as aluminum or titanium or including both the metal and nitrogen by the concentration of the stoichiometric composition ratio or less. The first electrode 11 is formed of a first electrode layer 33 including an alkali metal such as LiF or CaF or an alkali-earth metal and formed of a second electrode layer 34 made of a metal material such as aluminum. When both layers are formed in 100 nm thick or less so that the light can transmit therethrough, it is possible to emit light from the first electrode 11.

FIG. 20B shows an example to emit light from the second electrode 17 and shows the structure formed by laminating the electron-transporting or electron-injecting layer 43, the light-emitting layer 42, and the hole-injecting or hole-transporting layer 41 in order. The first electrode 11 has the same structure as that of FIG. 20A and has the film thickness of such a degree that the light generated in the EL layer can be reflected. The second electrode 17 is made of a conductive oxide material including silicon oxide by the concentration from 1 to 15 atomic %. In this structure, when the hole-injecting or hole-transporting layer 41 is formed of a metal oxide (typically molybdenum oxide or vanadium oxide), which is an inorganic material, oxygen that is introduced when forming the fourth electrode 17 is supplied, and the hole-injecting property is enhanced. Accordingly, the drive voltage can be lowered.

When the first electrode is formed of the light-transmitting conductive oxide material and when the second electrode is formed so as to transmit the light therethrough or formed of the light-transmitting conductive oxide material, the light can be emitted from both the first electrode and the second electrode.

The EL layer may be formed of a light-emitting material and a charge-injecting-and-transporting material including an organic or inorganic compound. Moreover, the EL layer may include one or plural kinds selected from the group consisting of a low-molecular organic compound, a medium-molecular organic compound (an organic compound having molecularity of 20 or less or having a total length of chained molecules of 10 μm or less without having sublimation property), and a high-molecular organic compound in combination with an inorganic compound having an electron-injecting property or a hole-injecting property.

Among the charge-injecting-and-transporting materials, a material having particularly high electron-transporting property is, for example, a metal complex having a quinoline skeleton or a benzoquinoline skeleton such as tris (8-quinolinolate) aluminum (abbreviated to Alq3), tris(5-methyl-8-quinolinolate) aluminum (abbreviated to Almq3), bis(10-hydroxybenzo[h]-quinolinolate) beryllium (abbreviated to BeBq2), or bis(2-methyl-8-quinolinolate)-4-phenylphenolate-aluminum (abbreviated to BAlq). A material having high hole-transporting property is, for example, aromatic amine based compounds (the compounds having a benzene ring-nitrogen bond) such as 4,4'-bis[N-(1-naphthyl)-N-phenyl-amino]-biphenyl (abbreviated to α-NPD), 4,4'-bis[N-(3-methylphenyl)-N-phenyl-amino]-biphenyl (abbreviated to TPD), 4,4',4"-tris(N,N-diphenyl-amino)-triphenyl amine (abbreviated to TDATA), or 4,4',4"-tris[N-(3-methylphenyl)-N-phenyl-amino]-triphenylamine (abbreviated to MTDATA).

Moreover, among the charge-injecting-and-transporting materials, a material having particularly high electron-injecting property is a compound of alkali metal or alkali-earth metal such as lithium fluoride (LiF), cesium fluoride (CsF), or calcium fluoride ($CaF_2$). Moreover, a mixture of the material having high electron-transporting property such as Alq3 and the alkali-earth metal such as magnesium (Mg) may be used.

Furthermore, among the charge-injecting-and-transporting materials, a material having particularly high hole-injecting property is, for example, a metal oxide such as molybdenum oxide (MoOx), vanadium oxide (VOx), ruthenium oxide (RuOx), tungsten oxide (WOx), or manganese oxide (MnOx). Moreover, a phthalocyanine compound such as phthalocyanine (abbreviated to $H_2Pc$) or copper phthalocyanine (CuPC) may be used.

The EL layer may have a structure for displaying full colors by forming EL layers for emitting the light having different wavelengths respectively in every pixel. Typically, EL layers corresponding to each color of R (red), G (green), and B (blue) are formed. When a filter for transmitting the wavelength of the emitted light is provided on the side where the light is emitted from the pixel in this case, the enhancement of the color purity and the prevention of the reflection at the pixel can be expected. The filter (coloring layer) can replace a circular polarizer, which has been required conventionally, and can suppress the loss of the light emitted from the EL layer. Moreover, the change of the color tone in the pixel portion (display screen) when observed obliquely can be suppressed.

Various materials can be used as the light-emitting material. Among low-molecular organic light-emitting materials, it is possible to use 4-(dicyanomethylene)-2-methyl-6-(1,1,7,7-tetramethyljulolidin-9-enyl)-4H-pyran (abbreviated to DCJT); 4-(dicyanomethylene)-2-t-butyl-6-(1,1,7,7-tetramethyljulolidin-9-enyl)-4H-pyran (abbreviated to DPA); periflanthene; 2,5-dicyano-1,4-bis(10-methoxy-1,1,7,7-tetramethyljulolidin-9-enyl)benzene; N,N'-dimethylquinacridone (DMQd); coumarin 6; coumarin 545T; tris(8-quinolinolato) aluminum; 9,9'-bianthryl; 9,10-diphenylanthracene (abbreviated to DPA); 9,10-bis (2-naphthyl)anthracene (abbreviated to DNA); or the like. Another material can be also used.

On the other hand, since a high-molecular organic light-emitting material has higher physical strength than the low-molecular organic light-emitting material, a light-emitting element manufactured using the former material has higher resistance than that manufactured using the latter material. In addition, since the high-molecular organic light-emitting material can be formed by a coating method, the light-emitting element can be manufactured comparatively easily. A structure of the light-emitting element manufactured using the high-molecular organic light-emitting material is basically the same as that manufactured using the low-molecular organic light-emitting material. Specifically, the light-emitting element has the structure of cathode/organic EL layer/anode. However, when the EL layer is formed using the high-molecular organic light-emitting material, it is difficult to form the same multilayer as that obtained when the EL layer is formed using the low-molecular organic light-emitting material. In many cases, it is difficult that the EL layer formed using the high-molecular organic light-emitting material has the same multilayer structure as that when the EL layer is formed using the low-molecular organic light-emitting material. Specifically, when the high-molecular organic light-emitting element is used, the structure is cathode/EL layer/hole-transporting layer/anode.

The color of the emitted light is determined by the material of the EL layer. When the material of the EL layer is selected appropriately, the light-emitting element for emitting the light having the desired color can be formed. As a high-molecular electroluminescent material, polyparaphenylenevinylene, polyparaphenylene, polythiophene, polyfluorene, or the like is given.

As the polyparaphenylenevinylene material, there are a derivative of poly(paraphenylenevinylene) [PVP]; poly(2,5-dialkoxy-1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV], and the like. As the polyparaphenylene material, there are a derivative of polyparaphenylene [PPP]; poly(2,5-dialkoxy-1,4-phenylene) [RO-PPP]; poly(2,5-dihexoxy-1,4-phenylene); and the like. As the polythiophene materials, there are a derivative of polythiophene [PT]; poly(3-alkylthiophene) [PAT]; poly(3-hexylthiophene) [PHT]; poly(3-cyclohexylthiophene) [PCHT]; poly(3-cyclohexyl-4-methylthiophene) [PCHMT]; poly[3-(4-octylphenyl)-thiophene] [POPT]; poly[3-(4-octylphenyl)-2,2' bithiophene] [PTOPT]; and the like. As the polyfluorene material, there are a derivative of polyfluorene [PF], poly(9, 9-dialkylfluorene) [PDAF]; poly(9,9-dioctylfluorene) [PDOF]; and the like.

When a high-molecular organic light-emitting material having a hole-transporting property is formed between the anode and a high-molecular organic light-emitting material having a light-emitting property, it is possible to enhance the hole-injecting property from the anode. Generally, an aqueous solution in which the high-molecular organic light-emitting material having the hole-transporting property is dissolved together with an acceptor material is applied by a spin coating method or the like. Since the high-molecular organic light-emitting material having the hole-transporting property is insoluble in an organic solvent, it can form a multilayer with the organic light-emitting layer having the light-emitting property. As the high-molecular organic light-emitting material having the hole-transporting property, there are a mixture of PEDOT and camphoric sulfonic acid (CSA) as the acceptor material; a mixture of polyaniline [PANI] with polystyrene sulfonic acid [PSS] as the acceptor material; and the like.

The EL layer may have the structure for emitting a single color or a white color. In the case of using a material for emitting the white color, a filter (color layer) for transmitting a specified wavelength may be provided in the side of the pixel to which the light is emitted in order to achieve the color display.

The EL layer for emitting the white color can be obtained by forming, for example, Alq3, Alq3 with nile red, which is a pigment for emitting the red light, doped partially, Alq3, p-EtTAZ, and TPD (aromatic diamine) in order by an evaporation method. When the EL layer is formed by the coating method using a spin coater, it is preferable to anneal the EL layer by heating in vacuum after applying the EL layer. For example, the EL can be formed in such a way that poly (ethylenedioxythiophene)/poly (stylene sulfonic acid) aqueous-solution (PEDOT/PSS) is applied all over the substrate and annealed, and then a polyvinylcarbazole (PVK) doped with pigment that contributes to the light emission and serves as the EL layer is applied and baked thereafter. Such pigment is, for example 1,1,4,4-tetraphenyl-1,3-butadiene (TPB); 4-dicyanomethylene-2-methyl-6-(p-dimethylamino-styryl)-4H-pyran (DCM1); nile red; coumarine 6; or the like.

The EL layer may be a single layer. For example, 1,3,4-oxadiazole derivative (PBD) having an electron-transporting property may be diffused in the polyvinylcarbazole (PVK) having the hole-transporting property. When the PBD is diffused by 30 wt % as the electron transporter and four kinds of pigments (TPB, coumarin 6, DCM1, and nile red) are diffused by an appropriate amount, white-color emission can be obtained. Not only the light-emitting element for emitting the white color shown in the above but also another light-emitting element for emitting red, green, or blue light can be obtained by selecting the material of the EL layer appropriately.

Moreover, the EL layer may be formed of not only a singlet-excited light-emitting material but also a triplet-excited material including a metal complex or the like. For example, among pixels for emitting red, green, and blue light, the pixel for emitting the red color, which has a relatively short half-life period of luminance, is formed of the triplet-excited light-emitting material and the other two pixels are formed of the singlet-excited light-emitting material. The triplet-excited light-emitting material has an advantage of low power consumption to obtain the same luminance as that of the singlet-excited light-emitting material because the triplet-excited light-emitting material has higher light-emission efficiency. In other words, when the pixel for the red color is formed of the triplet-excited light-emitting material, the reliability can be improved because the light-emitting element requires smaller amount of current. For lower power consumption, the pixels for the red and green colors may be formed of the triplet-excited light-emitting material and the pixel for the blue color may be formed of the singlet-excited light-emitting material. When the light-emitting element of the green color that is highly visible to the human eyes is formed of the triplet-excited light-emitting material, the power consumption can be further reduced.

As an example of the triplet-excited light-emitting material, there is a material with a metal complex doped: a metal complex mainly including platinum, which is a third transition series element; a metal complex mainly including iridium; or the like. Not only the above metal complex but also another compound that has the above structure and mainly includes an element belonging to 8th to 10th group in the periodic table can be used as the triplet-excited light-emitting material.

The above-mentioned materials for forming the EL layer are just examples, and the light-emitting element can be formed by forming functional layers such as a hole-injecting-and-transporting layer, a hole-transporting layer, an electron-injecting-and-transporting layer, a light emitting layer, an electron-blocking layer, a hole-blocking layer, and the like. Moreover, a mixed layer or a mixed junction in which these layers are mixed may be formed. It is noted that the EL layer may have any structure within the scope of the present invention. For example, instead of the particular electron-injecting region and the light-emitting region, an electrode may be provided, or the light-emitting material may be diffused in the EL layer for the same purpose as those regions.

The light-emitting element formed of the above material emits light by biasing in a forward direction. A pixel of a display device formed using the light-emitting element is driven by a simple matrix method or an active matrix method shown in the embodiment 2. In any way, the respective pixels emit light by biasing in the forward direction in a particular timing and their emission stops for a certain period. The reliability of the light-emitting element can be enhanced by biasing in a reverse direction in this non-emission period. The light-emitting element has a deterioration mode in which the luminance intensity decreases under a constant drive condition and another deterioration mode in which the luminance appears to be lowered because the non-emission region expands. However, when the light-emitting element is driven by biasing in the forward and reverse directions alternately, the speed of deterioration can be decelerated, and the reliability of the light-emitting device can be improved.

Embodiment Mode 11

With reference to FIGS. 21A to 22B, this embodiment mode explains an example in which a driver circuit is mounted over a display panel manufactured according to any one of the embodiment modes 1 to 6.

Figure 21A:
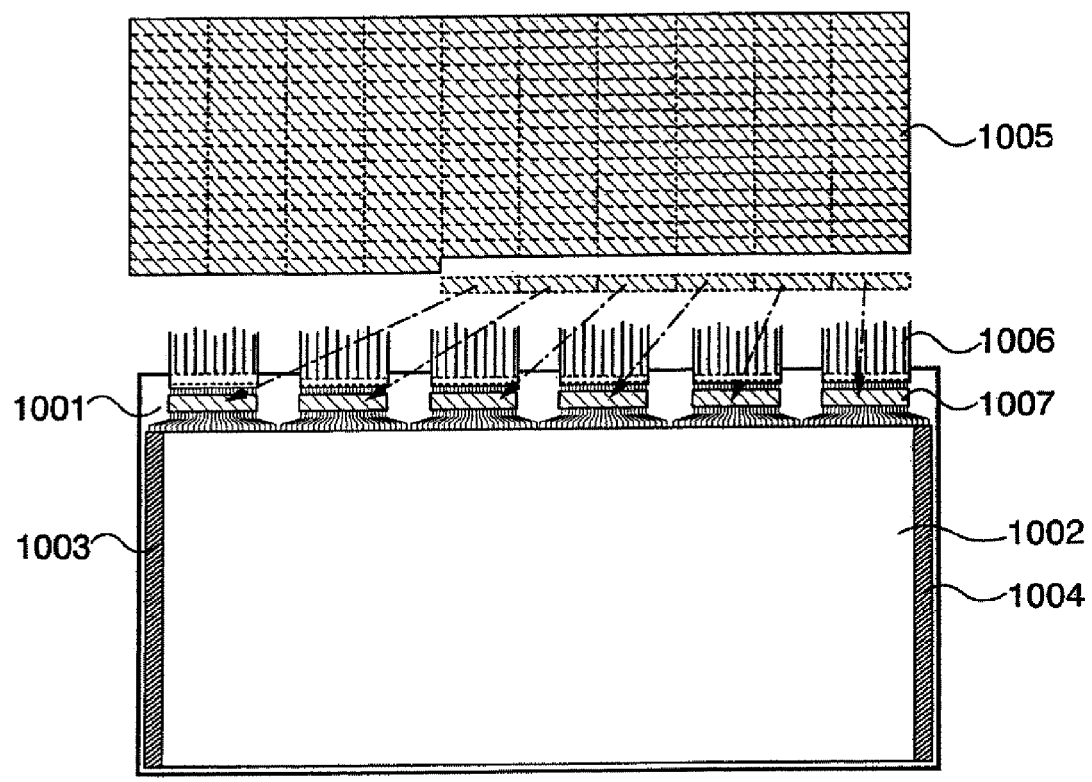
FIGS. 21A and 21B are drawings for explaining a method for mounting a driver circuit of a display panel of the present invention.
Figure 21B:
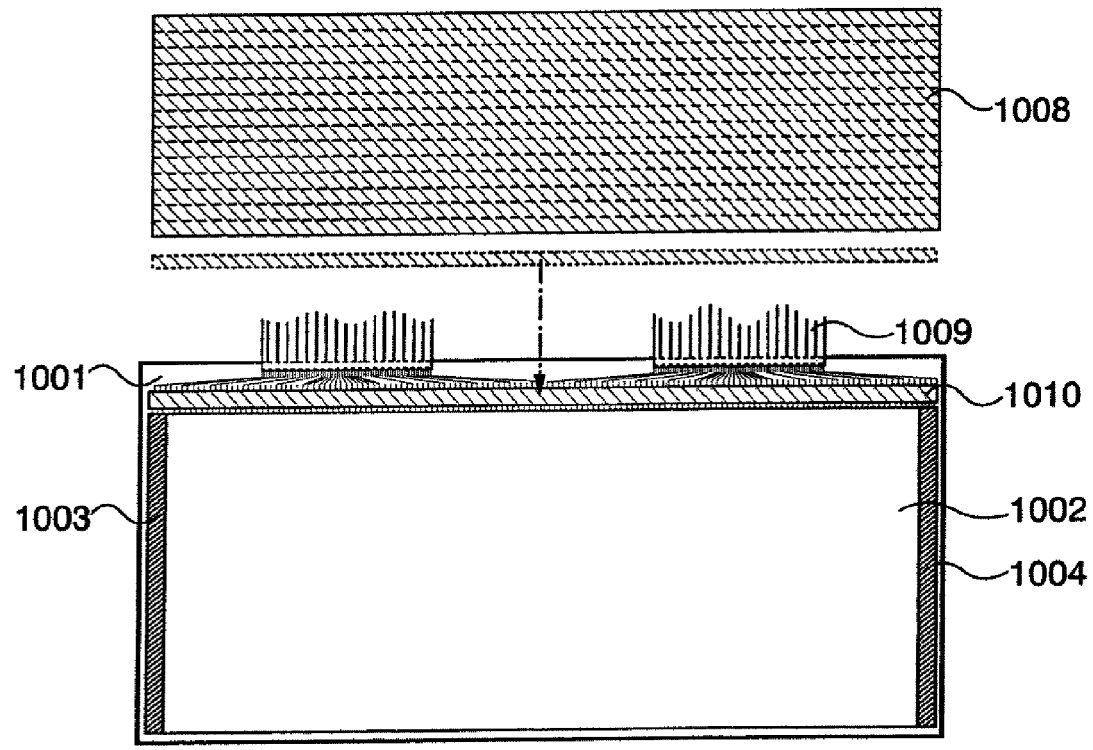

First, a display device employing a COG method is explained with reference to FIGS. 21A and 21B. A pixel portion 1002 for displaying a piece of information with a letter or an image and scanning line driver circuits 1003 and 1004 are provided over a substrate 1001. Substrates 1005 and 1008 with a plurality of driver circuits provided thereover are divided into rectangles, and the divided driver circuits (hereinafter each of them is referred to as a driver IC) are mounted over the substrate 1001. FIG. 21A shows an example in which a plurality of tapes 1006 are mounted to a plurality of driver ICs 1007 respectively. FIG. 21B shows an example in which a plurality of tapes 1009 are mounted to a driver IC 1010.

Figure 22A:
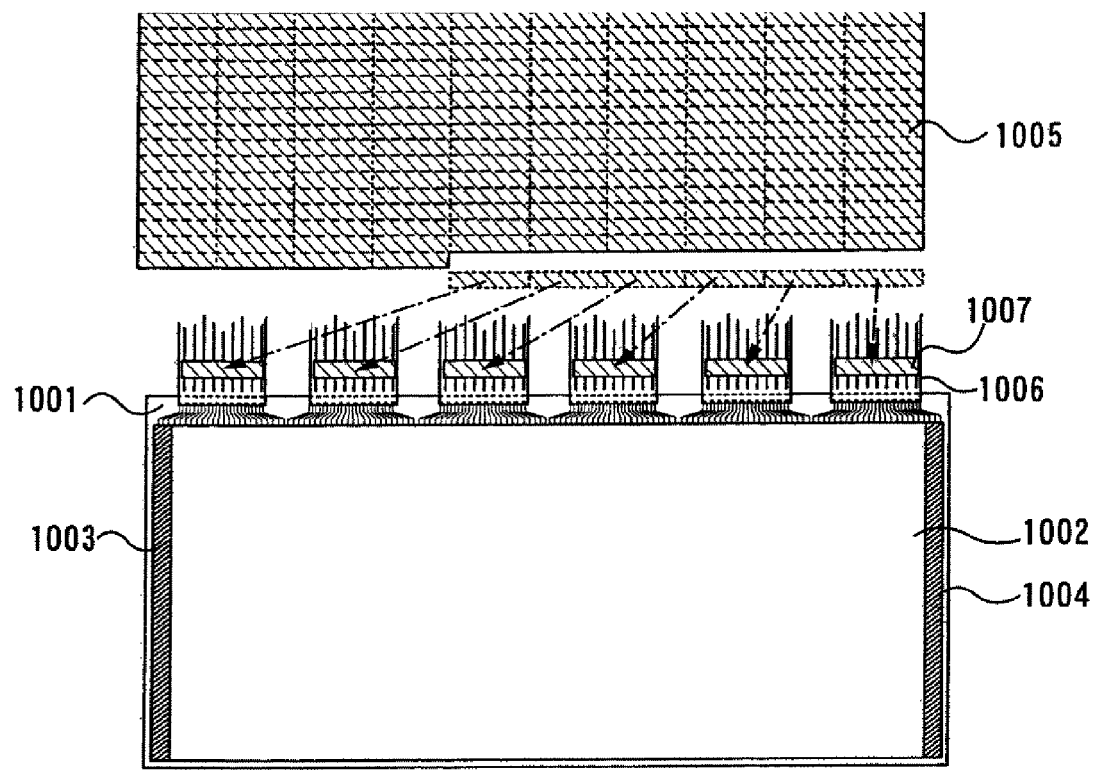
FIGS. 22A and 22B are drawings for explaining a method for mounting a driver circuit of a display panel of the present invention.
Figure 22B:
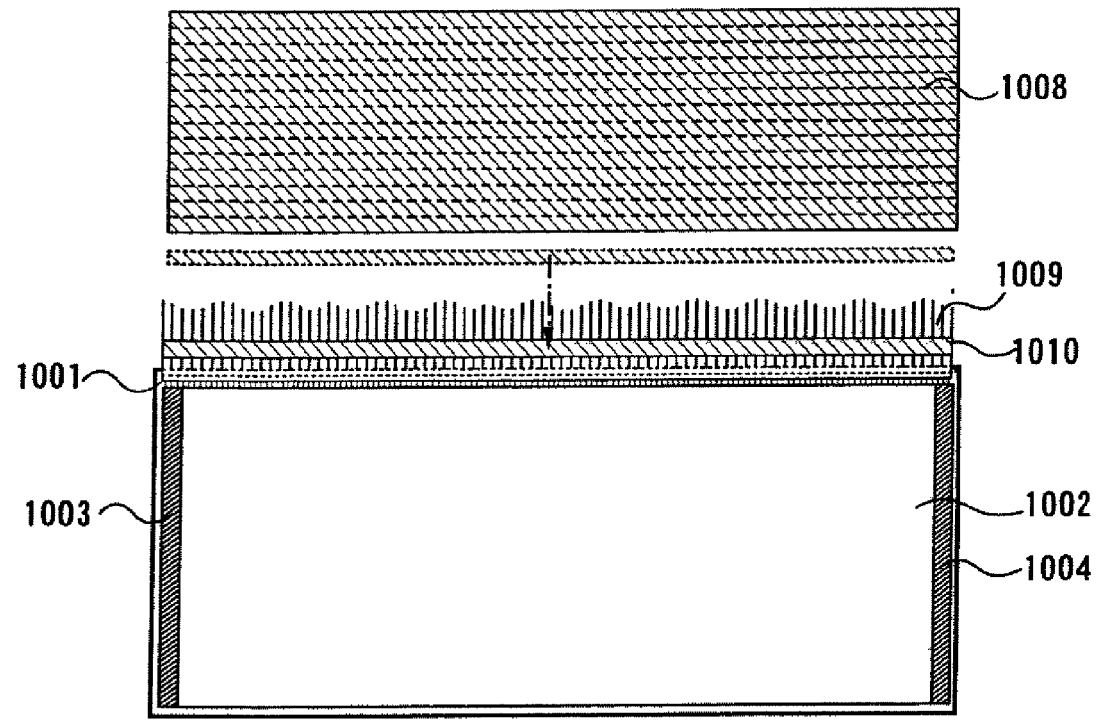

Next, a display device employing a TAB method is explained with reference to FIGS. 22A and 22B. The pixel portion 1002 and the scanning line driver circuits 1003 and 1004 are provided over the substrate 1001. FIG. 22A shows an example in which a plurality of tapes 1006 are pasted over the substrate 1001 and then driver ICs 1007 are mounted over the plurality of tapes 1006 respectively. On the other hand, FIG. 22B shows an example in which a tape 1009 is pasted over a substrate 1001 and then a driver IC 1010 is mounted over the tape 1009. In the case of employing the latter one, a metal chip for fixing the driver IC 1010 may be pasted together in consideration of the strength.

In order to improve the productivity, a plurality of driver ICs mounted over these display panels may be manufactured over the rectangular substrates 1005 and 1008 having a side of 300 mm or more.

In other words, a plurality of circuit patterns including both a driver circuit portion and an input/output terminal as a unit may be formed over the substrates 1005 and 1008, and then the substrates 1005 and 1008 may be divided. The driver IC may be a rectangle having a long side from 15 to 80 mm and a short side from 1 to 6 mm as shown in FIGS. 21A and 22A in consideration of the length of one side of the pixel portion and the pixel pitch. Moreover, the driver IC may have the length of one side of the pixel portion 1002 or the total length of one side of the pixel portion 1002 and one sides of the respective driver circuits 1003 and 1004 as shown in FIGS. 21B and 22B.

The primacy of an outer size of the driver IC to the IC chip lies in the length of the long side. When the driver IC having a long side from 15 to 80 mm is used, the number of driver ICs required to be mounted to the pixel portion 1002 is fewer than that of IC chips, thereby boosting the production yield. Moreover, when the driver IC is formed over the glass substrate, the shape of the substrate to be used as a base material is not limited, and therefore the productivity is not affected adversely. This is very advantageous in comparison with the case where the IC chip is taken out from a circular silicon wafer.

In FIGS. 21A to 22B, the driver IC 1007 or 1009 with the driver circuit formed is mounted outside the pixel portion 1002 over the substrate. These driver ICs 1007 and 1010 are signal line driver circuits. In order to form the pixel region corresponding to the full color of R, G, and B, the signal lines as many as 3072 lines are necessary for XGA class and the signal lines as many as 4800 lines are necessary for UXGA class. Such a number of signal lines form lead wirings by being divided into several blocks at the end of the pixel portion 1002, and the divided signal lines are collected in accordance with the pitch of output terminals of the driver ICs 1007 and 1010.

It is preferable that the driver IC 1007 and 1010 are each formed using a crystalline semiconductor over the substrate, and it is also preferable that the crystalline semiconductor is formed by being irradiated with continuous wave laser light. Therefore, a continuous wave solid-state laser or gas laser is used as an oscillator for generating the laser light. With the continuous wave laser light, it is possible to manufacture a transistor formed of a poly-crystalline semiconductor layer having a large crystal grain size and few crystal defects. Moreover, since the poly-crystalline semiconductor film is superior in the mobility and the speed of response, high-speed operation is possible, and operation frequency of the semiconductor element formed of the poly-crystalline semiconductor can be improved compared to that of the conventional semiconductor element. Moreover, since the variation of the characteristic is reduced, high reliability can be obtained. It is noted that a channel-length direction of the transistor may conform to the scanning direction of the laser beam for the purpose of improving the operation frequency further. This is because, in the laser crystallization step by the continuous wave laser light, the highest mobility can be obtained when the channel-length direction of the transistor and the scanning direction of the laser beam are approximately parallel (preferably the angle between the two directions is in the range of −30° to 30°). It is noted that the channel-length direction conforms to the direction in which the current flows, which means the direction in which the charge moves, in the channel-forming region. The transistor manufactured thus has an active layer formed of a poly-crystalline semiconductor layer in which the crystal grain extends in the channel direction. This means that the crystal grain boundary basically extends in the channel direction.

To perform the laser crystallization, it is preferable to form the beam spot of the laser beam so that the width of the beam spot ranges from approximately 1 to 3 mm, which is the same length as the short side of the driver IC. Moreover, it is preferable that the beam spot has a very thin line shape in order to secure enough and efficient energy density to the irradiated object. However, the term of linear herein used does not mean a line in a strict sense but means a rectangle or an oblong having a large aspect ratio, for example 2 or more (preferably 10 to 10000). Thus, a method for manufacturing a display device in which the productivity is improved can be provided by making the width of the beam spot of the laser light the same as the length of the short side of the driver IC.

FIGS. 21A to 22B show the examples in which the scanning line driver circuit is formed integrally with the pixel portion and the driver IC is mounted as the signal line driver circuit. However, the present invention is not limited to this, and the driver IC may be mounted as both of the scanning line driver circuit and the signal line driver circuit. In this case, the specification of the driver IC may be made different on the scanning line side and on the signal line side.

In the pixel portion 1002, the signal lines and the scanning lines intersect to form a matrix, and the transistors are arranged at the respective intersections. In the present invention, TFTs each of which uses an amorphous semiconductor or a semi-amorphous semiconductor as a channel portion are arranged in the pixel portion 1002. The amorphous semiconductor is formed by the plasma CVD method, the sputtering method, or the like. The semi-amorphous semiconductor can be formed at a temperature of 300° C. or less by the plasma CVD method and has an advantage that it can be formed in short time in the thickness required to form the transistor even when, for example, a non-alkali glass substrate having an outer size as large as 550×650 mm is used. The advantage of such a manufacturing technique is effective in manufacturing a large-sized display device. Moreover, a semi-amorphous TFT can obtain the electric field mobility from 2 to 10 $cm^2$/V·sec when the channel-forming region thereof is formed of the SAS. Therefore, this TFT can be used as a switching element of the pixel or the semiconductor element constituting the scanning line driver circuit. Accordingly, a display panel achieving the system-on-panel can be manufactured.

It is noted that, in FIGS. 21A to 22B, the scanning line driver circuit is also formed integrally over the substrate by using the TFT in which the semiconductor layer is formed of the SAS according to the embodiment mode 6. In the case of using the TFT in which the semiconductor layer is formed of the AS, the driver ICs may be mounted as both of the scanning line driver circuit and the signal line driver circuit.

In this case, it is preferable to differ the specification of the driver ICs used on the scanning line side and the signal line side. For example, while the transistor constituting the driver IC on the scanning line side requires the withstanding voltage of approximately 30 V, the driving frequency thereof is 100 kHz or less, and the high-speed operation is not required that much. Therefore, it is preferable to set the channel length (L) of the transistor constituting the driver on the scanning line side to be sufficiently long. On the other hand, the withstanding voltage of approximately 12 V is enough in the transistor constituting the driver IC on the signal line side, while the driving frequency is approximately 65 MHz at 3 V, and the high-speed operation is required. For this reason, it is preferable to set the channel length of the transistor constituting the driver and the like on the order of micrometer.

Thus, the driver circuit can be built in the display panel.

Embodiment Mode 12

Figure 60A:
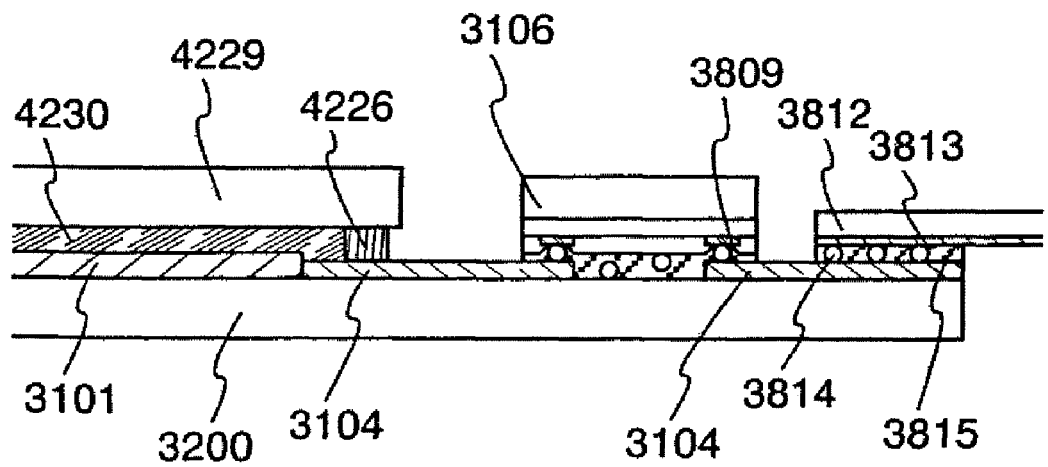
FIGS. 60A and 60B are drawings for explaining a method for mounting a driver circuit of a display panel (COG method) of the present invention.
Figure 60B:
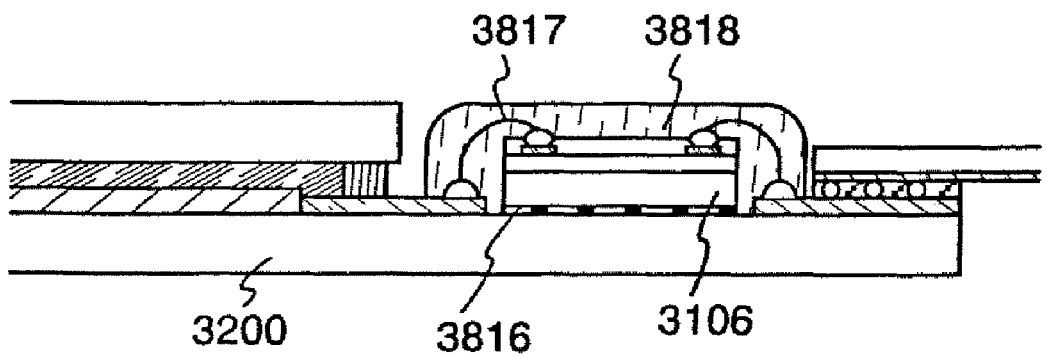

With reference to FIGS. 60A and 60B, this embodiment mode explains an example in which a driver circuit is mounted over the display panel manufactured by any one of the embodiment modes 3 to 5.

FIGS. 60A and 60B show a structure in which the driver IC is mounted over a display panel shown in FIG. 2 by a COG (Chip On Glass). FIG. 60A shows a structure in which a driver IC 3106 is mounted over a TFT substrate 3200 by using an anisotropic conductive material as an adhesive agent. A pixel portion 3101 and a signal line input terminal 3104 (the same applies to a scanning line input terminal) are formed over the TFT substrate 3200. An opposing substrate 4229 is adhered to the TFT substrate 3200 by a sealing material 4226, and a liquid crystal layer 4230 is formed between the opposing substrate 4229 and the TFT substrate 3200.

An FPC 3812 is adhered to the signal line input terminal 3104 by an anisotropic conductive material. The anisotropic conductive material includes a resin 3815 and a conductive particle 3814 having a diameter from several tens to several hundred μm with its surface plated by Au or the like. The conductive particle 3814 connects electrically the signal line input terminal 3104 and a wiring 3813 formed at the FPC 3812. The driver IC 3106 is adhered to the TFT substrate 3200 by the anisotropic conductive material, and a conductive particle 3810 mixed in the resin 3811 connects electrically an input/output terminal 3809 provided at the driver IC 3106 and the signal line input terminal 3104.

Moreover, as shown in FIG. 60B, the driver IC 3106 is adhered to the TFT substrate 3200 by an adhesive material 3816, and an input/output terminal of the driver IC may be connected with the lead wiring or the connection wiring by an Au wire 3817. Then, a sealing resin 3818 is used to seal them. It is noted that the method for mounting the driver IC is not limited in particular, and a known method such as the COG method, a wire bonding method, or a TAB method can be used.

When the thickness of the driver IC is the same as that of the opposing substrate, both of them have almost the same height, and therefore the display device can be thinned as a whole. Moreover, when the respective substrates are manufactured using the same material, thermal stress is not generated even when the temperature of the display device changes, and the characteristic of the circuit manufactured by the TFT does not deteriorate. Moreover, as shown in this embodiment mode, when the driver circuit is mounted by the driver IC whose length is longer than that of the IC chip, the number of driver ICs to be mounted to one pixel region can be decreased.

As thus described, the driver circuit can be built in the display panel.

Embodiment Mode 13

A structure of a pixel of a display panel shown in this embodiment mode is explained with reference to equivalent circuit diagrams of FIGS. 23A to 23F.

Figure 23A:
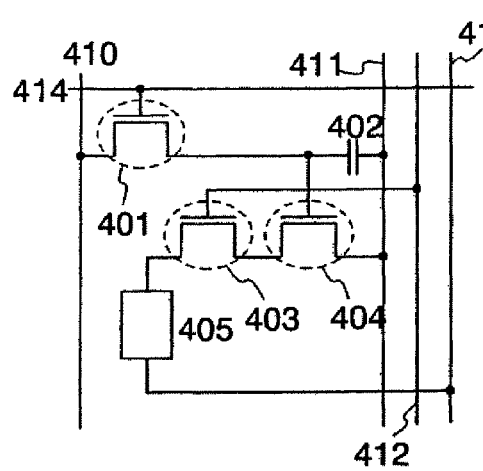
FIGS. 23A to 23F are circuit diagrams for explaining a pixel structure applicable in an EL display panel of the present invention.

In a pixel shown in FIG. 23A, a signal line 410 and power supply lines 411 to 413 extend in a column direction and a scanning line 414 extends in a row direction. Moreover, the pixel shown in FIG. 23A includes a switching TFT 401, a driver TFT 403, a current control TFT 404, a capacitor element 402, and a light-emitting element 405.

Figure 23B:
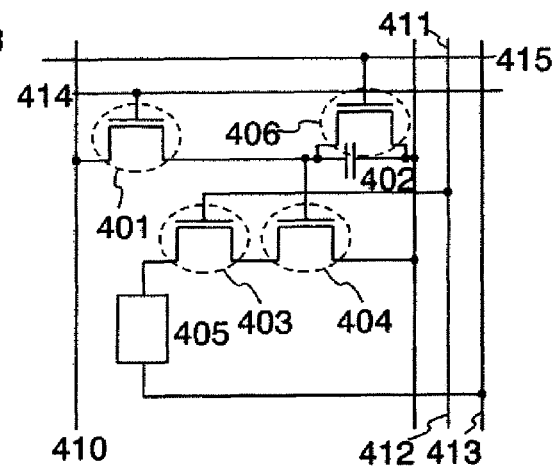
Figure 23C:
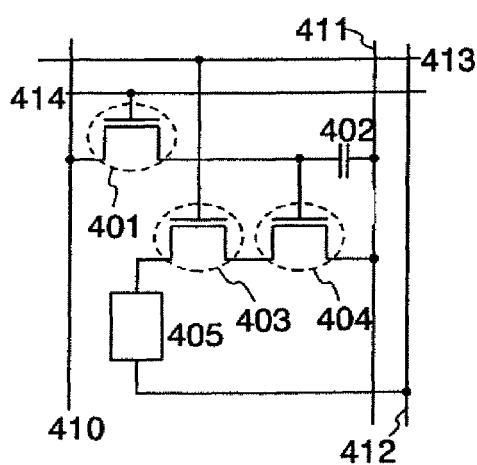
Figure 23D:
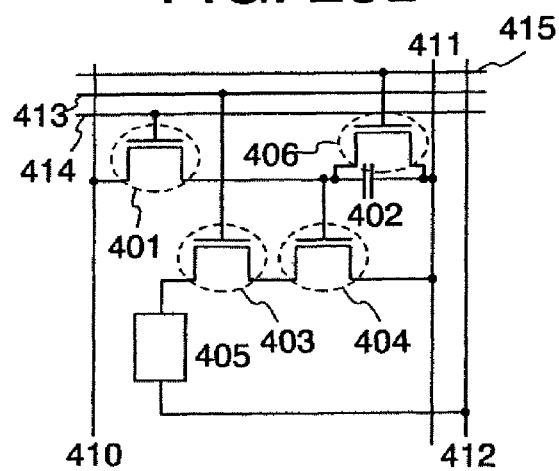

A pixel shown in FIG. 23C has the same structure as the pixel shown in FIG. 23A except that a gate electrode of the driver TFT 403 is connected to a power supply line 413 extending in the row direction. In other words, both pixels in FIGS. 23A and 23C have the same equivalent circuit diagram. However, the power supply lines are formed of different conductive layers in the case where the power supply line 413 extends in the column direction (FIG. 23A) and in the case where the power supply line 413 extends in the row direction (FIG. 23C). Here, attention is paid to the wirings connected to the gate electrode of the driver TFT 403, and the pixel is drawn separately as shown in FIGS. 23A and 23C in order to show that the layer for manufacturing these wirings is different.

The characteristic of the pixel shown in FIGS. 23A and 23C is that the driver TFT 403 is connected serially with the current control TFT 404 in the pixel and that L3/W3:L4/W4=5 to 6000:1 where L3 is the channel length of the driver TFT 403, W3 is the channel width of the driver TFT 403, L4 is the channel length of the current control TFT 404, and W4 is the channel width of the current control TFT 404. As an example of satisfying this equation, L3 is 500 μm, W3 is 3 μm, L4 is 3 μm, and W4 is 100 μm.

The driver TFT 403 operates in a saturation region and controls the current value flowing to the light-emitting element 405, and the current control TFT 404 operates in a linear region and controls whether or not the current is supplied to the light-emitting element 405. It is preferable that both TFTs have the same conductivity type in the manufacturing process. Moreover, not only an enhancement type but also a depletion type may be employed as the driver TFT 403. Since the current control TFT 404 operates in the linear region in the present invention having the above structure, the slight fluctuation of the VGS of the current control TFT 404 does not affect the current value of the light-emitting element 405. That is to say, the current value of the light-emitting element 405 is determined by the driver TFT 403 operating in the saturation region. The present invention having the above structure can provide a display device in which the image quality is enhanced by suppressing the variation of the luminance of the light-emitting element due to the variation of the characteristic of the TFT.

In the pixels shown in FIGS. 23A to 23D, the switching TFT 401 controls the input of the video signal into the pixel. When the switching TFT 401 is turned on to input the video signal into the pixel, the video signal is held by the capacitor element 402. Although FIGS. 23A and 23C show the structure providing the capacitor element 402, the present invention is not limited to this, and the capacitor element 402 may not be provided in the case where a gate capacitor can work as the capacitor for holding the video signal.

The light-emitting element 405 has a structure in which an electroluminescent layer is sandwiched between two electrodes, and a potential difference is provided between the pixel electrode and the opposing electrode (between the anode and the cathode) so that the voltage is applied in the direction of forward bias. The electroluminescent layer can be formed of various kinds of materials such as an organic material or an inorganic material. The luminescence from this electroluminescent layer includes a luminescence (fluorescence) emitted when returning from a singlet-excited state to a ground state and a luminescence (phosphorescence) emitted when returning from a triplet-excited state to the ground state.

The pixel shown in FIG. 23B has the same structure as that shown in FIG. 23A except that a TFT 406 and a scanning line 415 are added. In the same way, the pixel shown in FIG. 23D has the same structure as that shown in FIG. 23C except that the TFT 406 and a scanning line 415 are added.

Turning on and off the TFT 406 is controlled by the scanning line 415 newly provided. When the TFT 406 is turned on, the charge held in the capacitor element 402 is discharged, and the control TFT 404 is turned off. That is to say, the TFT 406 can form a condition compellingly not for flowing the current to the light-emitting element 405. Therefore, the structures of FIGS. 23B and 23D can increase the duty ratio because the lighting period can start at the same time as or just after the start of the writing period without waiting the writing of the signal to all the pixels.

Figure 23E:
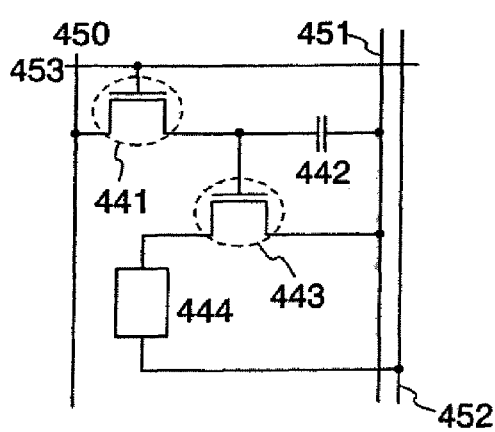
Figure 23F:
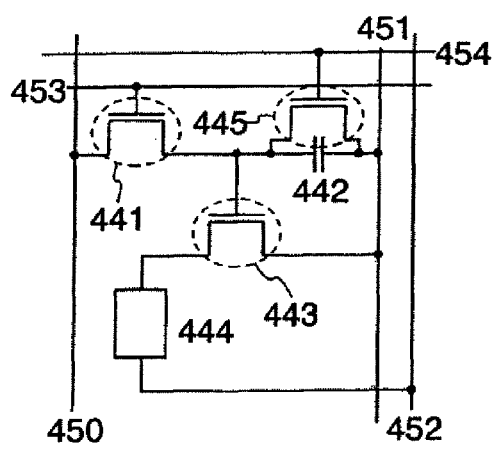

In a pixel shown in FIG. 23E, a signal line 450 and power supply lines 451 and 452 extend in the column direction, and a scanning line 453 extends in the row direction. Moreover, the pixel shown in FIG. 23E includes a switching TFT 441, a driver TFT 443, a capacitor element 442, and a light-emitting element 444. A pixel shown in FIG. 23F has the same pixel structure as that shown in FIG. 23E except that a TFT 445 and a scanning line 454 are added. The structure of FIG. 23F can also increase the duty ratio by providing the TFT 445.

Embodiment Mode 14

Figure 17:
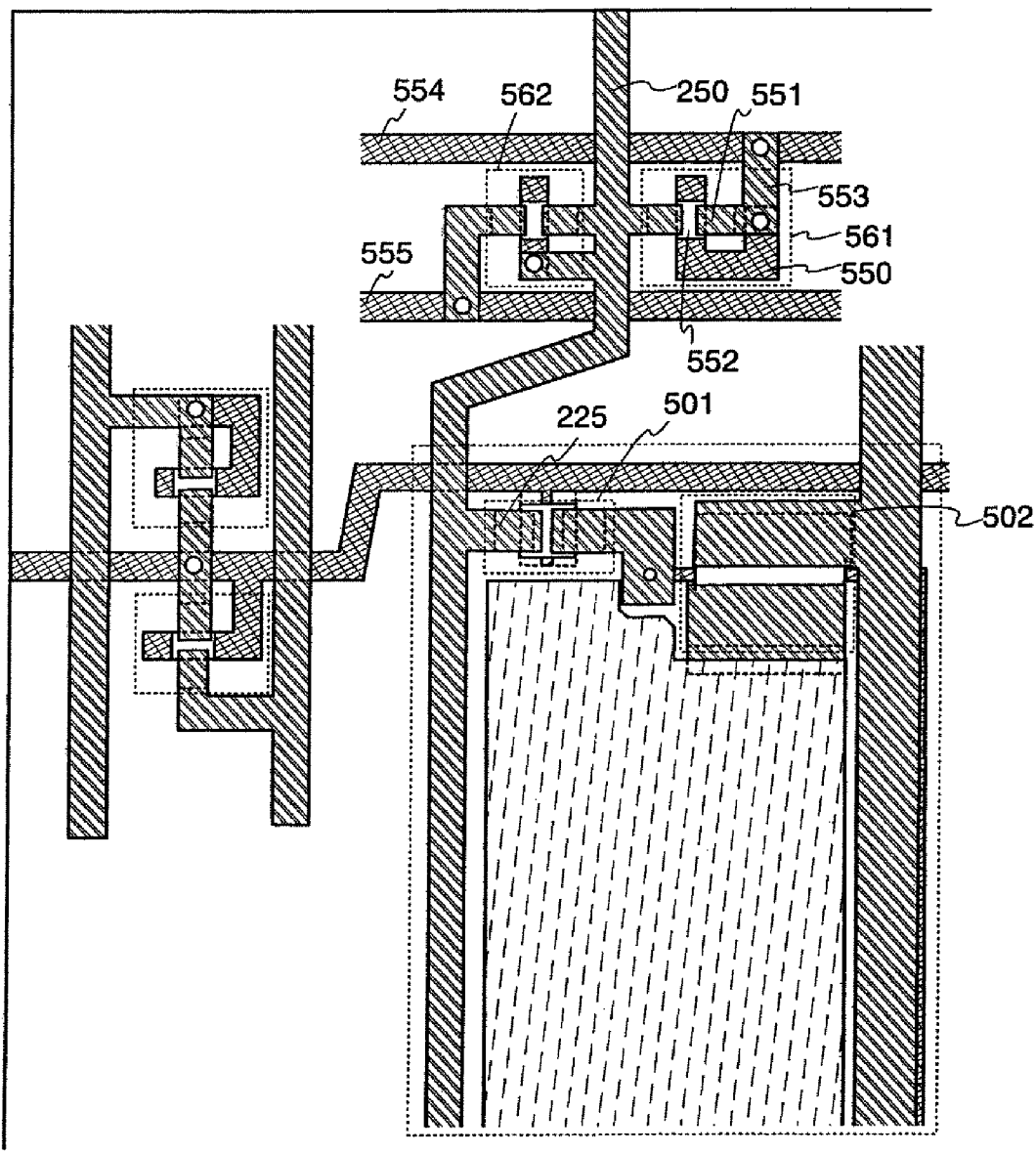
FIG. 17 is a top view for explaining an EL display panel of the present invention.

With reference to FIG. 17, this embodiment mode explains an example in which protective diodes are provided to a scanning line input terminal portion and a signal line input terminal portion respectively. TFTs 501 and 502 are provided in a pixel in FIGS. 17 and 18. This TFT has the same structure as that explained in the embodiment mode 1.

Figure 18:
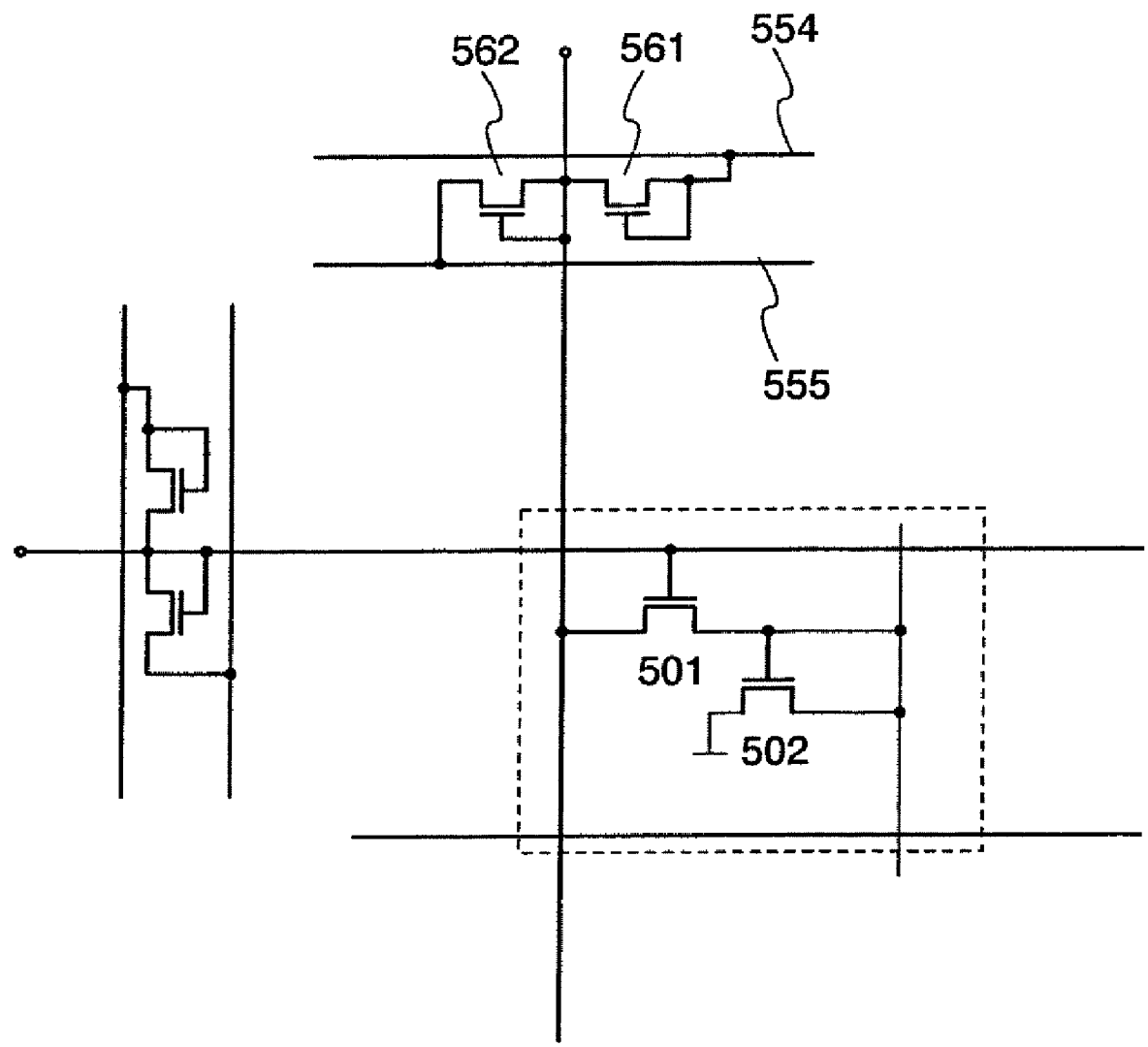
FIG. 18 is an equivalent circuit diagram of the EL display panel explained in FIG. 17.

Protective diodes 561 and 562 are provided in the signal line input terminal portion. These protective diodes are manufactured in the same process for forming the TFTs 501 and 502, and they can work as the diodes by connecting the gate and one of the drain and the source. FIG. 18 is an equivalent circuit diagram of the top view shown in FIG. 17.

The protective diode 561 is formed of a gate electrode layer 550, a semiconductor layer 551, an insulating layer 552 for protecting a channel, and a wiring layer 553. The protective diode 562 has the same structure. Common potential lines 554 and 555 to connect with these protective diodes 561 and 562 are formed of the same layer as the gate electrode layer. Therefore, it is necessary to form a contact hole in the gate-insulating layer in order to connect with the wiring layer 553 electrically.

The contact hole can be formed in the gate-insulating layer in such a way that a mask layer is formed by a droplet-discharging method and then etching is performed using the mask layer. In this case, when the etching is performed by the atmospheric-pressure discharging, local electric discharging is possible, and it is not necessary to form the mask layer all over the substrate.

The signal-wiring layer 250 is formed of the same layer as the source and drain wiring layer 225 in the TFT 501, and the signal-wiring layer 250 and wiring layer 225 is connected.

The scanning line input terminal portion has the same structure. Thus, the protective diodes provided at an input stage can be formed simultaneously according to the present invention. It is noted that the position where the protective diode is inserted is not limited to that shown in this embodiment mode, and the protective diode may be provided between the driver circuit and the pixel.

Embodiment Mode 15

Figure 29:
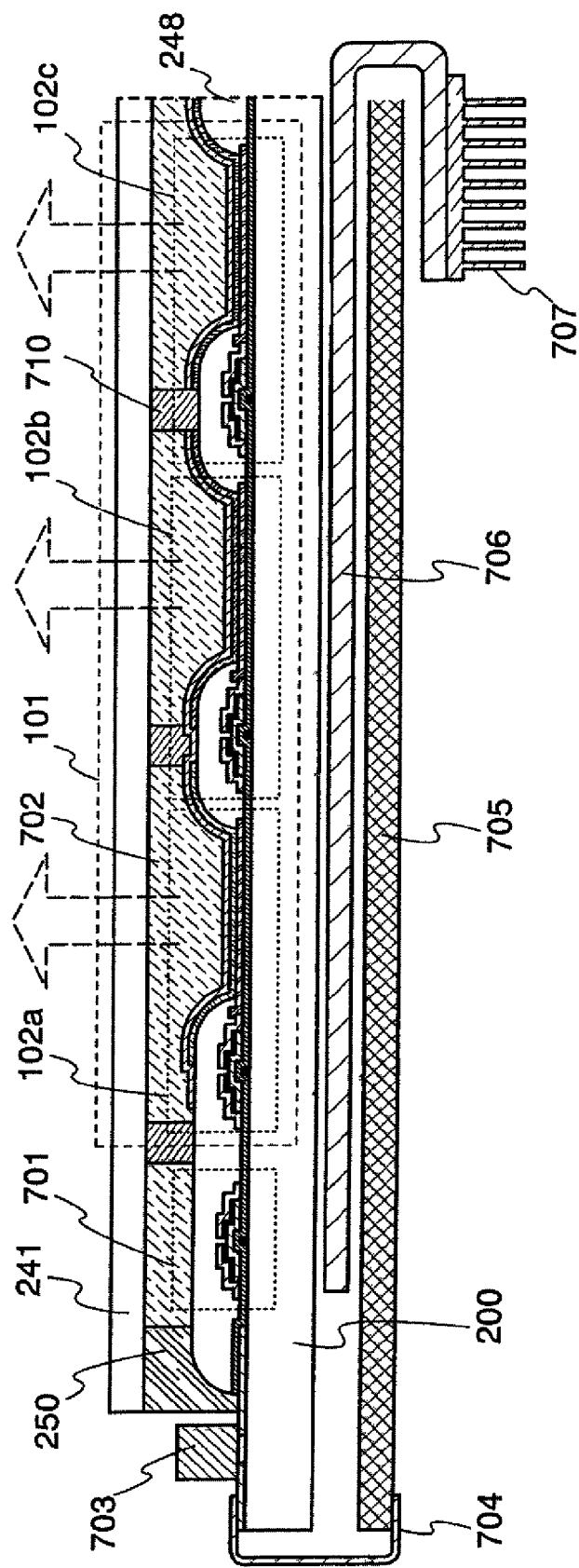
FIG. 29 is a cross-sectional view for explaining an example of a structure of an EL display module of the present invention.
Figure 30:
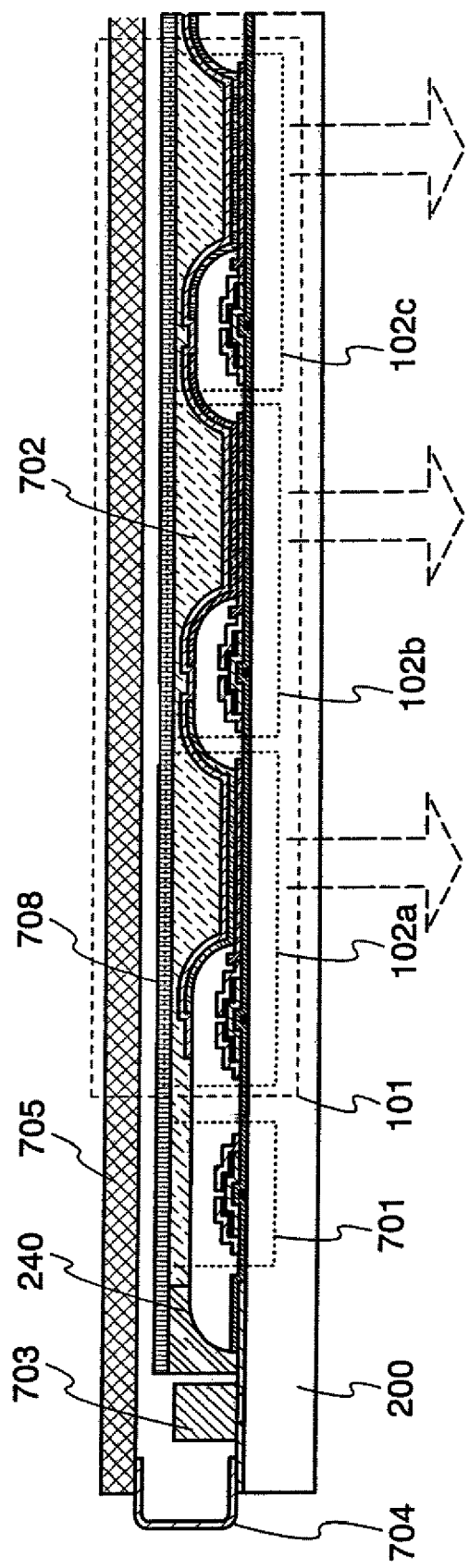
FIG. 30 is a cross-sectional view for explaining an example of a structure of an EL display module of the present invention.

FIGS. 29 and 30 show an example in which an EL display module is formed using a TFT substrate 200 manufactured by a droplet-discharging method. In both figures, a pixel portion 101 including pixels 102a to 102c is formed over the TFT substrate 200.

In FIG. 29, a TFT having the same structure as that of a TFT formed in the pixel or a diode formed by connecting a gate of the TFT with one of a source and a drain thereof is provided as a protective circuit portion 701 between a driver circuit 703 and pixels 102a to 102c outside the pixel portion 101. As the driver circuit 703, a driver IC formed of a single crystal semiconductor, a stick driver IC formed of a poly-crystalline semiconductor film over a glass substrate, a driver circuit formed of an SAS, or the like is applied.

The TFT substrate 200 shown by FIG. 29 is adhered to a sealing substrate 241 through a spacer 710 formed over an insulating layer 248 by a droplet-discharging method. The spacer 710 is preferably provided in order to keep the same gap between the two substrates even when the substrate is thin and the size of the pixel portion is large. The space 702 between the TFT substrate 200 and the sealing substrate 241 over the light-emitting element may be filled with a light-transmitting resin material, which may be solidified thereafter. Alternatively, the airspace may be filled with anhydrous nitrogen or inert gas.

FIG. 29 shows the case in which the light-emitting element 239 is a top-emission type that emits light in a direction indicated by arrows. The image can be displayed with many colors by differing the colors emitted from the respective pixels 102a to 102c so as to be red, green, or blue. Moreover, color purity of the light emitted to the outside can be enhanced by forming coloring layers corresponding to the respective colors on the side of the sealing substrate 241. Furthermore, the pixels 102a, 102b, and 102c may be white light-emitting elements and they may be combined with the coloring layers.

An external circuit 705 in FIGS. 29 and 30 is connected to a scanning line or signal line connection terminal provided at one end of the TFT substrate 200 by a wiring substrate 704. Moreover, a heat pipe 706 and a radiator plate 707 may be provided in contact with or adjacent to the TFT substrate 200 to increase the heat-releasing effect as shown in FIG. 29.

Although FIG. 29 shows the top-emission type EL module, a bottom-emission structure as shown in FIG. 30 may be also employed by changing the structure of the light-emitting element or the position of the external circuit substrate.

FIG. 30 shows an example for forming a sealing structure by filling the space 702 with an adhesive resin 702 and pasting a resin film 708 using the sealing material 240 and the adhesive resin 702 over the TFT substrate 200 where the pixel portion is formed. It is preferable to provide a gas barrier film for preventing the transmission of the moisture over the surface of the resin film 708. Although FIG. 30 shows the bottom-emission structure in which the light generated in the light-emitting element is emitted through the substrate, a top-emission structure can be also obtained by making the resin film 708 and the adhesive resin 702 have a light-transmitting property. In any way, further thinning and light-weighting can be achieved by employing the film-sealing structure.

Embodiment Mode 16

Figure 31:
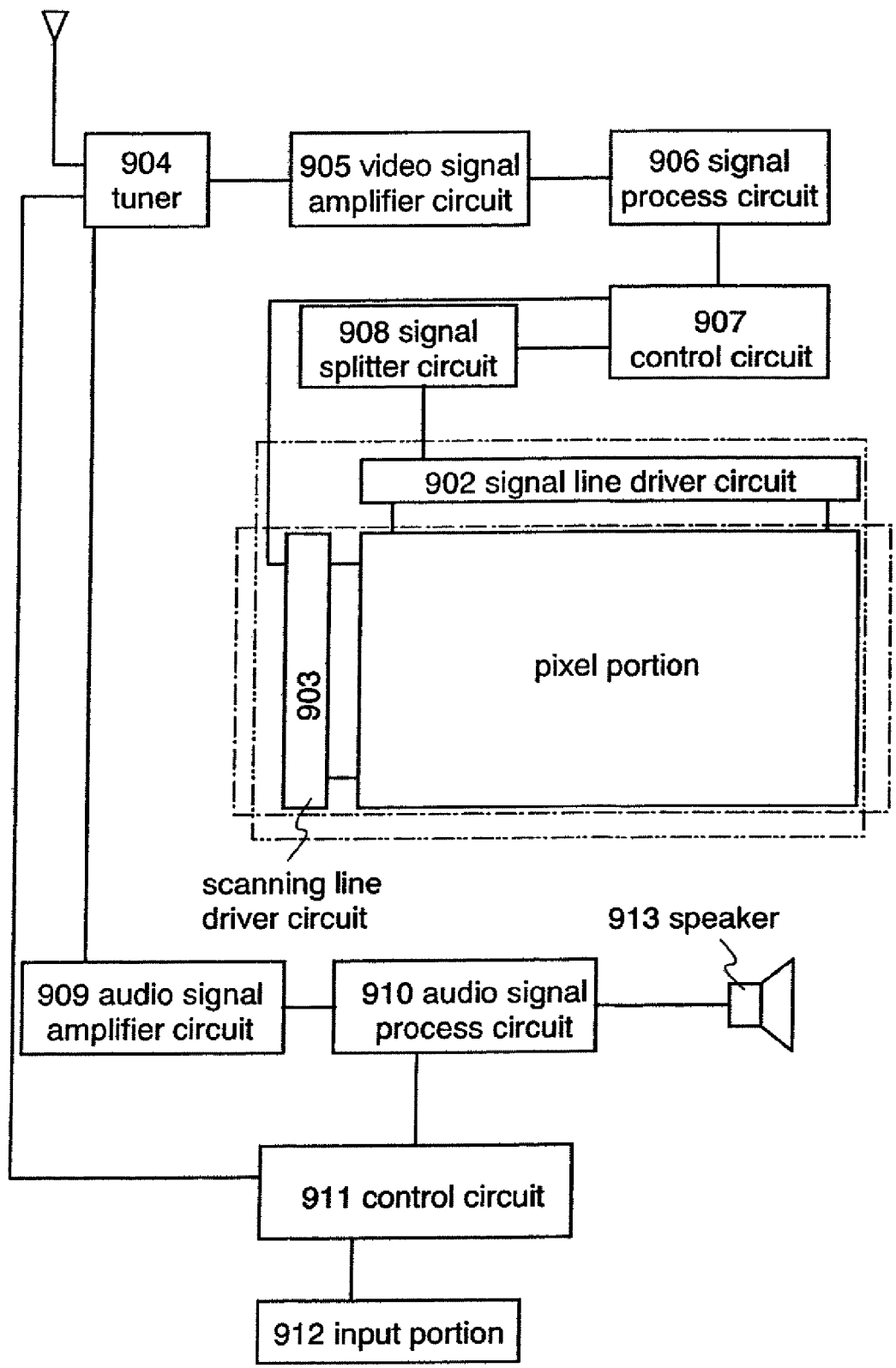
FIG. 31 is a block diagram for showing a main structure of a television receiver of the present invention.

A television receiver can be completed by the display module manufactured by the embodiment mode 15 or the display panel manufactured by the embodiment mode 11 or 12. FIG. 31 is a block diagram showing a main structure of the television receiver. The display panel may have any structure. One example is that, as shown in FIG. 1, only a pixel portion 101 is formed over a substrate, and a scanning line driver circuit 903 and a signal line driver circuit 902 are mounted over the substrate by a TAB method. Another example is that, as shown in FIG. 2, the pixel portion 101 and the scanning line driver circuit 903 and the signal line driver circuit 902 around the pixel portion 101 are mounted by a COG method. Another example is that, as shown in FIG. 3, a TFT is formed of an SAS, the pixel portion 101 and the scanning line driver circuit 903 are formed integrally over the substrate, and the signal line driver circuit 902 is mounted as a driver IC. Any structure may be employed as the display panel.

On the side to which the video signal is input, a video signal amplifier circuit 905 for amplifying a video signal among signals received by a tuner 904; a video signal process circuit 906 for converting the signal output from the vide signal amplifier circuit 905 into a color signal corresponding to each color of red, green, and blue; a control circuit 907 for converting the video signal into an input specification of the driver IC; and the like are provided. The control circuit 907 outputs signals to the sides of the scanning line and the signal line respectively. In the case of digital driving, a signal splitter circuit 908 may be provided on the side of the signal line so that an input digital signal is split into m number of signals and supplied.

Among the signals received by the tuner 904, an audio signal is sent to an audio signal amplifier circuit 909 and supplied to a speaker 913 through an audio signal process circuit 910. A control circuit 911 receives pieces of control information about a received station (received frequency) and the volume from the input portion 912, and then sends a signal to the tuner 904 and the audio signal process circuit 910.

When these external circuits and the EL module explained in FIGS. 29 and 30 are built in a chassis 920, a television receiver can be completed. A display screen 921 is formed by the EL display module, and a speaker 922, an operation switch 924, and the like are provided as accessories. Thus, the television receiver can be completed by the present invention.

Of course, the present invention is not limited to the television receiver, and the present invention can be applied to a monitor of a personal computer and to a display medium, particularly a large one, such as a information display panel at a railway station or an airport, an advertisement display panel at a street, and the like.

Embodiment Mode 17

Figure 64:
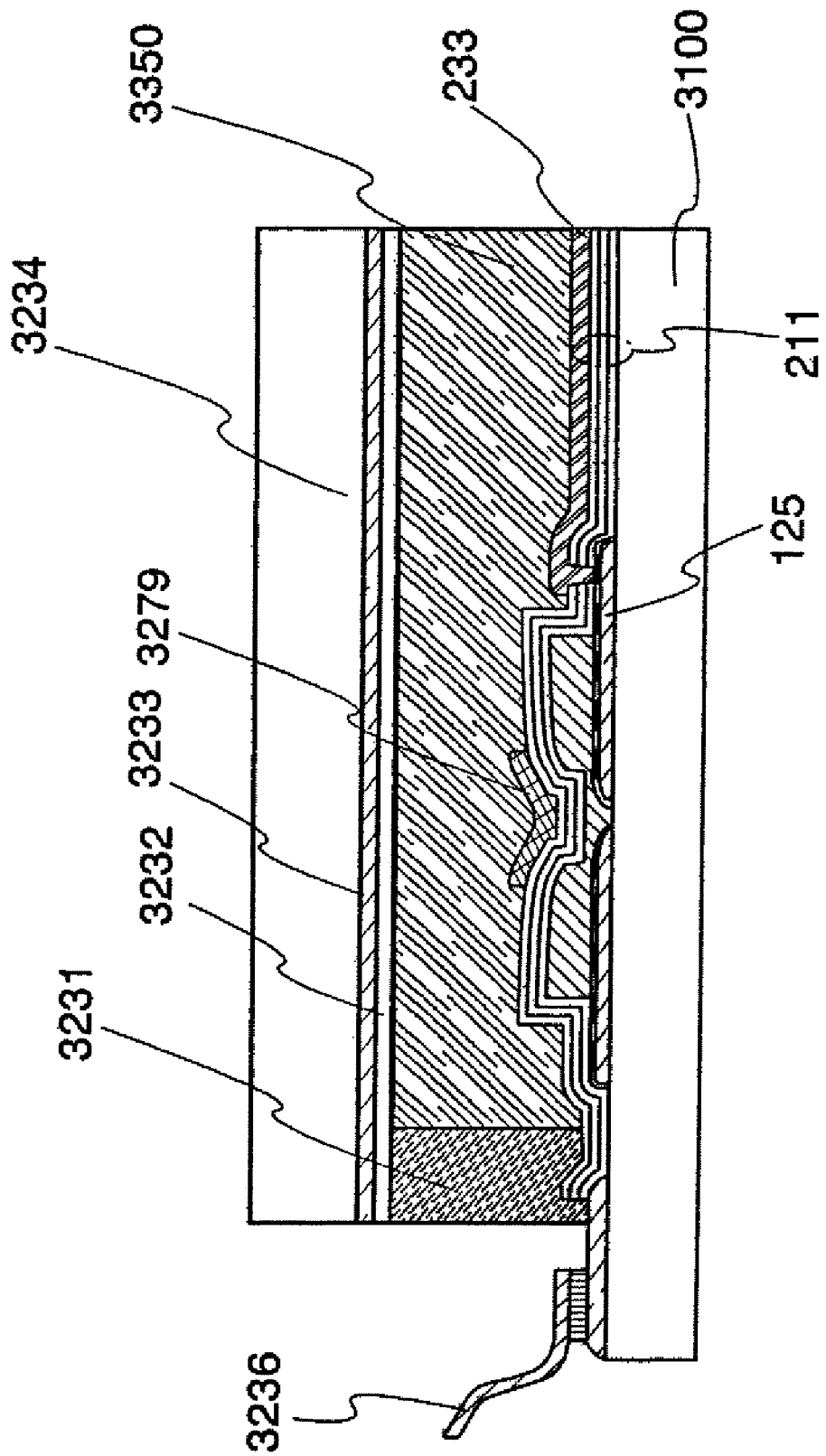
FIG. 64 is a cross-sectional view for explaining a display panel of the present invention.

A top-gate TFT is explained as the embodiment mode 17 with reference to FIGS. 64 and 36B.

The structure shown in FIG. 36A is formed similarly as Embodiment Mode 7.

Next, a gate-insulating layer 211 is formed over the semiconductor layer 130 and the pixel electrode 142 as shown in FIG. 36B. Then, a semiconductor layer 132 is formed over the gate-insulating layer 211 to manufacture a TFT.

FIG. 64 is a cross-sectional view of a liquid crystal display panel manufactured by this embodiment mode. In FIG. 64, unlike FIG. 36B, the gate-insulating layer is formed before forming the semiconductor layer and the pixel electrode. Here, a gate-insulating layer 211 is formed by the plasma CVD method or the sputtering method. It is particularly preferable that the gate-insulating layer 211 is a multilayer including three layers: an insulating layer formed of silicon nitride; an insulating layer formed of silicon oxide; and an insulating layer formed of silicon nitride. Next, after forming a through hole in the gate-insulating layer 211 to expose a part of the source and drain wiring layer 125, a pixel electrode layer 233 is formed by discharging a composition including a conductive material selectively so as to connect electrically with the source and drain wiring layer 125 through an n-type semiconductor layer. When the pixel electrode layer 233 is formed before forming the gate-insulating layer 131 as shown in FIG. 36B, it is not necessary to expose the source and drain wiring.

A gate electrode layer 3279 is formed by a droplet-discharging method. As the conductive material for forming this layer, it is possible to use the composition mainly including a particle of Ag (silver), Au (gold), Cu (copper), W (tungsten), Al (aluminum), or the like.

After a sealing material 3231 is formed, a substrate 3100 is pasted with the sealing material 3231 to an opposing substrate 3234 over which a conductive layer 3233 functioning as an opposing electrode and an insulating layer 3232 functioning as an orientation film are formed. After that, a liquid crystal layer 3350 is formed between the substrate 3100 and the opposing substrate 3234. Next, a region to which a connection terminal 3236 is pasted is exposed by means of etching under the atmospheric pressure or the near-atmospheric pressure, and the connection terminal is pasted to this region. Thus, a liquid crystal display panel having a display function can be manufactured (refer to FIG. 64).

Embodiment Mode 18

Figure 62:
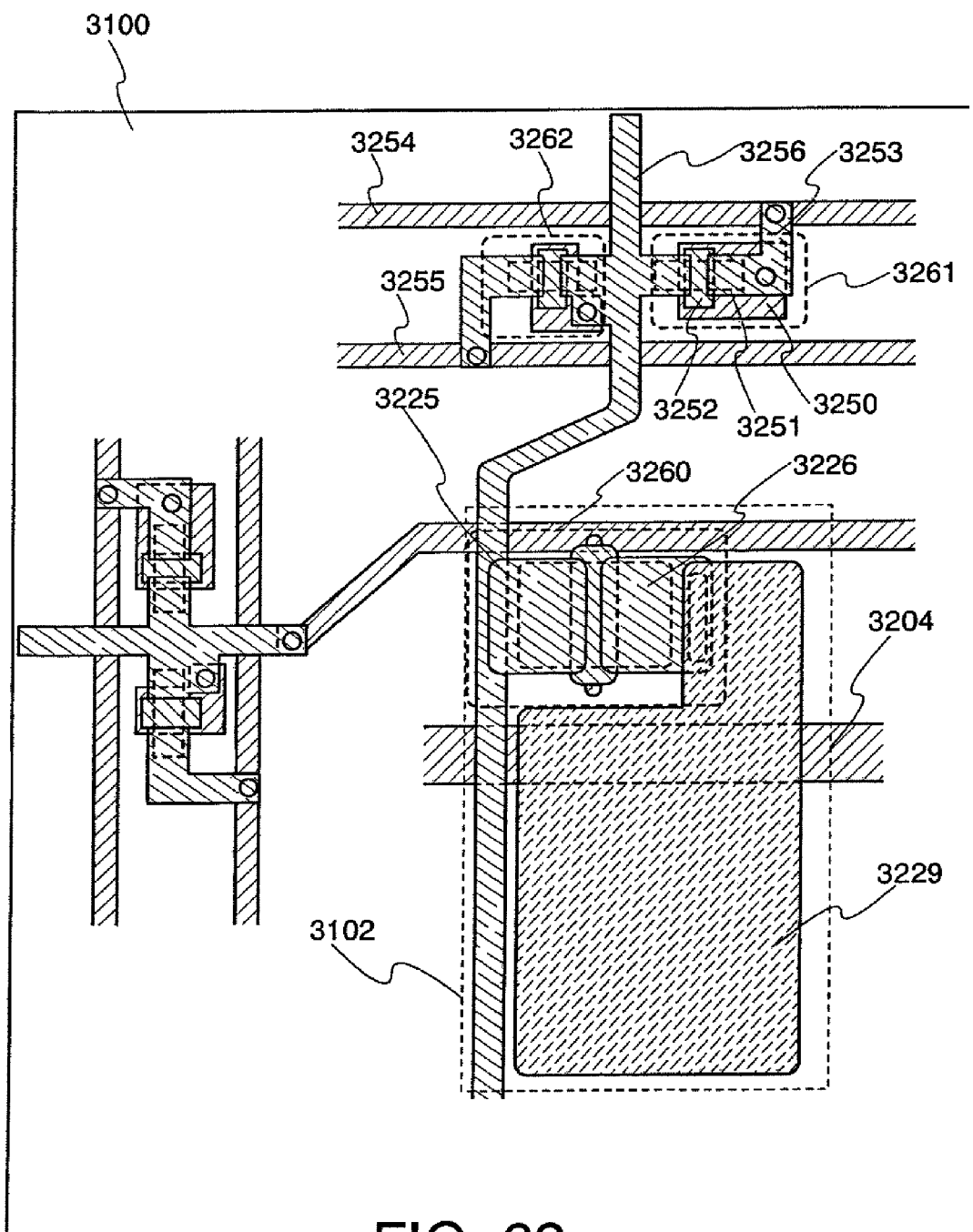
FIG. 62 is a top view for explaining a liquid crystal display panel of the present invention.

This embodiment mode explains an example in which protective diodes are provided to a scanning line input terminal portion and a signal line input terminal portion respectively with reference to FIG. 62. A TFT 3260 is provided in a pixel 3102 in FIG. 62. This TFT has the same structure as that explained in the embodiment mode 3.

Figure 63:
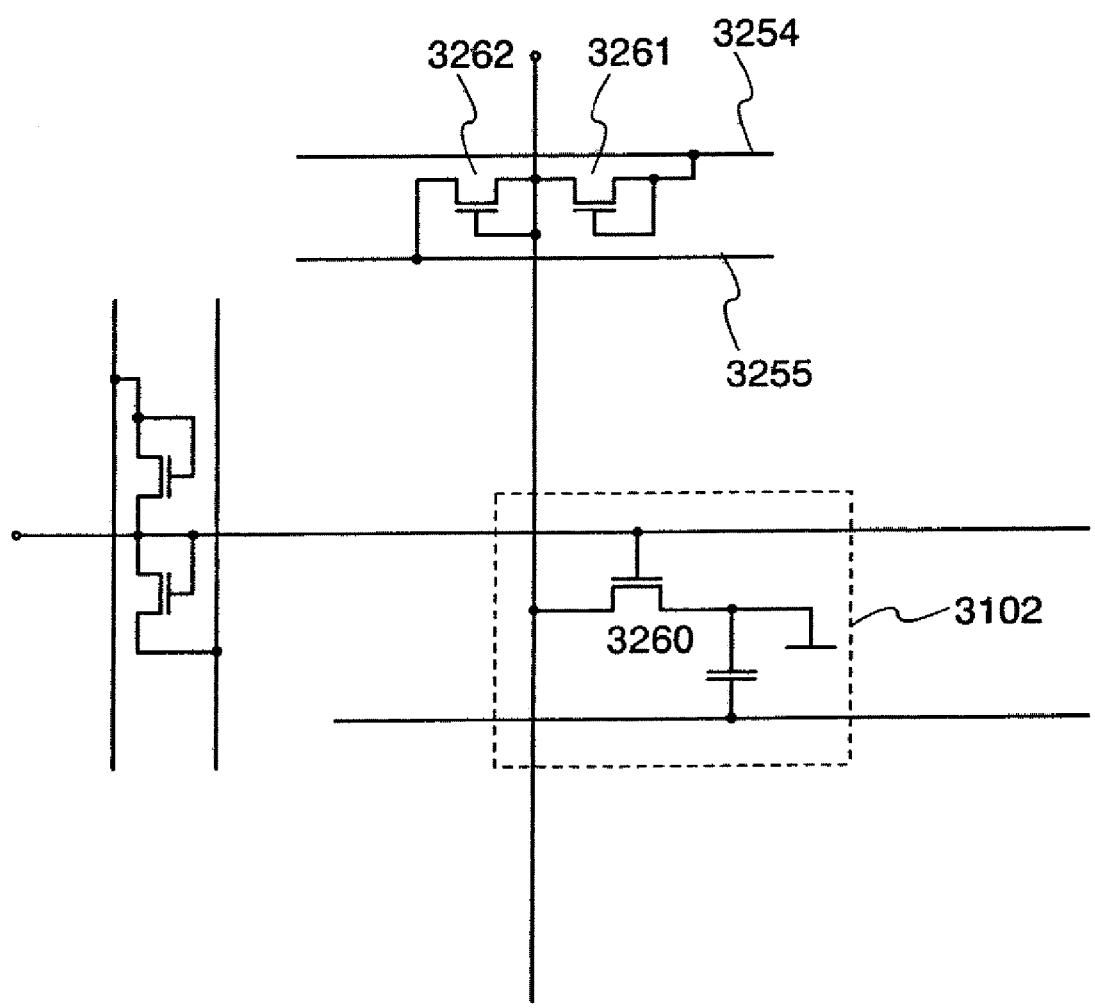
FIG. 63 is an equivalent circuit diagram of a display panel explained in FIG. 26.

Protective diodes 3261 and 3262 are provided in the signal line input terminal portion. These protective diodes are manufactured in the same process for forming the TFT 3260, and they work as the diodes by connecting the gate with one of the drain and the source. FIG. 63 is an equivalent circuit diagram of the top view shown in FIG. 62.

The protective diode 3261 includes a gate electrode layer 3250, a semiconductor layer 3251, an insulating layer 3252 for protecting a channel, and a wiring layer 3253. The protective diode 3262 has the same structure. Common potential lines 3254 and 3255 to connect with these protective diodes 3261 and 3262 are formed of the same layer as the gate electrode layer 3250. Therefore, it is necessary to form a contact hole in the gate-insulating layer in order to connect with the wiring layer 3253 electrically.

The contact hole can be formed in the gate-insulating layer in such a way that a mask layer is formed by a droplet-discharging method and then etching is performed using the mask layer. In this case, when the etching is performed by the atmospheric-pressure discharging, local electric discharging is possible, and it is not necessary to form the mask layer all over the substrate.

The protective diodes 3261 and 3262 are formed of the same layer as the source and drain wiring layers 3225 and 3226 in the TFT 3226, and the signal-wiring layer 3256 connected thereto is connected to the side of a source or drain of the protective diodes 3261 and 3262.

The scanning line input terminal portion has the same structure. Thus, the protective diodes 3261 and 3262 provided at the input line can be formed simultaneously according to the present invention. It is noted that the positions where the protective diodes 3261 and 3262 are inserted are not limited to those shown in this embodiment mode, and they may be provided between the driver circuit and the pixel.

Embodiment Mode 19

A television receiver can be completed using the display panel manufactured according to the embodiment mode 12. FIG. 31 is a block diagram for showing the main structure of the television receiver. The main structure of the television receiver is the same as that shown in the embodiment mode 16.

Figure 61:
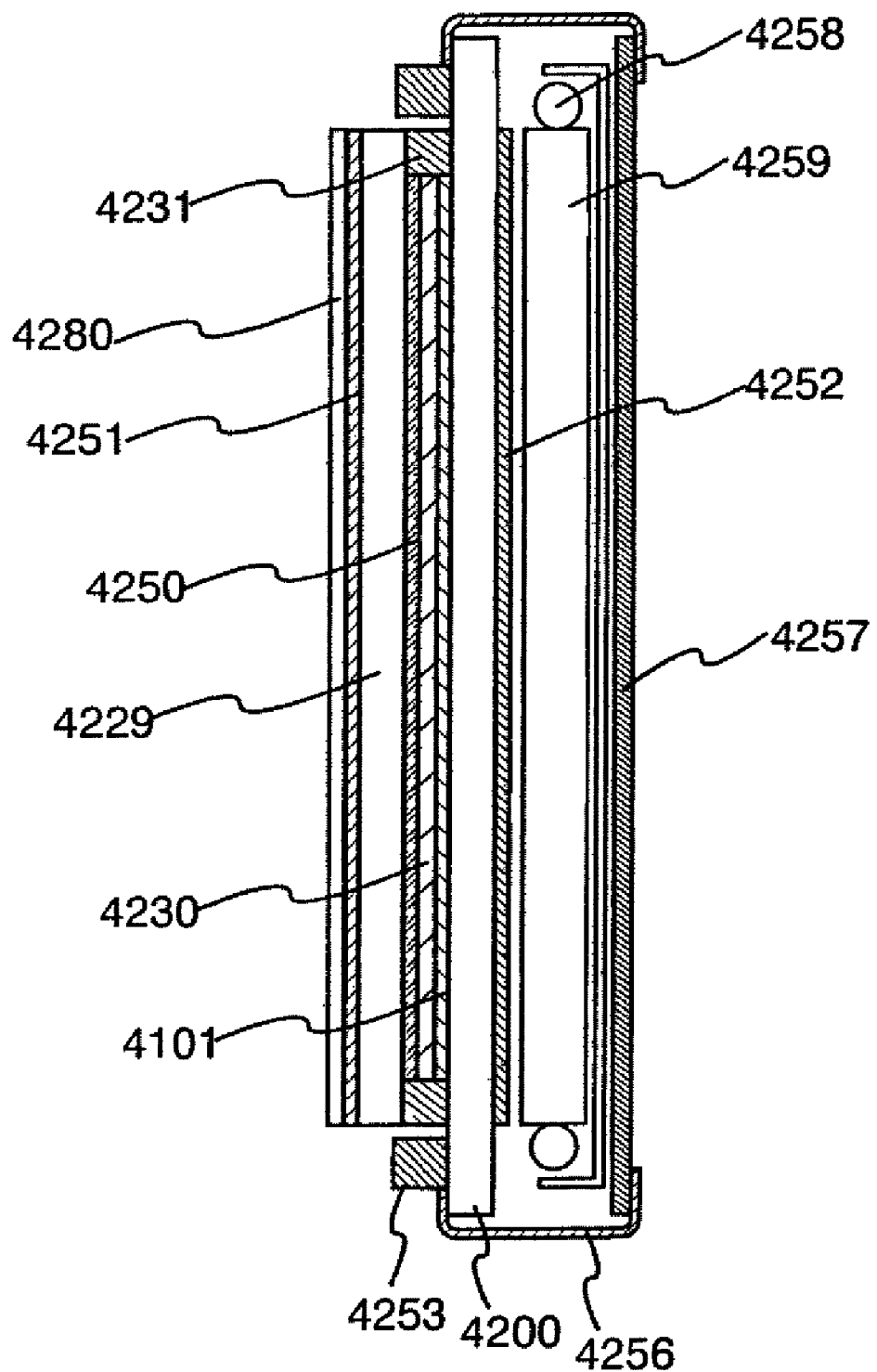
FIG. 61 is a drawing for explaining a structure of a display module of the present invention.

FIG. 61 shows an example of a display module in which a TFT substrate 4200 and an opposing substrate 4229 are adhered by a sealing material 4231, and a display region provided with a pixel portion 4101 and a liquid crystal layer 4230 is formed between the TFT substrate 4200 and the opposing substrate 4229. A coloring layer 4250 is necessary in the case of a color display, and the coloring layers corresponding to the respective colors of red, green, and blue are provided to the respective pixels. Polarizing plates 4251 and 4252 are provided outside the TFT substrate 4200 and the opposing substrate 4229. A protective layer 4280 is formed over the polarizing plate 4251. A light source includes a cold-cathode tube 4258 and an optical waveguide 4259. A circuit substrate 4257 is connected to the TFT substrate 4200 by a flexible wiring substrate 4256, and an external circuit such as a control circuit or a power supply circuit is built-in.

Figure 32:
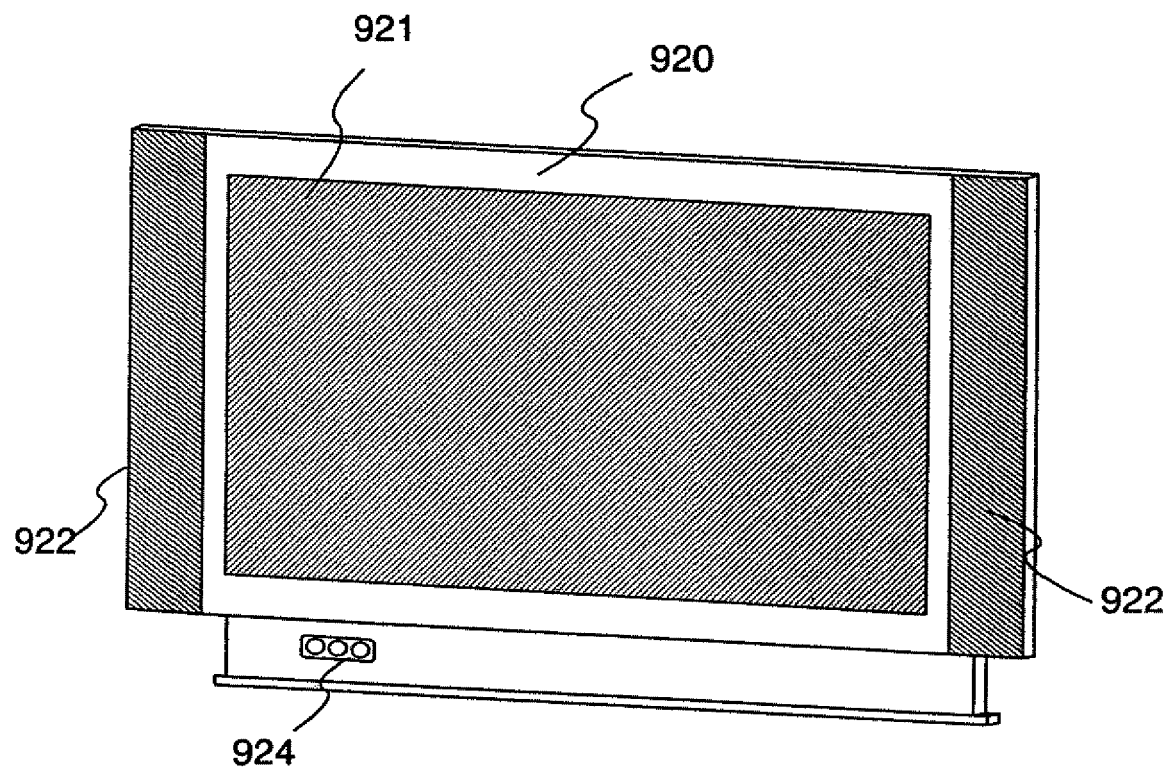
FIG. 32 is a drawing for explaining a television receiver completed by the present invention.

FIG. 32 shows the television receiver completed by building this display module in a chassis 920. A display screen 921 is formed by the display module, and a speaker 922, an operation switch 924, and the like are provided as accessories. Thus, a television receiver can be completed by the present invention.

The present invention is not limited to the television receiver, and it can be applied to a monitor of a personal computer and a display medium, particularly a large one, such as an information display panel at a railway station or an airport or an advertisement display panel at a street.

What is claimed is:

1. A display device comprising:
   a base layer comprising a metal material, and formed over a substrate;
   a gate electrode formed over a first portion of the base layer;
   a gate insulating film covering the gate electrode and the second portion of the base layer, the gate insulating film comprising a plurality of insulating layers;
   a semiconductor layer formed over the gate insulating film, the semiconductor layer comprising a microcrystalline semiconductor;
   source and drain regions formed over the semiconductor layer;
   source and drain electrodes formed over the source and drain regions, respectively; and
   a protective layer formed over source and drain electrodes;
   wherein the second portion of the base layer is in contact with the first portion of the base layer, and
   wherein the second portion of the base layer is insulated.

2. A display device comprising:
   a base layer comprising a metal material, and formed over a substrate;
   a gate electrode formed over a first portion of the base layer;
   a gate insulating film covering the gate electrode and the second portion of the base layer, the gate insulating film comprising a plurality of insulating layers;
   a semiconductor layer formed over the gate insulating film, the semiconductor layer comprising a microcrystalline semiconductor;
   source and drain regions formed over the semiconductor layer;
   source and drain electrodes formed over the source and drain regions, respectively; and
   a protective layer formed over source and drain electrodes;
   wherein a top surface of the semiconductor layer has an etched portion;
   wherein the second portion of the base layer is in contact with the first portion of the base layer; and
   wherein the second portion of the base layer is insulated.

3. A display device comprising:
   a base layer comprising a metal material, and formed over a substrate;
   a gate electrode formed over a first portion of the base layer;
   a gate insulating film covering the gate electrode and the second portion of the base layer, the gate insulating film comprising a plurality of insulating layers;
   a semiconductor layer formed over the gate insulating film, the semiconductor layer comprising a microcrystalline semiconductor;
   an insulating layer formed over the semiconductor layer;
   source and drain regions formed over the semiconductor layer and the plurality of insulating layers;
   source and drain electrodes formed over the source and drain regions respectively; and
   a protective layer formed over source and drain electrodes;
   wherein the second portion of the base layer is in contact with the first portion of the base layer; and
   wherein the second portion of the base layer is insulated.

4. The display device according to claim 1, wherein a raman spectrum of Si—Si conjunction of the semiconductor layer shifts to a side of lower wave number than 520 cm$^{-1}$.

5. The display device according to claim 1, further comprising scanning lines and signal lines over the substrate, wherein the scanning lines and the signal lines are controlled by external driver circuits.

6. The display device according to claim 1, further comprising at least one driver IC mounted over the substrate.

7. The display device according to claim 1, further comprising at least one driver circuit formed integrally over the substrate.

8. The display device according to claim 1, wherein the gate insulating film comprises a first silicon nitride layer, a silicon oxide layer, and a second silicon nitride layer.

9. The display device according to claim 1, further comprising a protective diode formed over the substrate.

10. The display device according to claim 1, wherein the protective layer comprises one of silicon nitride and silicon nitride oxide.

11. The display device according to claim 1, wherein the base layer is formed of a metal material such as Ti (titanium), W (tungsten), Cr (chromium), Ta (tantalum), Ni (nickel), or Mo (molybdenum); or an oxide thereof over the substrate by a method such as a sputtering method or an evaporation method.

12. The display device according to claim 2, wherein a raman spectrum of Si—Si conjunction of the semiconductor layer shifts to a side of lower wave number than 520 $cm^{-1}$.

13. The display device according to claim 2, further comprising scanning lines and signal lines over the substrate, wherein the scanning lines and the signal lines are controlled by external driver circuits.

14. The display device according to claim 2, further comprising at least one driver IC mounted over the substrate.

15. The display device according to claim 2, further comprising at least one driver circuit formed integrally over the substrate.

16. The display device according to claim 2, wherein the gate insulating film comprises a first silicon nitride layer, a silicon oxide layer, and a second silicon nitride layer.

17. The display device according to claim 2, further comprising a protective diode formed over the substrate.

18. The display device according to claim 2, wherein the protective layer comprises one of silicon nitride and silicon nitride oxide.

19. The display device according to claim 2, wherein the base layer is formed of a metal material such as Ti (titanium), W (tungsten), Cr (chromium), Ta (tantalum), Ni (nickel), or Mo (molybdenum); or an oxide thereof over the substrate by a method such as a sputtering method or an evaporation method.

20. The display device according to claim 3, wherein a raman spectrum of Si—Si conjunction of the semiconductor layer shifts to a side of lower wave number than 520 $cm^{-1}$.

21. The display device according to claim 3, further comprising scanning lines and signal lines over the substrate, wherein the scanning lines and the signal lines are controlled by external driver circuits.

22. The display device according to claim 3, further comprising at least one driver IC mounted over the substrate.

23. The display device according to claim 3, further comprising at least one driver circuit formed integrally over the substrate.

24. The display device according to claim 3, wherein the gate insulating film comprises a first silicon nitride layer, a silicon oxide layer, and a second silicon nitride layer.

25. The display device according to claim 3, further comprising a protective diode formed over the substrate.

26. The display device according to claim 3, wherein the protective layer comprises one of silicon nitride and silicon nitride oxide.

27. The display device according to claim 3, wherein the base layer is formed of a metal material such as Ti (titanium), W (tungsten), Cr (chromium), Ta (tantalum), Ni (nickel), or Mo (molybdenum); or an oxide thereof over the substrate by a method such as a sputtering method or an evaporation method.

* * * * *